US012601976B2

(12) United States Patent
Li et al.

(10) Patent No.: US 12,601,976 B2
(45) Date of Patent: Apr. 14, 2026

(54) ALL-IN-ONE DRY DEVELOPMENT FOR METAL-CONTAINING PHOTORESIST

(71) Applicant: Lam Research Corporation, Fremont, CA (US)

(72) Inventors: Da Li, Newark, CA (US); Ji Yeon Kim, Sunnyvale, CA (US); Younghee Lee, Pleasanton, CA (US); Hongxiang Zhao, San Jose, CA (US); Yisi Zhu, Fremont, CA (US); Samantha S.H. Tan, Newark, CA (US); Mengnan Zou, Santa Clara, CA (US); Zhiwei Sun, Pleasanton, CA (US); Jun Xue, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 18/850,628

(22) PCT Filed: Jul. 26, 2024

(86) PCT No.: PCT/US2024/039915
§ 371 (c)(1),
(2) Date: Sep. 25, 2024

(87) PCT Pub. No.: WO2025/024818
PCT Pub. Date: Jan. 30, 2025

(65) Prior Publication Data
US 2025/0060674 A1 Feb. 20, 2025

Related U.S. Application Data

(60) Provisional application No. 63/516,040, filed on Jul. 27, 2023.

(51) Int. Cl.
*G03F 7/36* (2006.01)

(52) U.S. Cl.
CPC ..................................... *G03F 7/36* (2013.01)

(58) Field of Classification Search
CPC ... G03F 7/36; G03F 7/004; G03F 7/40; H01L 21/67
(Continued)

(56) References Cited

U.S. PATENT DOCUMENTS

| 4,061,829 A | 12/1977 | Taylor |
| 4,241,165 A | 12/1980 | Hughes et al. |

(Continued)

FOREIGN PATENT DOCUMENTS

| CN | 1841201 A | 10/2006 |
| CN | 102027577 A | 4/2011 |

(Continued)

OTHER PUBLICATIONS

Cardineau, B. et al., "EUV Resists Based on Tin-oxo Clusters", Advances in Patterning Materials and Processes XXXI, Proceedings Of Spie, Apr. 4, 2014, vol. 9051, pp. 335-346.
(Continued)

*Primary Examiner* — Caleen O Sullivan
(74) *Attorney, Agent, or Firm* — Weaver Austin Villeneuve & Sampson LLP

(57) ABSTRACT

Process condition management facilitates the combination of dry development and post-development treatment into a single process chamber, eliminating the necessity for a post-dry development bake step in a separate chamber during semiconductor manufacturing. Thermal dry development and plasma dry development may be performed in the same chamber. Thermal dry development, plasma dry development and passivation such as an $O_2$ flash treatment; or thermal dry development, plasma dry development, passivation and hardening operations are enabled without wafer transfer.

29 Claims, 13 Drawing Sheets

(58) Field of Classification Search

USPC ....... 430/309, 329, 353, 325, 330, 354, 336, 430/350

See application file for complete search history.

(56) References Cited

U.S. PATENT DOCUMENTS

| | | | |
|---|---|---|---|
| 4,292,384 | A | 9/1981 | Straughan et al. |
| 4,314,022 | A | 2/1982 | Fisch |
| 4,341,592 | A | 7/1982 | Shortes et al. |
| 4,396,704 | A | 8/1983 | Taylor |
| 4,738,748 | A | 4/1988 | Kisa |
| 4,806,456 | A | 2/1989 | Katoh |
| 4,814,243 | A | 3/1989 | Ziger |
| 4,834,834 | A | 5/1989 | Ehrlich et al. |
| 4,842,989 | A | 6/1989 | Taniguchi et al. |
| 4,940,854 | A | 7/1990 | Debe |
| 5,094,936 | A | 3/1992 | Misium et al. |
| 5,206,706 | A | 4/1993 | Quinn |
| 5,322,765 | A | 6/1994 | Clecak et al. |
| 5,683,857 | A | 11/1997 | Shirai et al. |
| 5,914,278 | A | 6/1999 | Boitnott et al. |
| 5,925,494 | A | 7/1999 | Horn |
| 6,013,418 | A | 1/2000 | Ma et al. |
| 6,045,877 | A | 4/2000 | Gleason et al. |
| 6,162,577 | A | 12/2000 | Felter et al. |
| 6,179,922 | B1 | 1/2001 | Ishikawa et al. |
| 6,179,924 | B1 | 1/2001 | Zhao et al. |
| 6,183,934 | B1 | 2/2001 | Kawamonzen |
| 6,290,779 | B1 | 9/2001 | Saleh et al. |
| 6,319,654 | B1 | 11/2001 | Kim et al. |
| 6,448,097 | B1 | 9/2002 | Singh et al. |
| 6,566,276 | B2 | 5/2003 | Maloney et al. |
| 6,573,030 | B1 | 6/2003 | Fairbairn et al. |
| 6,607,867 | B1 | 8/2003 | Kim et al. |
| 6,666,986 | B1 | 12/2003 | Vaartstra |
| 6,841,341 | B2 | 1/2005 | Fairbairn et al. |
| 6,867,086 | B1 | 3/2005 | Chen et al. |
| 7,112,489 | B1 | 9/2006 | Lyons et al. |
| 7,169,440 | B2 | 1/2007 | Balasubramaniam et al. |
| 7,223,526 | B2 | 5/2007 | Fairbairn et al. |
| 7,307,695 | B2 | 12/2007 | Hazenberg et al. |
| 7,335,462 | B2 | 2/2008 | Fairbairn et al. |
| 7,438,534 | B2 | 10/2008 | Holland et al. |
| 7,608,367 | B1 | 10/2009 | Aigeldinger et al. |
| 8,083,862 | B2 | 12/2011 | Brown |
| 8,536,068 | B2 | 9/2013 | Weidman et al. |
| 8,703,386 | B2 | 4/2014 | Bass et al. |
| 8,883,405 | B2 | 11/2014 | Shiobara |
| 9,310,684 | B2 | 4/2016 | Meyers et al. |
| 9,632,411 | B2 | 4/2017 | Michaelson et al. |
| 9,735,002 | B2 | 8/2017 | Kawaguchi et al. |
| 9,778,561 | B2 | 10/2017 | Marks et al. |
| 9,790,595 | B2 | 10/2017 | Jung et al. |
| 9,823,564 | B2 | 11/2017 | Stowers et al. |
| 9,996,004 | B2 | 6/2018 | Smith et al. |
| 10,025,179 | B2 | 7/2018 | Meyers et al. |
| 10,074,543 | B2 | 9/2018 | Mahorowala et al. |
| 10,228,618 | B2 | 3/2019 | Meyers et al. |
| 10,304,668 | B2 | 5/2019 | Coppa et al. |
| 10,416,554 | B2 | 9/2019 | Meyers et al. |
| 10,514,598 | B2 | 12/2019 | Marks et al. |
| 10,515,812 | B1 | 12/2019 | Wang et al. |
| 10,627,719 | B2 | 4/2020 | Waller et al. |
| 10,642,153 | B2 | 5/2020 | Meyers et al. |
| 10,649,328 | B2 | 5/2020 | Stowers et al. |
| 10,679,843 | B2 | 6/2020 | Jeong et al. |
| 10,732,505 | B1 | 8/2020 | Meyers et al. |
| 10,775,696 | B2 | 9/2020 | Meyers et al. |
| 10,782,610 | B2 | 9/2020 | Stowers et al. |
| 10,787,466 | B2 | 9/2020 | Edson et al. |
| 10,815,391 | B2 | 10/2020 | Lee et al. |
| 10,831,096 | B2 | 11/2020 | Marks et al. |
| 11,079,682 | B1 * | 8/2021 | Han .................. H01L 21/0337 |
| 11,209,729 | B2 | 12/2021 | Marks et al. |
| 11,314,168 | B2 | 4/2022 | Tan et al. |
| 11,462,417 | B2 | 10/2022 | Delmas et al. |
| 11,988,965 | B2 | 5/2024 | Tan et al. |
| 12,105,422 | B2 | 10/2024 | Tan et al. |
| 12,183,604 | B2 | 12/2024 | Yu et al. |
| 12,211,691 | B2 | 1/2025 | Volosskiy et al. |
| 12,278,125 | B2 | 4/2025 | Yu et al. |
| 12,346,035 | B2 | 7/2025 | Dictus et al. |
| 12,474,640 | B2 | 11/2025 | Lee et al. |
| 12,504,692 | B2 | 12/2025 | Li et al. |
| 12,510,825 | B2 | 12/2025 | Tan et al. |
| 12,510,826 | B2 | 12/2025 | Tan et al. |
| 2001/0055731 | A1 | 12/2001 | Irie |
| 2002/0017243 | A1 | 2/2002 | Pyo |
| 2003/0008246 | A1 | 1/2003 | Cheng et al. |
| 2003/0027060 | A1 | 2/2003 | Lederer |
| 2003/0134231 | A1 | 7/2003 | Tsai et al. |
| 2003/0183244 | A1 | 10/2003 | Rossman |
| 2004/0067444 | A1 | 4/2004 | Wakabayashi et al. |
| 2004/0084412 | A1 | 5/2004 | Waldfried et al. |
| 2004/0097388 | A1 | 5/2004 | Brask et al. |
| 2004/0115956 | A1 | 6/2004 | Ishida |
| 2004/0178076 | A1 | 9/2004 | Stonas et al. |
| 2004/0191423 | A1 | 9/2004 | Ruan et al. |
| 2004/0213563 | A1 | 10/2004 | Irie |
| 2004/0229169 | A1 | 11/2004 | Sandstrom |
| 2004/0233401 | A1 | 11/2004 | Irie |
| 2005/0142885 | A1 | 6/2005 | Shinriki |
| 2006/0001064 | A1 | 1/2006 | Hill et al. |
| 2006/0046470 | A1 | 3/2006 | Becknell et al. |
| 2006/0068173 | A1 | 3/2006 | Kajiyama et al. |
| 2006/0151462 | A1 | 7/2006 | Lee et al. |
| 2006/0166537 | A1 | 7/2006 | Thompson et al. |
| 2006/0228897 | A1 | 10/2006 | Timans |
| 2006/0287207 | A1 | 12/2006 | Park et al. |
| 2007/0017386 | A1 | 1/2007 | Kamei |
| 2007/0287073 | A1 | 12/2007 | Goodwin |
| 2009/0134119 | A1 | 5/2009 | Matsumaru et al. |
| 2009/0197086 | A1 | 8/2009 | Rathi et al. |
| 2009/0325387 | A1 | 12/2009 | Chen et al. |
| 2010/0009274 | A1 | 1/2010 | Yamamoto |
| 2010/0068660 | A1 | 3/2010 | Shibazaki et al. |
| 2010/0086880 | A1 | 4/2010 | Saito et al. |
| 2010/0131093 | A1 | 5/2010 | Yokoyama et al. |
| 2010/0209855 | A1 | 8/2010 | Tanaka |
| 2010/0216310 | A1 | 8/2010 | Metz et al. |
| 2010/0310790 | A1 | 12/2010 | Chang et al. |
| 2010/0330503 | A1 | 12/2010 | Bae et al. |
| 2011/0117702 | A1 | 5/2011 | Rietzler et al. |
| 2011/0195142 | A1 | 8/2011 | Mitamura et al. |
| 2011/0198756 | A1 | 8/2011 | Thenappan et al. |
| 2011/0200953 | A1 | 8/2011 | Arima et al. |
| 2011/0209725 | A1 | 9/2011 | Kim et al. |
| 2011/0242508 | A1 | 10/2011 | Kobayashi |
| 2011/0244680 | A1 | 10/2011 | Tohnoe et al. |
| 2011/0266252 | A1 | 11/2011 | Thadani et al. |
| 2011/0277681 | A1 | 11/2011 | Arena et al. |
| 2011/0292356 | A1 | 12/2011 | Tsukinoki et al. |
| 2012/0088193 | A1 | 4/2012 | Weidman et al. |
| 2012/0088369 | A1 | 4/2012 | Weidman et al. |
| 2012/0090547 | A1 | 4/2012 | Wang et al. |
| 2012/0202357 | A1 | 8/2012 | Sato et al. |
| 2012/0208125 | A1 | 8/2012 | Hatakeyama |
| 2012/0322011 | A1 | 12/2012 | Wu et al. |
| 2013/0129995 | A1 | 5/2013 | Ouattara et al. |
| 2013/0157177 | A1 | 6/2013 | Yu et al. |
| 2013/0183609 | A1 | 7/2013 | Seon et al. |
| 2013/0224652 | A1 | 8/2013 | Bass et al. |
| 2013/0299089 | A1 | 11/2013 | Kim et al. |
| 2013/0323652 | A1 | 12/2013 | Fernandez et al. |
| 2013/0330928 | A1 | 12/2013 | Ishikawa et al. |
| 2014/0014745 | A1 | 1/2014 | Burrows et al. |
| 2014/0021673 | A1 | 1/2014 | Chen et al. |
| 2014/0209015 | A1 | 7/2014 | Yamada et al. |
| 2014/0255844 | A1 | 9/2014 | Iwao et al. |
| 2014/0263172 | A1 | 9/2014 | Xie et al. |
| 2014/0268082 | A1 | 9/2014 | Michaelson et al. |
| 2014/0272726 | A1 | 9/2014 | Chang |
| 2015/0020848 | A1 | 1/2015 | Kim et al. |
| 2015/0056542 | A1 | 2/2015 | Meyers et al. |

(56) References Cited

U.S. PATENT DOCUMENTS

| | | | |
|---|---|---|---|
| 2015/0096683 A1 | 4/2015 | Deshmukh et al. | |
| 2015/0152551 A1 | 6/2015 | Yamaguchi et al. | |
| 2015/0221519 A1 | 8/2015 | Marks et al. | |
| 2015/0270148 A1 | 9/2015 | Shinoda et al. | |
| 2015/0303064 A1 | 10/2015 | Singer et al. | |
| 2015/0355549 A1 | 12/2015 | Xie et al. | |
| 2016/0011505 A1 | 1/2016 | Stowers et al. | |
| 2016/0011516 A1 | 1/2016 | Devilliers | |
| 2016/0021660 A1 | 1/2016 | Krishnamurthy | |
| 2016/0041471 A1 | 2/2016 | Briend et al. | |
| 2016/0086864 A1 | 3/2016 | Fischer et al. | |
| 2016/0116839 A1 | 4/2016 | Meyers et al. | |
| 2016/0126106 A1 | 5/2016 | Shimizu et al. | |
| 2016/0216606 A1 | 7/2016 | Meyers et al. | |
| 2016/0260588 A1 | 9/2016 | Park et al. | |
| 2016/0284559 A1 | 9/2016 | Kikuchi et al. | |
| 2016/0343544 A1 | 11/2016 | Watanabe et al. | |
| 2016/0357107 A1 | 12/2016 | Buchberger, Jr. et al. | |
| 2017/0004974 A1 | 1/2017 | Manna et al. | |
| 2017/0010535 A1 | 1/2017 | Fujitani et al. | |
| 2017/0018506 A1 | 1/2017 | Cao et al. | |
| 2017/0092495 A1 | 3/2017 | Chen et al. | |
| 2017/0097569 A1 | 4/2017 | Yang et al. | |
| 2017/0102612 A1 | 4/2017 | Meyers et al. | |
| 2017/0146909 A1 | 5/2017 | Smith et al. | |
| 2017/0154766 A1 | 6/2017 | Ogihara et al. | |
| 2017/0168398 A1 | 6/2017 | Zi et al. | |
| 2017/0176858 A1 | 6/2017 | Hirano | |
| 2017/0229325 A1 | 8/2017 | Lubomirsky et al. | |
| 2017/0261850 A1 | 9/2017 | Stowers et al. | |
| 2017/0342553 A1 | 11/2017 | Yu et al. | |
| 2018/0023192 A1 | 1/2018 | Chandra et al. | |
| 2018/0039172 A1 | 2/2018 | Stowers et al. | |
| 2018/0039182 A1 | 2/2018 | Zi et al. | |
| 2018/0046086 A1 | 2/2018 | Waller et al. | |
| 2018/0093306 A1 | 4/2018 | Kang et al. | |
| 2018/0122648 A1 | 5/2018 | Kim et al. | |
| 2018/0164689 A1 | 6/2018 | Sano et al. | |
| 2018/0166278 A1 | 6/2018 | Belyansky et al. | |
| 2018/0173096 A1 | 6/2018 | Zi et al. | |
| 2018/0224744 A1 | 8/2018 | Bae et al. | |
| 2018/0233362 A1 | 8/2018 | Glodde et al. | |
| 2018/0307137 A1 | 10/2018 | Meyers et al. | |
| 2018/0308687 A1 | 10/2018 | Smith et al. | |
| 2018/0314167 A1 | 11/2018 | Chang et al. | |
| 2018/0323064 A1 | 11/2018 | Jung et al. | |
| 2018/0354804 A1 | 12/2018 | Venkatasubramanian et al. | |
| 2018/0356731 A1 | 12/2018 | Tagawa | |
| 2019/0041755 A1 | 2/2019 | Tanaka et al. | |
| 2019/0129307 A1 | 5/2019 | Kwon et al. | |
| 2019/0131130 A1 | 5/2019 | Smith et al. | |
| 2019/0137870 A1 | 5/2019 | Meyers et al. | |
| 2019/0146337 A1 | 5/2019 | Zi et al. | |
| 2019/0153001 A1 | 5/2019 | Cardineau et al. | |
| 2019/0163056 A1 | 5/2019 | Maes et al. | |
| 2019/0172714 A1 | 6/2019 | Bobek et al. | |
| 2019/0187556 A1 | 6/2019 | Park et al. | |
| 2019/0189428 A1 | 6/2019 | De Silva et al. | |
| 2019/0204749 A1 | 7/2019 | Tel et al. | |
| 2019/0244809 A1 | 8/2019 | Ono | |
| 2019/0259601 A1 | 8/2019 | De et al. | |
| 2019/0308998 A1 | 10/2019 | Cardineau et al. | |
| 2019/0315781 A1 | 10/2019 | Edson et al. | |
| 2019/0315782 A1 | 10/2019 | Edson et al. | |
| 2019/0332014 A1 | 10/2019 | Ookubo et al. | |
| 2019/0333777 A1 | 10/2019 | Hsieh et al. | |
| 2019/0352776 A1 | 11/2019 | Parikh | |
| 2019/0369489 A1 | 12/2019 | Meyers et al. | |
| 2019/0378696 A1 | 12/2019 | Addepalli et al. | |
| 2019/0391486 A1 | 12/2019 | Jiang et al. | |
| 2020/0041897 A1 | 2/2020 | Moon et al. | |
| 2020/0041901 A1 | 2/2020 | Namgung et al. | |
| 2020/0064733 A1 | 2/2020 | Meyers et al. | |
| 2020/0066536 A1 | 2/2020 | Yaegashi | |
| 2020/0089104 A1 | 3/2020 | Marks et al. | |
| 2020/0124970 A1 | 4/2020 | Kocsis et al. | |
| 2020/0133133 A1 | 4/2020 | Park et al. | |
| 2020/0166845 A1 | 5/2020 | Berendsen et al. | |
| 2020/0174374 A1 | 6/2020 | Liao et al. | |
| 2020/0176246 A1 | 6/2020 | Huotari et al. | |
| 2020/0209756 A1 | 7/2020 | Waller et al. | |
| 2020/0239498 A1 | 7/2020 | Clark et al. | |
| 2020/0241413 A1 | 7/2020 | Clark et al. | |
| 2020/0257196 A1 | 8/2020 | Meyers et al. | |
| 2020/0292937 A1 | 9/2020 | Stowers et al. | |
| 2020/0326627 A1 | 10/2020 | Jiang et al. | |
| 2020/0393765 A1 | 12/2020 | Sakanishi | |
| 2021/0013034 A1 | 1/2021 | Wu et al. | |
| 2021/0271170 A1 | 9/2021 | Telecky et al. | |
| 2021/0287909 A1 | 9/2021 | Zhou et al. | |
| 2021/0302833 A1 | 9/2021 | Weng et al. | |
| 2021/0305040 A1 | 9/2021 | Kuo et al. | |
| 2021/0397085 A1 | 12/2021 | Weidman et al. | |
| 2022/0002882 A1 | 1/2022 | Kalutarage et al. | |
| 2022/0020584 A1 | 1/2022 | Volosskiy et al. | |
| 2022/0028684 A1 | 1/2022 | Chen et al. | |
| 2022/0035247 A1 | 2/2022 | Tan et al. | |
| 2022/0043334 A1 | 2/2022 | Tan et al. | |
| 2022/0059362 A1 | 2/2022 | Li et al. | |
| 2022/0075260 A1 | 3/2022 | Marks et al. | |
| 2022/0244645 A1 | 8/2022 | Tan et al. | |
| 2022/0299877 A1 | 9/2022 | Weidman et al. | |
| 2022/0308454 A1 | 9/2022 | Weidman et al. | |
| 2022/0308462 A1 | 9/2022 | Berney et al. | |
| 2022/0342301 A1 | 10/2022 | Weidman et al. | |
| 2022/0344136 A1 | 10/2022 | Peter et al. | |
| 2022/0359280 A1 | 11/2022 | Yang et al. | |
| 2022/0365434 A1 | 11/2022 | Nardi et al. | |
| 2022/0404713 A1 | 12/2022 | Tapily | |
| 2023/0031955 A1 | 2/2023 | Yu et al. | |
| 2023/0045336 A1 | 2/2023 | Yu et al. | |
| 2023/0078946 A1* | 3/2023 | Grzeskowiak | G03F 7/325 |
| | | | 430/30 |
| 2023/0100995 A1* | 3/2023 | Cardineau | G03F 7/36 |
| | | | 430/270.1 |
| 2023/0107357 A1 | 4/2023 | Dictus et al. | |
| 2023/0126516 A1 | 4/2023 | Wang et al. | |
| 2023/0152701 A1 | 5/2023 | Kanakasabapathy | |
| 2023/0259025 A1 | 8/2023 | Hansen et al. | |
| 2023/0266662 A1 | 8/2023 | Marks et al. | |
| 2023/0266664 A1 | 8/2023 | Hansen et al. | |
| 2023/0266670 A1 | 8/2023 | Hansen et al. | |
| 2023/0273516 A1 | 8/2023 | Marks et al. | |
| 2023/0288798 A1 | 9/2023 | Hansen et al. | |
| 2023/0290657 A1 | 9/2023 | Yu et al. | |
| 2023/0314946 A1 | 10/2023 | Hansen et al. | |
| 2023/0314954 A1 | 10/2023 | Peter et al. | |
| 2023/0341781 A1 | 10/2023 | Han et al. | |
| 2023/0416606 A1 | 12/2023 | Dictus et al. | |
| 2024/0027900 A1 | 1/2024 | Hajibabaeinajafabadi et al. | |
| 2024/0036473 A1 | 2/2024 | Fujimoto et al. | |
| 2024/0036483 A1 | 2/2024 | Dictus et al. | |
| 2024/0045337 A1 | 2/2024 | Hajibabaeinajafabadi et al. | |
| 2024/0053684 A1 | 2/2024 | Hajibabaeinajafabadi et al. | |
| 2024/0145272 A1 | 5/2024 | Yu et al. | |
| 2024/0329538 A1 | 10/2024 | Li et al. | |
| 2024/0355650 A1 | 10/2024 | Kanakasabapathy et al. | |
| 2024/0361696 A1 | 10/2024 | Tan et al. | |
| 2024/0419078 A1 | 12/2024 | Tan et al. | |
| 2025/0053080 A1 | 2/2025 | Marks et al. | |
| 2025/0053084 A1 | 2/2025 | Hansen et al. | |
| 2025/0053092 A1 | 2/2025 | Kenane et al. | |
| 2025/0060673 A1 | 2/2025 | Wu et al. | |
| 2025/0093781 A1 | 3/2025 | Peter et al. | |
| 2025/0112045 A1 | 4/2025 | Volosskiy et al. | |
| 2025/0244672 A1 | 7/2025 | Weidman et al. | |
| 2025/0244677 A1 | 7/2025 | Li et al. | |
| 2025/0244678 A1 | 7/2025 | Lee et al. | |
| 2025/0246460 A1 | 7/2025 | Yu et al. | |
| 2025/0250485 A1 | 8/2025 | Dictus et al. | |
| 2025/0271766 A1 | 8/2025 | Hansen et al. | |
| 2025/0271782 A1 | 8/2025 | Dictus et al. | |

(56) References Cited

U.S. PATENT DOCUMENTS

| | | | |
|---|---|---|---|
| 2025/0291255 A1 | 9/2025 | Lee et al. |
| 2026/0036908 A1 | 2/2026 | Lee et al. |

FOREIGN PATENT DOCUMENTS

| | | | |
|---|---|---|---|
| CN | 102610516 A | 7/2012 |
| CN | 102834902 A | 12/2012 |
| CN | 103943493 A | 7/2014 |
| CN | 105047541 A | 11/2015 |
| CN | 105579906 A | 5/2016 |
| CN | 106876251 A | 6/2017 |
| CN | 108351594 A | 7/2018 |
| CN | 108388079 A | 8/2018 |
| CN | 108780739 A | 11/2018 |
| CN | 109521657 A | 3/2019 |
| CN | 109976097 A | 7/2019 |
| CN | 110609441 A | 12/2019 |
| CN | 111254416 A | 6/2020 |
| CN | 111258190 A | 6/2020 |
| EP | 0197286 A2 | 10/1986 |
| EP | 0197286 B1 | 9/1991 |
| EP | 0465064 A2 | 1/1992 |
| EP | 1123423 B1 | 8/2007 |
| EP | 3230294 A1 | 10/2017 |
| JP | S5119974 A | 2/1976 |
| JP | S57205736 A | 12/1982 |
| JP | S5883847 A | 5/1983 |
| JP | S58108744 A | 6/1983 |
| JP | S6112653 U | 1/1986 |
| JP | S61234035 A | 10/1986 |
| JP | H04226462 A | 8/1992 |
| JP | H0637050 A | 2/1994 |
| JP | H06169021 A | 6/1994 |
| JP | H06232041 A | 8/1994 |
| JP | H07106224 A | 4/1995 |
| JP | H07161607 A | 6/1995 |
| JP | H07244386 A | 9/1995 |
| JP | H0869959 A | 3/1996 |
| JP | H08316237 A | 11/1996 |
| JP | H08339950 A | 12/1996 |
| JP | H09172022 A | 6/1997 |
| JP | H09312247 A | 12/1997 |
| JP | H1041206 A | 2/1998 |
| JP | H10209133 A | 8/1998 |
| JP | H10301298 A | 11/1998 |
| JP | H11119440 A | 4/1999 |
| JP | 2000305273 A | 11/2000 |
| JP | 2000347413 A | 12/2000 |
| JP | 2000356857 A | 12/2000 |
| JP | 2001519040 A | 10/2001 |
| JP | 2002100558 A | 4/2002 |
| JP | 2002118096 A | 4/2002 |
| JP | 2003131364 A | 5/2003 |
| JP | 2003280155 A | 10/2003 |
| JP | 2004510321 A | 4/2004 |
| JP | 2004513515 A | 4/2004 |
| JP | 2004259786 A | 9/2004 |
| JP | 2005260015 A | 9/2005 |
| JP | 2006310681 A | 11/2006 |
| JP | 2007027617 A | 2/2007 |
| JP | 2009192350 A | 8/2009 |
| JP | 2009212404 A | 9/2009 |
| JP | 2010016314 A | 1/2010 |
| JP | 2010500762 A | 1/2010 |
| JP | 2010067979 A | 3/2010 |
| JP | 2010123732 A | 6/2010 |
| JP | 2010531931 A | 9/2010 |
| JP | 2010239087 A | 10/2010 |
| JP | 2012142481 A | 7/2012 |
| JP | 2012173315 A | 9/2012 |
| JP | 5055743 B2 | 10/2012 |
| JP | 2012191242 A | 10/2012 |
| JP | 2013033291 A | 2/2013 |
| JP | 2013047848 A | 3/2013 |
| JP | 2013096011 A | 5/2013 |
| JP | 2013542944 A | 11/2013 |
| JP | 2014504004 A | 2/2014 |
| JP | 5544914 B2 | 7/2014 |
| JP | 2015504604 A | 2/2015 |
| JP | 5705103 B2 | 4/2015 |
| JP | 2015106640 A | 6/2015 |
| JP | 2016072557 A | 5/2016 |
| JP | 2016530565 A | 9/2016 |
| JP | 2017045869 A | 3/2017 |
| JP | 2017108053 A | 6/2017 |
| JP | 2017116923 A | 6/2017 |
| JP | 2017152689 A | 8/2017 |
| JP | 2017532407 A | 11/2017 |
| JP | 2018502173 A | 1/2018 |
| JP | 2018518688 A | 7/2018 |
| JP | 2018164076 A | 10/2018 |
| JP | 2018200930 A | 12/2018 |
| JP | 2019500490 A | 1/2019 |
| JP | 2019024129 A | 2/2019 |
| JP | 2019506730 A | 3/2019 |
| JP | 2019056730 A | 4/2019 |
| JP | 2019135755 A | 8/2019 |
| JP | 2019192814 A | 10/2019 |
| JP | 2019532182 A | 11/2019 |
| JP | 2021523403 A | 9/2021 |
| JP | 2022502714 A | 1/2022 |
| JP | 2022538040 A | 8/2022 |
| KR | 890015374 A | 10/1989 |
| KR | 900001238 B1 | 3/1990 |
| KR | 950001406 A | 1/1995 |
| KR | 960000375 B1 | 1/1996 |
| KR | 19990029141 A | 4/1999 |
| KR | 19990070327 A | 9/1999 |
| KR | 20000073111 A | 12/2000 |
| KR | 20020000292 A | 1/2002 |
| KR | 20050112115 A | 11/2005 |
| KR | 100575847 B1 | 5/2006 |
| KR | 20070003657 A | 1/2007 |
| KR | 20080046577 A | 5/2008 |
| KR | 20100090643 A | 8/2010 |
| KR | 20110007192 A | 1/2011 |
| KR | 20110009739 A | 1/2011 |
| KR | 20120078672 A | 7/2012 |
| KR | 20120093781 A | 8/2012 |
| KR | 20130007389 A | 1/2013 |
| KR | 20140047120 A | 4/2014 |
| KR | 101426105 B1 | 8/2014 |
| KR | 20140106442 A | 9/2014 |
| KR | 20140109816 A | 9/2014 |
| KR | 20150008065 A | 1/2015 |
| KR | 20150091260 A | 8/2015 |
| KR | 20150127145 A | 11/2015 |
| KR | 20150129781 A | 11/2015 |
| KR | 20150143480 A | 12/2015 |
| KR | 20160035995 A | 4/2016 |
| KR | 20160082969 A | 7/2016 |
| KR | 20170066218 A | 6/2017 |
| KR | 20180036263 A | 4/2018 |
| KR | 20180054917 A | 5/2018 |
| KR | 20180116438 A | 10/2018 |
| KR | 20180119471 A | 11/2018 |
| KR | 20210015639 A | 2/2021 |
| KR | 20210142118 A | 11/2021 |
| KR | 20220025020 A | 3/2022 |
| KR | 20220130783 A | 9/2022 |
| KR | 20230029977 A | 3/2023 |
| TW | 200504864 A | 2/2005 |
| TW | 200846333 A | 12/2008 |
| TW | 200903686 A | 1/2009 |
| TW | 200947117 A | 11/2009 |
| TW | 201005568 A | 2/2010 |
| TW | 201145383 A | 12/2011 |
| TW | 201224190 A | 6/2012 |
| TW | I365354 B | 6/2012 |
| TW | 201241555 A | 10/2012 |
| TW | 201245918 A | 11/2012 |
| TW | 201246273 A | 11/2012 |
| TW | 201501179 A | 1/2015 |
| TW | I494689 B | 8/2015 |

(56)          References Cited

FOREIGN PATENT DOCUMENTS

| TW | 201631377 A | 9/2016 |
| TW | 201729006 A | 8/2017 |
| TW | 201734025 A | 10/2017 |
| TW | 201826034 A | 7/2018 |
| TW | 201830472 A | 8/2018 |
| TW | 201837066 A | 10/2018 |
| TW | 201931011 A | 8/2019 |
| TW | 202001407 A | 1/2020 |
| TW | 202006168 A | 2/2020 |
| TW | 202308466 A | 2/2023 |
| TW | 202318103 A | 5/2023 |
| WO | WO-2002103764 A1 | 12/2002 |
| WO | WO-2004095551 A1 | 11/2004 |
| WO | WO-2007123539 A1 | 11/2007 |
| WO | WO-2008019362 A2 | 2/2008 |
| WO | WO-2008088076 A1 | 7/2008 |
| WO | WO-2011081151 A1 | 7/2011 |
| WO | WO-2012075249 A1 | 6/2012 |
| WO | WO-2012048094 A3 | 7/2012 |
| WO | WO-2013078211 A1 | 5/2013 |
| WO | WO-2014172142 A1 | 10/2014 |
| WO | WO-2016065120 A1 | 4/2016 |
| WO | WO-2016144960 A1 | 9/2016 |
| WO | WO-2016208300 A1 | 12/2016 |
| WO | WO-2017002497 A1 | 1/2017 |
| WO | WO-2017066319 A2 | 4/2017 |
| WO | WO-2017109040 A1 | 6/2017 |
| WO | WO-2017198418 A1 | 11/2017 |
| WO | WO-2018004551 A1 | 1/2018 |
| WO | WO-2018004646 A1 | 1/2018 |
| WO | WO-2018061670 A1 | 4/2018 |
| WO | WO-2018189413 A1 | 10/2018 |
| WO | WO-2019163455 A1 | 8/2019 |
| WO | WO-2019217749 A1 | 11/2019 |
| WO | WO-2019222320 A1 | 11/2019 |
| WO | WO-2019241402 A1 | 12/2019 |
| WO | WO-2020014179 A1 | 1/2020 |
| WO | WO-2020030855 A2 | 2/2020 |
| WO | WO-2020102085 A1 | 5/2020 |
| WO | WO-2020132281 A1 | 6/2020 |
| WO | WO-2020190941 A1 | 9/2020 |
| WO | WO-2020263750 A1 | 12/2020 |
| WO | WO-2020264158 A1 | 12/2020 |
| WO | WO-2020264571 A1 | 12/2020 |
| WO | WO-2021072042 A1 | 4/2021 |
| WO | WO-2021202681 A1 | 10/2021 |
| WO | WO-2021262529 A1 | 12/2021 |
| WO | WO-2022005808 A1 | 1/2022 |
| WO | WO-2022103764 A1 | 5/2022 |
| WO | WO-2022103949 A1 | 5/2022 |
| WO | WO-2022125388 A1 | 6/2022 |

OTHER PUBLICATIONS

CN Office Action dated Apr. 22, 2024 in CN Application No. 201980085227.1 with English translation.
CN Office Action dated Dec. 13, 2023 in CN Application No. 201810783756.6 with English translation.
CN Office Action dated Jan. 3, 2024 in CN Application No. 202310318757.4 with English Translation.
CN Office Action dated Jan. 23, 2024 in CN Application No. 202080046943.1 with English Translation.
CN Office Action dated Jul. 23, 2024 in CN Application No. 201810783756.6 with English translation.
CN Office Action dated Jun. 1, 2023, in application No. CN201810783756 with English translation.
CN Office Action dated Jun. 8, 2022 in Application No. CN202180002531.2 With English Translation.
CN Office Action dated Mar. 14, 2024 in CN Application No. 201810783756.6, with English Translation.
CN Office Action dated Nov. 16, 2022, in Application No. CN202180002531.2 with English translation.

CN Office Action dated Nov. 18, 2022, in Application No. CN201810783756.6 with English Translation.
CN Office Action dated Sep. 14, 2024 in CN Application No. 202310318757.4 with English translation.
CN Office Action dated Sep. 23, 2024 in CN Application No. 202080046943.1 with English translation.
Dahuang, D., et al., Functional Thin Films and Their Deposition Preparation Techniques, Metallurgy Industrial Press, Jan. 31, 2013, pp. 450-454. [with English Translation].
Danilo D.E., et al., "Metal Containing Resist Readiness for HVM EUV Lithography", Journal of Photopolymer Science and Technology, 2016, vol. 29(3), pp. 501-507.
EP Extended European Search Report dated Jul. 13, 2023, in Application No. EP20831843.6.
EP Extended European Search report dated Nov. 29, 2023 in EP Application No. 23173688.5.
EP Extended European Search report dated Oct. 25, 2023, in Application No. EP21837274.6.
EP Partial European Search Report dated Aug. 29, 2023, in Application No. 23173688.5.
European Search Report dated Feb. 15, 2022, in Application No. EP21741104.
European Office Action dated Feb. 25, 2022 in Application No. 21741104.
Extended European Search Report dated Dec. 23, 2021, in Application No. EP19800353.5.
Hamley, I.W., "Nanostructure fabrication using block copolymers", Nanotechnology. Sep. 2003. 17;14(10):R39-R54.
Hench, L.L. and West, J.K., "The sol-gel process," Chemical reviews, Jan. 1, 1990; 90(1) pp. 33-72.
International Preliminary Report on Patentability dated Oct. 13, 2022, in PCT Application No. PCT/US2021/023493.
International Search Report and Written Opinion dated Aug. 4, 2021, in PCT Application No. PCT/US2021/023493.
International Search Report and Written Opinion dated Mar. 4, 2022, in Application No. PCT/US2021/058647.
International Preliminary Report on Patentability dated May 27, 2021 issued in Application No. PCT/US2019/060742.
International Search Report and Written Opinion dated May 17, 2021 issued in Application No. PCT/US2021/015656.
International Preliminary Report on Patentability and Written Opinion dated Dec. 28, 2023 in PCT Application No. PCT/US2022/033488.
International Preliminary Report on Patentability and Written Opinion dated Feb. 8, 2024 in PCT Application No. PCT/US2022/037733.
International Preliminary Report on Patentability and Written Opinion dated Jun. 27, 2024 in PCT Application No. PCT/US2022/081376.
International Preliminary Report on Patentability and Written Opinion dated Jun. 27, 2024 in PCT Application No. PCT/US2022/081390.
International Preliminary Report on Patentability and Written Opinion dated Jun. 27, 2024 in PCT Application No. PCT/US2022/081845.
International Preliminary Report on Patentability dated Apr. 14, 2022 issued in Application No. PCT/US2020/053856.
International Preliminary Report on Patentability dated Aug. 18, 2022 in PCT Application No. PCT/US2021/015656.
International Preliminary Report on Patentability dated Jan. 27, 2021 in Application PCT/US2020/054730.
International Preliminary Report on Patentability dated Jan. 5, 2023 in PCT Application No. PCT/US2021/034019.
International Preliminary Report on Patentability dated Jan. 5, 2023 in PCT Application No. PCT/US2021/037924.
International Preliminary Report on Patentability dated Jan. 19, 2023 in PCT Application No. PCT/US2021/040381.
International Preliminary Report on Patentability dated Jan. 26, 2023 in PCT Application No. PCT/US2021/042106.
International Preliminary Report on Patentability dated Jan. 6, 2022 in PCT Application No. PCT/US2020/038968.
International Preliminary Report on Patentability dated Jan. 6, 2022 in PCT Application No. PCT/US2020/039615.

(56) References Cited

OTHER PUBLICATIONS

International Preliminary Report on Patentability dated Jan. 6, 2022 in PCT Application No. PCT/US2020/070171.
International Preliminary Report on Patentability dated Jan. 6, 2022 in PCT Application No. PCT/US2020/070172.
International Preliminary Report on Patentability dated Jan. 6, 2022 in PCT Application No. PCT/US2020/070187.
International Preliminary Report on Patentability dated Jul. 28, 2022 in PCT Application No. PCT/US2021/012953.
International Preliminary Report on Patentability dated Jun. 22, 2023, in Application No. PCT/US2021/061751.
International Preliminary Report on Patentability dated May 25, 2023, in Application No. PCT/US2021/058647.
International Search Report and Written Opinion dated May 12, 2021 issued in Application No. PCT/US2021/012953.
International Search Report and Written Opinion dated Apr. 10, 2020 issued in Application No. PCT/US2019/060742.
International Search Report and Written Opinion dated Apr. 17, 2023, in Application No. PCT/US2022/081390.
International Search Report and Written Opinion dated Apr. 17, 2023 in PCT Application No. PCT/US2022/081376.
International Search Report and Written Opinion dated Apr. 19, 2023, in Application No. PCT/US2022/081845.
International Search Report and Written Opinion dated Apr. 24, 2020 issued in Application No. PCT/US2019/067540.
International Search Report and Written Opinion dated Aug. 17, 2023, in Application No. PCT/US2023/019871.
International Search Report and Written Opinion dated Aug. 22, 2019 issued in Application No. PCT/US2019/031618.
International Search Report and Written Opinion dated Jan. 27, 2021 issued in Application No. PCT/US2020/054730.
International Search Report and Written Opinion dated Jul. 4, 2024 in PCT Application No. PCT/US2024/019555.
International Search Report and Written Opinion dated Mar. 23, 2021 issued in Application No. PCT/US2020/053856.
International Search Report and Written Opinion dated Mar. 24, 2022, for International Application No. PCT/US2021/061751.
International Search Report and Written Opinion dated Nov. 4, 2021 in PCT Application No. PCT/US2021/042106.
International Search Report and Written Opinion dated Nov. 11, 2022 in PCT Application No. PCT/US2022/037733.
International Search Report and Written Opinion dated Oct. 8, 2020 in Application No. PCT/US2020/038968.
International Search Report and Written Opinion dated Oct. 13, 2021, in application No. PCT/US2021/037924.
International Search Report and Written Opinion dated Oct. 13, 2023 in PCT Application No. PCT/US2023/069419.
International Search Report and Written Opinion dated Oct. 16, 2020 issued in Application No. PCT/US2020/039615.
International Search Report and Written Opinion dated Oct. 16, 2020 issued in Application No. PCT/US2020/070171.
International Search Report and Written Opinion dated Oct. 16, 2020 issued in Application No. PCT/US2020/070172.
International Search Report and Written Opinion dated Oct. 17, 2022 in PCT Application No. PCT/US2022/033488.
International Search Report and Written Opinion dated Oct. 28, 2021 in PCT Application No. PCT/US2021/040381.
International Search Report and Written Opinion dated Oct. 8, 2020 issued in Application No. PCT/US2020/038968.
International Search Report and Written Opinion dated Sep. 15, 2021, in PCT Application No. PCT/US2021/034019.
JP Office Action dated Jul. 26, 2022 in Application No. JP2021102822 With English translation.
JP Office Action dated Nov. 15, 2022, in Application No. JP2021-176082 with English translation.
JP Notice of Allowances dated Aug. 27, 2024 in JP Application No. 2022-559416 with English translation.
JP Notice of Allowances dated Sep. 3, 2024 in JP Application No. 2023-63868 with English translation.

JP Office Action dated Apr. 2, 2024 in JP Application No. 2022-559416, with English Translation.
JP Office Action dated Apr. 27, 2023 in Application No. JP2021-575910 with English translation.
JP Office Action dated Feb. 13, 2024 in JP Application No. 2023-63868, with English Translation.
JP Office Action dated Jan. 9, 2024 in JP Application No. 2023-179933, with English Translation.
JP Office Action dated Jan. 9, 2024 in JP Application No. 2023-184334 with English Translation.
JP Office Action dated Jan. 17, 2023, in Application No. JP2022-552422 with English translation.
JP Office Action dated Jun. 27, 2023, in Application No. JP2022-552422 with English translation.
JP Office Action dated Jun. 27, 2023, in application No. JP2023-63868 with English translation.
JP Office Action dated Mar. 5, 2024 in JP Application No. 2021-575910, with English Translation.
JP Office Action dated Nov. 14, 2023, in JP Application No. 2021-0575910 with English Translation.
JP Office Action dated Nov. 14, 2023 in JP Application No. 2022-559416, with English Translation.
JP Office Action dated Oct. 10, 2023 in Application No. JP2022-552422 with English Translation.
KR Notice of Allowance dated Aug. 1, 2024 in KR Application No. 10-2024-7012307, with English Translation.
KR Office Action dated Feb. 8, 2022, in Application No. KR10-2021-7030794 with English Translation.
KR Office Action dated Apr. 9, 2024 in KR Application No. 10-2023-7038357 with English Translation.
KR Office Action dated Apr. 23, 2024 in KR Application No. 10-2016-0152489 with English translation.
KR Office Action dated Aug. 11, 2023, in Application No. KR10-2023-7011840 with English translation.
KR Office Action dated Feb. 29, 2024 in KR Application No. 10-2022-7026649, with English Translation.
KR Office Action dated Jul. 12, 2024 in KR Application No. 10-2022-7029421 with English translation.
KR Office Action dated Jul. 12, 2024 in KR Application No. 10-2023-7036296 with English translation.
KR Office Action dated Jun. 24, 2024 in KR Application No. 10-2022-7002869, with English Translation.
KR Office Action dated Mar. 14, 2024 in KR Application No. 10-2021-7022858, with English Translation.
KR Office Action dated May 9, 2022, in Application No. KR1020217030794 with English translation.
KR Office Action dated Nov. 21, 2023 in KR Application No. 10-2022-7002869 with English Translation.
KR Office Action dated Nov. 21, 2023 in KR Application No. 10-2022-7029421 with English Translation.
Kwon, J., et al., "Substrate Selectivity of (tBu-Allyl)Co(C0)3 during Thermal Atomic Layer Deposition of Cobalt," Chemistry of Materials, Mar. 27, 2012; 24(6): pp. 1025-1030.
Lemaire, P.C., et al., "Understanding inherent substrate selectivity during atomic layer deposition: Effect of surface preparation, hydroxyl density, and metal oxide composition on nucleation mechanisms during tungsten ALD" The Journal of chemical physics, Feb. 7, 2017, 146(5):052811.
Lu, Y., et al., "Continuous formation of supported cubic and hexagonal mesoporous films by sol-gel dip-coating" Nature, Sep. 1997, 389(6649), pp. 364-368.
Mackus, A.J., et al. "The use of atomic layer deposition in advanced nanopatterning", Nanoscale. Jul. 25, 2014; 6(19):10941-60.
Nazarov, D.V., et al., "Atomic layer deposition of tin dioxide nanofilms: A review", Rev. Adv. Mater. Sci. Jun. 1, 2015; 40(3):262-75.
Notice of Allowance dated Dec. 9, 2021 in U.S. Appl. No. 17/310,635.
Rantala, et al., "New resist and underlayer approaches toward EUV lithography," Proc. SPIE 10809, International Conference on Extreme Ultraviolet Lithography 2018, pp. 108090X-1-108090X-8. (Oct. 11, 2018).
SG Written Opinion dated Aug. 30, 2024 in SG Application No. 11202114183P.

(56) References Cited

OTHER PUBLICATIONS

TW Office Action dated Jan. 9, 2023 In Application No. TW20190116155 with English translation.
TW Office Action dated Sep. 5, 2022, in Application No. TW110101388 with English translation.
TW Office Action dated Apr. 19, 2024 in TW Application No. 112146727 with English translation.
TW Office Action dated Apr. 22, 2024 in TW Application No. 112126160 with English translation.
TW Office Action dated Apr. 29, 2022 in Application No. TW110118172 with English translation.
TW Office Action dated Aug. 17, 2023, in application No. TW110124741 with Translation.
TW Office Action dated Jan. 11, 2024 in TW Application No. 108146890, with English Translation.
TW Office Action dated Jan. 13, 2023, in Application No. TW110124741 with English translation.
TW Office Action dated Jan. 19, 2023 in Application No. TW110141961 with English translation.
TW Office Action dated Jul. 2, 2024 in TW Application No. 109134940 with English translation.
TW Office Action dated Jul. 9, 2024 in TW Application No. 110111086 with English translation.
TW Office Action dated Jun. 27, 2024 in TW Application No. 113107490 with English translation.
TW Office Action dated Mar. 21, 2024 in TW Application No. 108146890, with English Translation.
TW Office Action dated Mar. 7, 2022, in Application No. TW110101388 with English translation.
TW Office Action dated May 16, 2023, in Application No. TW20190146890 with English translation.
TW Office Action dated Oct. 13, 2023, in application No. TW109121680 with English Translation.
U.S. Advisory Action dated Apr. 16, 2024 in U.S. Appl. No. 17/596,648.
U.S. Advisory Action dated Jun. 24, 2024 in U.S. Appl. No. 18/377,245.
U.S. Advisory Action dated May 7, 2024 in U.S. Appl. No. 18/298,003.
U.S. Advisory Action dated Sep. 3, 2024 in U.S. Appl. No. 18/377,267.
U.S. Advisory Action dated Sep. 5, 2024 in U.S. Appl. No. 17/759,281.
U.S. Corrected Notice of Allowance dated Aug. 29, 2024 in U.S. Appl. No. 17/596,648.
U.S. Final Office Action dated Feb. 27, 2024 in U.S. Appl. No. 18/298,003.
U.S. Final Office Action dated Jun. 21, 2024 in U.S. Appl. No. 18/377,267.
U.S. Final Office Action dated Jun. 27, 2024 in U.S. Appl. No. 17/759,281.
U.S. Final Office Action dated Mar. 5, 2024 in U.S. Appl. No. 17/596,648.
U.S. Final Office Action dated Mar. 12, 2024 in U.S. Appl. No. 18/377,245.
U.S. Final Office Action dated May 3, 2024 in U.S. Appl. No. 18/297,989.
U.S. Final Office Action dated May 9, 2024 in U.S. Appl. No. 17/309,587.
U.S. Final Office Action dated May 12, 2023 in U.S. Appl. No. 17/455,185.
U.S. Final Office Action dated Nov. 9, 2023 in U.S. Appl. No. 17/455,185.
U.S. Non-Final Office Action dated Feb. 1, 2024 in U.S. Appl. No. 17/759,281.
U.S. Non-Final office Action dated Feb. 7, 2023 in U.S. Appl. No. 17/455,185.
U.S. Non-Final Office Action dated Jun. 21, 2024 in U.S. Appl. No. 17/596,648.
U.S. Non-Final Office Action dated Mar. 4, 2024 in U.S. Appl. No. 17/758,125.
U.S. Non-Final Office Action dated Mar. 4, 2024 in U.S. Appl. No. 18/377,267.
U.S. Non-Final Office Action dated May 29, 2024 in U.S. Appl. No. 18/298,003.
U.S. Non-Final Office Action dated Nov. 6, 2023, in U.S. Appl. No. 17/309,587.
U.S. Non-Final Office Action dated Nov. 20, 2023 in U.S. Appl. No. 18/377,245.
U.S. Non-Final Office Action dated Oct. 13, 2023, in U.S. Appl. No. 18/184,545.
U.S. Non-Final Office Action dated Oct. 20, 2023, in U.S. Appl. No. 18/297,989.
U.S. Non-Final Office Action dated Oct. 20, 2023, in U.S. Appl. No. 18/298,003.
U.S. Non-Final Office Action dated Oct. 26, 2023, in U.S. Appl. No. 17/596,648.
U.S. Notice of Allowance dated Aug. 7, 2024 in U.S. Appl. No. 18/184,545.
U.S. Notice of Allowance dated Aug. 16, 2024 in U.S. Appl. No. 17/596,648.
U.S. Notice of Allowance dated Feb. 22, 2022 in U.S. Appl. No. 17/310,635.
U.S. Notice of Allowance dated Mar. 6, 2024 in U.S. Appl. No. 18/184,545.
U.S. Notice of Allowance dated Mar. 13, 2024 in U.S. Appl. No. 18/184,545.
U.S. Notice of Allowance dated Sep. 9, 2024 in U.S. Appl. No. 18/184,545.
US Notice of Allowance dated Sep. 15, 2021, issued in U.S. Appl. No. 16/691,508.
US Notice of Allowance dated Sep. 9, 2021, issued in U.S. Appl. No. 16/691,508.
U.S. Appl. No. 18/569,213, inventors Kanakasabapathy S K, et al., filed Dec. 11, 2023.
U.S. Appl. No. 18/850,990, inventors Lee Y, et al., filed Sep. 25, 2024.
U.S. Restriction Requirement dated Nov. 14, 2022 in U.S. Appl. No. 17/455,185.
U.S. Restriction requirement dated Aug. 4, 2023, in U.S. Appl. No. 18/297,989.
U.S Restriction requirement dated Aug. 18, 2023 in U.S. Appl. No. 18/298,003.
U.S. Restriction requirement dated Aug. 30, 2024 in U.S. Appl. No. 18/700,238.
U.S. Restriction Requirement dated Nov. 20, 2023 in U.S. Appl. No. 17/759,281.
U.S. Restriction requirement dated Sep. 7, 2023 in U.S. Appl. No. 17/309,587.
Xu, et al., "Underlayer designs to enhance the performance of EUV resists," Proceedings of SPIE, vol. 7273, 2009, pp. 727311-1-727311-11.
CN Office Action dated Dec. 2, 2024 in CN Application No. 202211142175.7, with English Translation.
CN Office Action dated May 29, 2025 in CN Application No. 202211142175.7 with English translation.
EP Office Action dated Jan. 21, 2025 in EP Application No. 23173688.5.
International Preliminary Report on Patentability and Written Opinion dated Nov. 14, 2024 in PCT Application No. PCT/US2023/019871.
International Search Report and Written Opinion dated Dec. 26, 2024 in PCT Application No. PCT/US2024/046887.
International Search Report and Written Opinion dated Feb. 21, 2025 in PCT Application No. PCT/US2024/054953.
International Search Report and Written Opinion dated Nov. 20, 2024 in PCT Application No. PCT/US2024/039915.
International Search Report and Written Opinion dated Sep. 13, 2024 in PCT Application No. PCT/US2024/033522.
JP Office Action dated Jan. 7, 2025 in JP Application No. 2023-533602, with English Translation.
JP Office Action dated Jun. 10, 2025 in JP Application No. 2024559372, awaiting English Translation.
JP Office Action dated Jun. 10, 2025 in JP Application No. 2024559372.

(56)     References Cited

OTHER PUBLICATIONS

JP Office Action dated May 13, 2025 in JP Application No. 2023-502906, with English Translation.
JP Office Action dated Nov. 12, 2024 in JP Application No. 2024-522188 with English translation.
KR Notice of Allowance dated Dec. 12, 2024 in KR Application No. 10-2016-0152489, with English Translation.
KR Notice of Allowance dated Jan. 23, 2025 in KR Application No. 10-2024-7037880, with English Translation.
KR Office Action dated Feb. 5, 2025 in KR Application No. 10-2022-7037995, with English Translation.
KR Office Action dated Jan. 15, 2025 in KR Application No. 10-2023-7023253, with English Translation.
KR Office Action dated Mar. 13, 2025 in KR Application No. 10-2023-7004801, with English Translation.
KR Office Action dated Nov. 28, 2024 in KR Application No. 10-2022-7014896, with English Translation.
TW Office Action and Search Report dated Jan. 16, 2025 in TW Application No. 113105443, with English Translation.
TW Office Action dated Apr. 17, 2025 in TW Application No. 113105443, with English Translation.
TW Office Action dated Apr. 17, 2025 in TW Application No. 113118322, with English Translation.
TW Office Action dated Jan. 20, 2025 in TW Application No. 108146890, with English Translation.
TW Office Action dated Mar. 11, 2025 in TW Application No. 110126445, with English Translation.
TW Office Action dated Nov. 26, 2024 in TW Application No. 110126445, with English Translation.
U.S. Corrected Notice of Allowance dated Jun. 5, 2025 in U.S. Appl. No. 18/377,245.
U.S. Corrected Notice of Allowance dated Mar. 20, 2025 in U.S. Appl. No. 18/377,245.
U.S. Final Office Action dated Jun. 6, 2025 in U.S. Appl. No. 18/700,238.
U.S. Non-Final Office Action dated Apr. 17, 2025 in U.S. Appl. No. 18/769,038.
U.S. Non-Final Office Action dated Feb. 20, 2025 in U.S. Appl. No. 18/700,238.
U.S. Non-Final Office Action dated Jan. 3, 2025 in U.S. Appl. No. 18/769,038.
U.S. Non-Final Office Action dated Jan. 24, 2025 in U.S. Appl. No. 18/769,048.
US Non-Final Office Action dated Jun. 18, 2025 in U.S. Appl. No. 17/753,110.
US Non-Final Office Action dated May 5, 2025 in U.S. Appl. No. 18/769,048.
U.S. Notice of Allowance dated Apr. 9, 2025 in U.S. Appl. No. 18/850,990.
U.S. Notice of Allowance dated Dec. 13, 2024 in U.S. Appl. No. 18/377,267.
U.S. Notice of Allowance dated Mar. 7, 2025 in U.S. Appl. No. 18/377,245.
U.S. Notice of Allowance dated Nov. 14, 2024 in U.S. Appl. No. 17/309,587..
U.S. Appl. No. 19/076,745, inventors Yu J et al., filed Mar. 11, 2025.
U.S. Appl. No. 19/179,005, inventors Dictus D et al., filed Apr. 15, 2025.
U.S. Appl. No. 19/181,906, inventors Li D et al., filed Apr. 17, 2025.
U.S. Appl. No. 19/182,430, inventors Weidman T.W et al., filed Apr. 17, 2025.
U.S. Appl. No. 19/202,425, inventors Hansen E.C et al., filed May 8, 2025.
U.S. Restriction Requirement dated Mar. 20, 2025 in U.S. Appl. No. 17/753,110.
U.S. Supplemental Notice of Allowance dated Mar. 17, 2025 in U.S. Appl. No. 18/377,267.
Barret M C., et al., "Copper, Zinc and Tin Hydroxypyridinones," Transition Metal Chemistry, Jan. 2015, vol. 40, pp. 241-254.

Cilibrizzi A., et al., "Hydroxypyridinone Journey into Metal Chelation," Chemical Review, Jul. 2018, vol. 118, pp. 7657-7701.
CN Office Action dated Aug. 12, 2025 in CN Application No. 202211142175.7, with English Translation.
EP Extended European Search report dated Sep. 24, 2025 in EP Application No. 25172399.5.
EP Office Action dated Oct. 24, 2025 in EP Application No. 24775376.7.
Fitzgerald A., et al., "Determination of Trace Metals in Positive Photoresist," Journal of the Electrochemical Society, May 1992, vol. 139 (5), pp. 1413-1414.
International Preliminary Report on Patentability and Written Opinion dated Oct. 2, 2025 in PCT Application No. PCT/US2024/019555.
JP Office Action dated Aug. 5, 2025 in JP Application No. 2021-575910, with English Translation.
JP Office Action dated Sep. 9, 2025 in JP Application No. 2023-502906, with English Translation.
KR Notice of Allowances dated Oct. 16, 2024 in KR Application No. 10-2022-7002869 with English Translation.
KR Office Action dated Aug. 27, 2025 in KR Application No. 10-2022-7014896, with English Translation.
KR Office Action dated Jul. 22, 2025 in KR Application No. 10-2024-7037744, with English Translation.
SG Written Opinion dated Jun. 30, 2025 in SG Application No. 11202114183P.
SG Written Opinion dated Jun. 30, 2025 in SG Application No. 11202251459E.
Stowers et al.; "Directly patterned inorganic hard mask for EUV lithography"; proceedings of the SPIE 7969; Extreme Ultraviolet (EUV) Lithography 11, 796915-1-11 (Apr. 7, 2011), event: SPI E Advanced Lithography, 2011, San Jose California.
TW Office Action and Search Report dated Jul. 8, 2025 in TW Application No. 110145602, with English Translation.
TW Office Action dated Jul. 24, 2025 in TW Application No. 113118322, with EnglishTranslation.
U.S. Final Office Action dated Aug. 20, 2025 in U.S. Appl. No. 18/769,038.
U.S. Final Office Action dated Aug. 22, 2025 in U.S. Appl. No. 18/769,048.
US Non-Final Office Action dated Jul. 14, 2025 in U.S. Appl. No. 18/005,571.
US Non-Final Office Action dated Jul. 15, 2025 in U.S. Appl. No. 18/254,787.
U.S. Non-Final Office Action dated Oct. 1, 2024 in U.S. Appl. No. 17/309,587.
U.S. Non-Final Office Action dated Oct. 1, 2025 in U.S. Appl. No. 17/905,632.
U.S. Non-Final Office Action dated Oct. 9, 2024 in U.S. Appl. No. 18/377,245.
U.S. Notice of Allowance dated Jul. 8, 2025 in U.S. Appl. No. 18/850,990.
U.S. Notice of Allowance dated Oct. 17, 2025 in U.S. Appl. No. 18/769,038.
U.S. Notice of Allowance dated Oct. 17, 2025 in U.S. Appl. No. 18/769,048.
U.S. Notice of Allowance dated Sep. 16, 2025 in U.S. Appl. No. 18/700,238.
U.S. Appl. No. 19/352,826, inventors Lee Y et al., filed Oct. 8, 2025.
KR Office Action dated Nov. 12, 2025 in KR Application No. 10-2023-7004801, with English Translation.
KR Office Action dated Nov. 24, 2025 in KR Application No. 10-2024-7043554, with English Translation.
TW Office Action and Search Report dated Nov. 6, 2025 in TW Application No. 113109390, with English Translation.
TW Office Action and Search Report dated Nov. 27, 2025 in TW Application No. 110126445, with English Translation.
TW Office Action and Search Report dated Oct. 31, 2025 in TW Application No. 113128085, with English Translation.
U.S. Final Office Action dated Nov. 17, 2025 in U.S. Appl. No. 17/753,110.
U.S. Notice of Allowance dated Nov. 24, 2025 in U.S. Appl. No. 18/254,787.

(56)     References Cited

OTHER PUBLICATIONS

U.S. Appl. No. 19/387,102, inventors Li D et al., filed on Nov. 12, 2025.

U.S. Appl. No. 19/393,174, inventors Tan S.S et al., filed Nov. 18, 2025.

International Preliminary Report on Patentability and Written Opinion dated Dec. 26, 2025 in PCT Application No. PCT/US2024/033522.

JP Office Action dated Jan. 20, 2026 in JP Application No. 2025-073845, with English Translation.

KR Office Action dated Dec. 17, 2025 in KR Application No. 10-2025-7013740, with English Translation.

KR Office Action dated Dec. 19, 2025 in KR Application No. 10-2025-7012180, with English Translation.

KR Office Action dated Feb. 11, 2026 in KR Application No. 10-2025-7015615, with English Translation.

TW Office Action and Search Report dated Jan. 12, 2026 in TW Application No. 114113726, with English Translation.

TW Office Action dated Jan. 9, 2026 in TW Application No. 113118322, withEnglish Translation.

TW Office Action dated Jan. 13, 2026 in TW Application No. 114115269, with English Translation.

U. S. Final Office Action dated Dec. 4, 2025 in U.S. Appl. No. 18/005,571.

U.S. Advisory Action dated Jan. 16, 2026 in U.S. Appl. No. 17/753,110.

U.S. Final Office Action dated Feb. 2, 2026 in U.S. Appl. No. 17/905,632.

U.S. Non-Final Office Action dated Dec. 18, 2025 in U.S. Appl. No. 18/580,334.

U.S. Non-Final Office Action dated Jan. 27, 2026 in U.S. Appl. No. 18/932,475.

U.S. Appl. No. 19/490,152, inventors Agnew D. W et al., filed on Dec. 4, 2025.

International Preliminary Report on Patentability and Written Opinion dated Feb. 5, 2026 in PCT Application No. PCT/US2024/039915.

JP Office Action dated Dec. 9, 2025 in JP Application No. 2024559373, with English Translation.

KR Office Action dated Feb. 8, 2026 in KR Application No. 10-2025-7013547, with English Translation.

* cited by examiner

100

102 — Deposit photoresist (PR)

104 — Clean wafer backside and/or bevel edge

106 — Post Application Bake (PAB) / Pretreat PR

108 — Exposure to develop PR pattern

110 — Post Exposure Bake (PEB) / Post-treat PR

112 — Develop PR pattern

114 — Post-development treatment

116 — Pattern transfer

410

420

430

432    Thermal Dry Development

433

434    Plasma Dry Development/Hardening

436    Pattern Transfer

438    Wet cleaning

440

450

Thermal Dry Development                                          452

453

Plasma Dry Development/Passivation/Hardening                     454

Pattern Transfer                                                456

Wet cleaning                                                    458

ALL-IN-ONE DRY DEVELOPMENT FOR METAL-CONTAINING PHOTORESIST

CROSS-REFERENCES

A PCT Request Form is filed concurrently with this specification as part of the present application. Each application that the present application claims benefit of or priority to as identified in the concurrently filed PCT Request Form is incorporated by reference herein in their entireties and for all purposes.

BACKGROUND

The fabrication of semiconductor devices such as integrated circuits is a multi-step process involving photolithography. In general, the process includes deposition of a material on a wafer and patterning the material through lithographic techniques to form structural features (e.g., transistors and circuitry) of the semiconductor device. The steps of a typical photolithography process include: preparing the substrate; applying a photoresist, such as by spin coating; exposing the photoresist to light in a desired pattern, causing the exposed areas of the photoresist to become more or less soluble in a developer solution; developing the photoresist pattern by applying a developer solution to remove either the exposed or the unexposed areas of the photoresist; and subsequent processing to create features on the areas of the substrate from which the photoresist has been removed, such as by etching or material deposition.

The evolution of semiconductor design has created the need and has been driven by the ability to create ever smaller features on semiconductor substrate materials. One challenge in manufacturing devices having such small features is the ability to reliably and reproducibly create photolithographic masks having sufficient resolution. Current photolithography processes typically use 193 nm ultraviolet (UV) light to expose a photoresist. The fact that the light has a wavelength significantly greater than the desired size of the features to be produced on the semiconductor substrate creates inherent issues. Achieving feature sizes smaller than the wavelength of the light requires use of complex resolution enhancement techniques such as multipatterning. Thus, there is significant interest and research towards developing photolithographic techniques using shorter wavelength light, such as extreme ultraviolet radiation (EUV), having a wavelength of from 10 nm to 15 nm, e.g., 13.5 nm.

EUV photolithographic processes can present challenges however, including low power output, loss of light during patterning and metal cross-contamination stemming from metal outgassing. Accordingly, there remains a need for improved EUV photoresist processes that will produce materials having desired properties in a more efficient manner.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

The present disclosure relates to methods and apparatuses for integration of dry development processes into the same process chamber. In some embodiments, the present disclosure relates to methods and apparatuses for integration of dry development and dry development post-processes into the same process chamber. This integration which treats the surface of a metal-containing photoresist increases throughput and reduces handling of wafers; augmenting the efficiency of semiconductor manufacturing by virtue of higher wafer productivity and better lithographic control. The integration process also improves device yield/defectivity performance. The dry development post-processes may include passivating with a plasma. Additionally or alternatively, the dry development post-processes may include hardening. The dry development post-processes of passivating with a plasma in a flash treatment and/or hardening may be performed in conjunction with dry development all in one single process chamber, eliminating the need for a post-dry development bake which would have to be performed in a different chamber or tool. The integrated method also accomplishes surface smoothing and mitigates outgassing of contaminants through passivation.

Accordingly, in a first aspect, the present disclosure encompasses a method for performing dry development and passivation of a metal-containing photoresist all in one process chamber. In some embodiments, the method includes providing a patterned metal-containing photoresist on a semiconductor substrate in a process chamber; thermally dry developing the patterned metal-containing photoresist with a process gas at a first pressure to form a thermally dry developed patterned metal-containing photoresist; and passivating the thermally dry developed patterned metal-containing photoresist in the same process chamber as thermally dry developing, at a second pressure different or the same as the first pressure to form the patterned substrate. In some embodiments, the second pressure is lower than the first pressure.

In some embodiments, passivating includes exposure to an oxygen-containing, nitrogen-containing, or hydrogen-containing plasma.

In some embodiments, passivating is a flash treatment with $O_2$, $O_3$, CO, $CO_2$, $H_2$, $C_xH_y$, $H_2O$, $H_2O_2$, $SO_2$, NO, $NO_2$, $N_2O$, $NH_3$, or mixtures thereof; and wherein x is an integer of 1 to 6 and y is an integer of 2 to 14.

In some embodiments, the flash treatment is for a duration of from about 0.5 to about 10 seconds.

In some embodiments, semiconductor substrate throughput is increased by at least about 50%.

In some embodiments, the metal-containing photoresist is a photopatterned EUV-sensitive organo-metal oxide, a photopatterned EUV-sensitive metal oxide or an organo-metal containing thin film EUV resist.

In some embodiments, the photopatterned EUV-sensitive metal oxide is tin oxide.

In some embodiments, tin outgassing from the tin oxide is mitigated.

In some embodiments, thermally dry developing includes exposure to a halogen-containing gas.

In some embodiments, the method also includes plasma dry developing the thermally dry developed patterned metal-containing photoresist, where the thermally dry developing, the plasma dry developing and the passivating are all performed in the same process chamber.

In some embodiments, operations of thermally dry developing and plasma dry developing are alternatingly repeated.

In some embodiments, the plasma dry developing includes a cyclic plasma dry development, direct plasma dry development, remote plasma dry development or continuous plasma dry development.

In some embodiments, the plasma dry developing includes continuous plasma dry development, and the continuous plasma dry development is performed at variable power, at constant power and pulsing bias or at variable power and pulsing bias.

In some embodiments, the plasma dry developing includes exposure to a plasma of at least one halogen-containing gas in an inert carrier gas.

In some embodiments, the halogen-containing gas is HBr, $Br_2$, HCl, $Cl_2$, HI, $I_2$ or $BCl_3$.

In some embodiments, the first pressure is from about 5 mTorr to 760 Torr and the second pressure is from about 5 mTorr to 200 mTorr.

In some embodiments, the second pressure is lower than the first pressure.

In some embodiments, the method also includes transitioning pressure in the same process chamber from the first pressure to the second pressure in ten seconds or less: returning pressure in the same process chamber from the second pressure back to the first pressure after plasma dry development and passivating in twenty seconds or less; and maintaining one or more process parameters uniformly.

In some embodiments, the method also includes hardening the metal-containing photoresist in the same process chamber as utilized for thermally dry developing.

In some embodiments, the method also includes hardening the metal-containing photoresist after passivation in the same process chamber as utilized for thermally dry developing, plasma dry developing and passivating.

In some embodiments, the hardening is performed by treatment with a plasma of inert gas, treatment with a plasma of an oxidizing gas, thermal treatment, UV light exposure or a combination thereof.

In a second aspect, the present disclosure encompasses an apparatus for performing dry development and passivation of a metal-containing photoresist all in one process chamber. In some embodiments, the apparatus includes one or more process chambers: one or more pressure regulating devices: one or more pumps fluidly coupled with the one or more pressure regulating devices: a plasma processing system: one or more gas inlets into the process chambers and associated flow-control hardware; and a controller having at least one processor and a memory, where the at least one processor and the memory are communicatively connected with one another, the at least one processor is at least operatively connected with the associated flow-control hardware, and the memory stores computer-executable instructions for controlling the at least one processor to at least control the associated flow-control hardware to: perform a thermal dry development in one of the process chambers; and perform a passivation in the same process chamber as the thermal dry development. In some embodiments, the thermal dry development is performed at a first pressure and the passivation is performed at a second pressure that is lower than the first pressure or the same as the first pressure.

In some embodiments, the apparatus also includes a photoresist thickness sensor module.

In some embodiments, the photoresist thickness sensor module is a spectral reflectometer.

In some embodiments, the apparatus also includes computer-executable instructions for controlling the at least one processor to at least control the associated flow-control hardware to: perform a plasma dry development, where the thermal dry development, the plasma dry development and the passivation are all performed in the same process chamber.

In some embodiments, the plasma dry development includes a cyclic plasma dry development, direct plasma dry development, remote plasma dry development or continuous plasma dry development.

In some embodiments, the plasma dry development includes continuous plasma dry development, and the continuous plasma dry development is performed at variable power, at constant power and pulsing bias or at variable power and pulsing bias.

In some embodiments, the passivation includes exposure to an oxygen-containing, nitrogen-containing, or hydrogen-containing plasma.

In some embodiments, the passivation includes a flash treatment with $O_2$, $O_3$, CO, $CO_2$, $H_2$, $C_xH_y$, $H_2O$, $H_2O_2$, $SO_2$, $NO_2$, $N_2O$, $NH_3$, or combinations thereof; and wherein x is an integer of 1 to 6 and y is an integer of 2 to 14.

In some embodiments, the second pressure is lower than the first pressure.

In some embodiments, the apparatus also includes computer-executable instructions for controlling the at least one processor to at least control the associated flow-control hardware to transition pressure in the same process chamber from the first pressure to the second pressure in ten seconds or less: return pressure in the same process chamber from the second pressure back to the first pressure after plasma dry development and passivation in twenty seconds or less; and maintain one or more process parameters uniformly.

In a third aspect, the present disclosure encompasses an apparatus for performing dry development, passivation and hardening of a metal-containing photoresist all in one process chamber. In some embodiments, the apparatus includes one or more process chambers: one or more pressure regulating devices: one or more pumps fluidly coupled with the one or more pressure regulating devices: one or more gas inlets into the process chambers and associated flow-control hardware: a plasma processing system; and a controller having at least one processor and a memory, wherein the at least one processor and the memory are communicatively connected with one another, the at least one processor is at least operatively connected with the associated flow-control hardware, and the memory stores computer-executable instructions for controlling the at least one processor to at least control the associated flow-control hardware to: perform dry development in one of the process chambers; and perform passivation and hardening in the same process chamber as the dry development. In some embodiments, the dry development includes both thermal dry development and plasma dry development. In some embodiments, the dry development is performed at a first pressure and the passivation and hardening are performed at a second pressure. In some embodiments, the second pressure is lower than the first pressure or the same as the first pressure.

In some embodiments, the apparatus also includes a photoresist thickness sensor module.

In some embodiments, the photoresist thickness sensor module is a spectral reflectometer.

In some embodiments, the hardening is performed by treatment with a plasma of inert gas, treatment with a plasma of an oxidizing gas, thermal treatment. UV light exposure, or a combination thereof.

In some embodiments, the passivation includes exposure to an oxygen-containing, nitrogen-containing, or hydrogen-containing plasma.

In some embodiments, the passivation includes a flash treatment with $O_2$, $O_3$, CO, $CO_2$, $H_2$, $C_xH_y$, $H_2O$, $H_2O_2$, $SO_2$, NO, $NO_2$, $N_2O$, $NH_3$, or combinations thereof; and wherein x is an integer of 1 to 6 and y is an integer of 2 to 14.

In some embodiments, the plasma dry development includes a cyclic plasma dry development, direct plasma dry development, remote plasma dry development or continuous plasma dry development.

In some embodiments, the plasma dry development includes continuous plasma dry development, and the continuous plasma dry development is performed at variable power, at constant power and pulsing bias or at variable power and pulsing bias.

In some embodiments, the apparatus also includes a UV exposure module.

In some embodiments, the second pressure is lower than the first pressure.

In some embodiments, the apparatus also includes computer-executable instructions for controlling the at least one processor to at least control the associated flow-control hardware to: transition pressure in the same process chamber from the first pressure to the second pressure in ten seconds or less: return pressure in the same process chamber from the second pressure back to the first pressure after plasma dry development and passivation in twenty seconds or less; and maintain one or more process parameters uniformly.

In a fourth aspect, the present disclosure encompasses a method for performing thermal dry development and plasma dry development all in one process chamber. In some embodiments, the method includes providing a metal-containing photoresist on a semiconductor substrate in a process chamber: thermally dry developing the metal-containing photoresist in the process chamber, and plasma dry developing the metal-containing photoresist in the process chamber.

In some embodiments, the thermally dry developing includes exposure to a first process gas and the plasma dry developing includes exposure to plasma of a second process gas different than the first process gas. In some embodiments, first process gas includes a halogen-containing gas and the second process gas includes an inert gas, a halogen-containing gas, or a combination thereof. In some embodiments, the first process gas includes a hydrogen halide.

In some embodiments, the thermally dry developing is performed at a first pressure and the plasma dry developing is performed at a second pressure that is different than the first pressure.

In some embodiments, the thermally dry developing and the plasma dry developing are performed in the process chamber at a temperature between about −20° C., and about 50° C.

In some embodiments, the thermally dry developing and the plasma dry developing are repeated alternatingly.

In some embodiments, the method further includes performing a dry developing post-process in the process chamber. In some embodiments, the dry developing post-process includes passivating the metal-containing photoresist in the process chamber. The passivating may include exposure to an oxygen-containing, nitrogen-containing, or hydrogen-containing plasma. Additionally or alternatively, the dry developing post-process includes hardening the metal-containing photoresist in the process chamber. The hardening may include treatment with plasma of an inert gas, treatment with a plasma of an oxidizing gas, thermal treatment, UV light exposure, or a combination thereof.

In a fifth aspect, the present disclosure encompasses an apparatus for performing thermal dry development and plasma dry development of a metal-containing photoresist all in one process chamber. In some embodiments, the apparatus includes one or more process chambers: one or more pressure regulating devices: one or more pumps fluidly coupled with the pressure regulating device: a plasma processing system: one or more gas inlets into the process chambers and associated flow-control hardware; and a controller having at least one processor and a memory, where the at least one processor and the memory are communicatively connected with one another, the at least one processor is at least operatively connected with the associated flow-control hardware, and the memory stores computer-executable instructions for controlling the at least one processor to at least control the associated flow-control hardware to: perform a thermal dry development in one of the process chambers; and perform a plasma dry development in the same process chamber as the thermal dry development.

These and other aspects are described further below with reference to the drawings.

DETAILED DESCRIPTION

Figure 1:
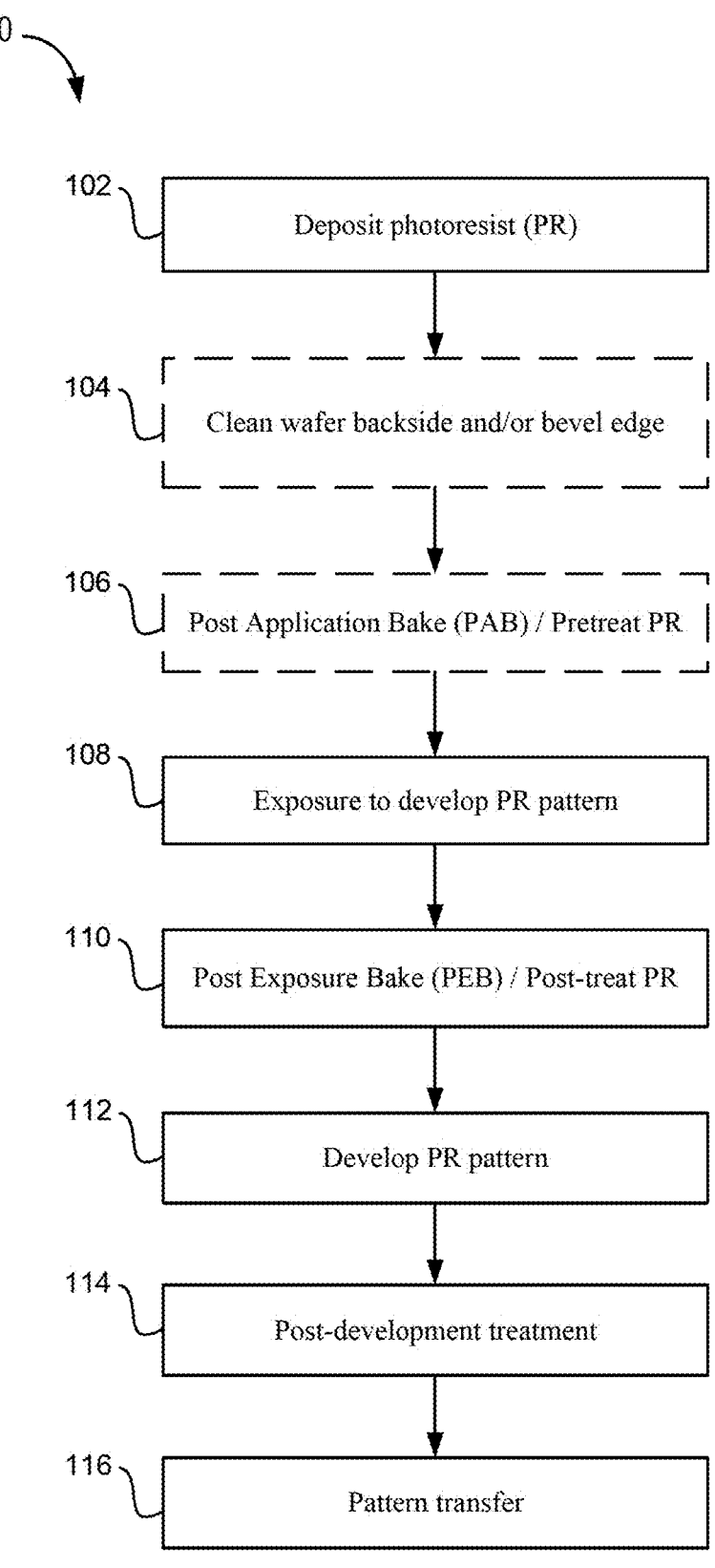
FIG. 1 presents a flow diagram of a process for depositing, developing, and treating a photoresist.

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Definitions

The term "flow control hardware" generally represents components configured to place one or more chemical sources in fluid connection with a processing chamber. Flow control hardware can comprise one or more mass flow controllers and/or valves, for example. Example chemical sources include dielectric film precursor sources, halogen-containing precursor sources, reactant gas sources, and inert gas sources.

The term "forming a gas mixture" generally represents either of or both of mixing a plurality of gases before introducing the plurality of gases into the processing chamber, or mixing a plurality of gases in the processing chamber.

The term "inert gas" generally represents a gas phase material that does not react with other chemicals in a processing chamber during substrate processing. Example inert gases include helium (He), neon (Ne), argon (Ar), krypton (Kr), and xenon (Xe), as well as nitrogen ($N_2$) in some processes.

The term "plasma" generally represents a gas comprising cations, free radicals and free electrons. The term "in-situ plasma" generally represents a plasma formed at a processing station in a processing chamber. The term "remote plasma" generally represents a plasma formed at a location away from a processing station in a processing chamber.

The term "plasma generator" generally represents a combination of components that can be used to form a plasma. Example components include a radiofrequency power source, an impedance matching network, and one or more electrodes.

The term "precursor" generally represents a chemical species that adsorbs to a substrate surface in an ALD process. The precursor is reacted with a reactant to convert the adsorbed precursor to a film layer.

The term "processing chamber" or "process chamber" generally represents an enclosure in which chemical and/or physical processes are performed on substrates. The pressure, substrate temperature and atmospheric composition within a processing chamber can be controllable to perform the chemical and/or physical processes.

The term "processing tool" may generally represent a machine comprising a processing chamber and other hardware configured to enable processing to be carried out in the processing chamber.

The term "processing station" generally represents a location in a processing chamber at which a substrate is positioned during processing.

The term "reactant" generally represents a chemical species that reacts with a precursor adsorbed to a substrate surface to form a film layer in an ALD process. A reaction between a reactant and a precursor can be facilitated by thermal energy and/or a plasma in various processes.

The term "semiconductor substrate" as used herein refers to a substrate at any stage of semiconductor device fabrication containing a semiconductor material anywhere within its structure. It is understood that the semiconductor material in the semiconductor substrate does not need to be exposed. Semiconductor wafers having a plurality of layers of other materials (e.g., dielectrics) covering the semiconductor material, are examples of semiconductor substrates. The following detailed description assumes the disclosed implementations are implemented on a semiconductor wafer, such as on a 200 mm, 300 mm, or 450 mm semiconductor wafer. However, the disclosed implementations are not so limited. The work piece may be of various shapes, sizes, and materials. In addition to semiconductor wafers, other work pieces that may take advantage of the disclosed implementations include various articles such as printed circuit boards and the like.

The implementations disclosed below describe deposition of a material on a substrate such as a wafer, substrate, or other work piece. The work piece may be of various shapes, sizes, and materials. In this application, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry typically has a diameter of 200 mm, or 300 mm, or 450 mm. Unless otherwise stated, the processing details recited herein (e.g., flow rates, power levels, etc.) are relevant for processing 300 mm diameter substrates, or for treating chambers that are configured to process 300 mm diameter substrates and can be scaled as appropriate for substrates or chambers of other sizes. In addition to semiconductor wafers, other work pieces that may be used implementations disclosed herein include various articles such as printed circuit boards and the like. The processes and apparatuses can be used in the fabrication of semiconductor devices, displays. LEDs, photovoltaic panels and the like.

As used herein, the term "photoresist" and derivatives thereof refer to a light-sensitive material used in processes such as photolithography, photoetching or photoengraving to form a patterned coating on a surface. Photoresist materials change solubility with respect to a developer solution when exposed to certain wavelengths of light. Photoresist layers may be composed of positive (exposed region becomes soluble) or negative (exposed region becomes insoluble) photoresist material.

For the purposes of this disclosure, "metal" used in this context should be understood to mean conductor with a maximum resistivity of 500 micro Ohm cm, including metals and conductive metal salts, in particular conductive metal nitrides, e.g., TiN.

As used herein, "metal-containing photoresist" includes, but is not limited to a metal photoresist, a metalloid photoresist, a metal oxide photoresist or an organometal oxide photoresist.

"Tin oxide" is referred to herein as including any and all stoichiometric possibilities for SnxOy, including integer values of x and y and non-integer values of x and y. For example, "tin oxide" includes compounds having the formula SnOn, where $1 \leq n \leq 2$, where n can be an integer or non-integer values. "Tin oxide" can include sub-stoichiometric compounds such as $SnO_{1.8}$, "Tin oxide" also includes tin dioxide ($SnO_2$ or stannic oxide) and tin monoxide (SnO or stannous oxide). "Tin oxide" also includes both natural and synthetic variations and also includes any and all crystalline and molecular structures. "Tin oxide" also includes amorphous tin oxide.

As used herein, the phrase "at least one of A, B, and C" should be construed to mean a logical (A or B or C), using a non-exclusive logical "or", and should not be construed to mean "at least one of A, at least one of B and at least one of C".

As used herein, the term "about" is understood to account for minor increases and/or decreases beyond a recited value, which changes do not significantly impact the desired function of the parameter beyond the recited value(s). In some cases, "about" encompasses+/−10% of any recited value. As used herein, this term modifies any recited value, range of values, or endpoints of one or more ranges.

As used herein, the terms "top," "bottom," "upper," "lower," "above," and "below" are used to provide a relative relationship between structures. The use of these terms does not indicate or require that a particular structure must be located at a particular location in the apparatus.

Introduction and Context

This disclosure relates generally to the field of semiconductor processing. In particular, this disclosure is directed to development of photoresists including metal-containing photoresists. Such metal and/or metal oxide-containing photoresists may undergo one or both of thermal dry development and plasma dry development. Such metal and/or metal oxide-containing photoresists may undergo treatment to change the chemical, physical, and/or optical properties of the photoresist after development and prior to pattern transfer. A treatment of the photoresist enhances the performance of the photoresist. For instance, the photoresist treatment can reduce dose-to-size (DtS), reduce LWR, increase line CD, improve etch resistance, increase throughput, reduce outgassing of tin or other elements, and/or reduce defects/line breaks. Throughput may be increased by at least about 40%, 50%, about 60%, about 70%, about 80% or about 90%.

Patterning of thin films in semiconductor processing is often an important step in the fabrication of semiconductors. Patterning involves lithography. In conventional photolithography, such as 193 nm photolithography, patterns are printed onto a photosensitive photoresist film by exposing the photoresist to photons in selective areas defined by a photomask, thereby causing a chemical reaction in the exposed photoresist and creating a chemical contrast that can be leveraged in the development step to remove certain portions of the photoresist to form the pattern. The patterned and developed photoresist film then can be used as an etch mask to transfer the pattern into underlying films that are composed of metal, oxide, etc.

Advanced technology nodes (as defined by the International Technology Roadmap for Semiconductors) include nodes 22 nm. 16 nm, and beyond. In the 16 nm node, for example, the width of a via or line in a Damascene structure is typically no greater than about 30 nm. Scaling of features on advanced semiconductor integrated circuits (ICs) and other devices is driving lithography to improve resolution.

Extreme ultraviolet (EUV) lithography can extend lithography technology by moving to smaller imaging source wavelengths than would be achievable with conventional photolithography methods. EUV light sources at approximately 10-20 nm, or 11-14 nm wavelength, for example 13.5 nm wavelength, can be used for leading-edge lithography tools, also referred to as scanners. The EUV radiation is strongly absorbed in a wide range of solid and fluid materials including quartz and water vapor, and so operates in a vacuum.

EUV lithography makes use of EUV resists that are patterned to form masks for use in etching underlying layers. EUV resists may be polymer-based chemically amplified resists (CARs) produced by liquid-based spin-on techniques. An alternative to CARs is directly photopatternable metal oxide-containing films, such as those available from Inpria Corp. (Corvallis, OR), and described, for example, in U.S. Pat Pub. Nos. US 2017/0102612, US 2016/0216606, and US 2016/0116839, incorporated by reference herein at least for their disclosure of photopatternable metal oxide-containing films. Such films may be produced by spin-on techniques or dry vapor-deposited. The metal oxide-containing film can be patterned directly (i.e., without the use of a separate photoresist) by EUV exposure in a vacuum ambient providing sub-30 nm patterning resolution, for example as described in U.S. Pat. No. 9,996,004, issued Jun. 12, 2018 and titled EUV PHOTOPATTERNING OF VAPOR-DEPOSITED METAL OXIDE-CONTAINING HARDMASKS, and/or in International Appl. No. PCT/US19/31618, published as International Pub. No. WO 2019/217749, filed May 9, 2019, and titled METHODS FOR MAKING EUV PATTERNABLE HARD MASKS, the disclosures of which at least relating to the composition, deposition, and patterning of directly photo-patternable metal oxide films to form EUV resist masks is incorporated by reference herein. Generally, the patterning involves exposure of the EUV resist with EUV radiation to form a photo pattern in the resist, followed by development to remove a portion of the resist according to the photo pattern to form the mask.

Directly photo-patternable EUV or DUV resists may be composed of or contain metals and/or metal oxides mixed within organic components. The metals/metal oxides can enhance the EUV or DUV photon adsorption, generate secondary electrons, and/or show increased etch selectivity to an underlying film stack and device layers. These resists can be developed using a wet (solvent) approach, which requires the wafer to move to the track, where it is exposed to developing solvent, dried, and then baked. Such resists may also be developed using a dry approach or a combination of wet and dry approaches, as described herein.

Generally, resists can be employed as a positive tone resist or a negative tone resist by controlling the chemistry of the resist and/or the solubility or reactivity of the developer. It would be beneficial to have a EUV or DUV resist that can serve as either a negative tone resist or a positive tone resist.

While the following may describe techniques as relating to EUV processes, such techniques may also be applicable to other next generation lithographic techniques. Various radiation sources may be employed, including EUV (generally about 13.5 nm), DUV (deep-UV, generally in the 248 nm or 193 nm range with excimer laser sources), X-ray (including EUV at the lower energy range of the X-ray range), and e-beam (including a wide energy range).

FIG. 1 presents a flow diagram of the steps of a conventional method for depositing, developing, and treating a photoresist. Though the patterning process flow often refers to an EUV-sensitive resist in FIG. 1, it will be understood that the process flow is not limited to an EUV resist. The EUV resist may be a resist that is sensitive to EUV radiation. The operations of a process 100 may be performed in different orders and/or with different, fewer, or additional operations. In some implementations, the operations of the process 100 may be implemented, at least in part, according to software stored in one or more non-transitory computer readable media.

At block 102 of the process 100, a layer of photoresist is deposited. This may be either a dry deposition process such as a vapor deposition process or a wet deposition process such as a spin-on deposition process. In one embodiment, a metal-containing precursor is deposited as a solution by using a liquid-based spin-on technique. In another embodiment, a metal-containing precursor is deposited in vapor form by using a dry technique (e.g., chemical vapor deposition).

A photoresist film can be deposited on a substrate. Such a film can be deposited by using wet or dry deposition processes, in which a metal-containing precursor (e.g., a tin-containing precursor, such as any described herein) is provided in proximity to a substrate. In one embodiment, the metal-containing precursor is deposited as a solution by using a liquid-based spin-on technique. In another embodiment, the metal-containing precursor is deposited in vapor form by using a dry technique (e.g., chemical vapor deposition). While the present disclosure often shows the metal-containing precursor being a tin-containing precursor, other metal atoms can be employed.

The layers and films described herein may include an element (e.g., a metal atom or a non-metal atom) having a high photoabsorption cross-section, such as equal to or greater than $1 \times 10^7$ cm²/mol. Such elements can be provided by depositing one or more precursor(s) to provide the imaging layer.

In some embodiments, the film is a radiation-sensitive film (e.g., an EUV-sensitive film). This film, in turn, can serve as an EUV resist, as further described herein. In particular embodiments, the layer or film can include one or more ligands (e.g., EUV labile ligands) that can be removed, cleaved, or cross-linked by radiation (e.g., EUV or DUV radiation).

The precursor can provide a patternable film that is sensitive to radiation (or a patterning radiation-sensitive film or a photopatternable film). Such radiation can include EUV radiation, DUV radiation, or UV radiation that is provided by irradiating through a patterned mask, thereby being a patterned radiation. The film itself can be altered by being exposed to such radiation, such that the film is radiation-sensitive or photosensitive. In particular embodiments, the precursor is an organometallic compound, which includes at least one metal center.

The precursor can have any useful number and type of ligand(s). In some embodiments, the ligand can be characterized by its ability to react in the presence of a counter-reactant, or in the presence of patterned radiation. For instance, the precursor can include a ligand that reacts with a counter-reactant, which can introduce linkages between metal centers (e.g., an —O-linkage). In another instance, the precursor can include a ligand that eliminates in the presence of patterned radiation.

The precursor may include a metal or a metalloid or an atom with a high patterning radiation-absorption cross-section (e.g., an EUV absorption cross-section that is equal to or greater than $1 \times 10^7$ cm²/mol). In some embodiments, M is tin (Sn), bismuth (Bi), tellurium (Te), cesium (Cs), antimony (Sb), indium (In), molybdenum (Mo), hafnium (Hf), iodine (I), zirconium (Zr), iron (Fe), cobalt (Co), nickel (Ni), copper (Cu), zinc (Zn), silver (Ag), platinum (Pt), and lead (Pb).

In particular embodiments, the precursor includes tin. Non-limiting tin precursors include $SnF_2$, $SnH_4$, $SnBr_4$, $SnCl_4$, $SnI_4$, tetramethyl tin ($SnMe_4$), tetraethyl tin ($SnEt_4$), trimethyl tin chloride ($SnMe_3Cl$), dimethyl tin dichloride ($SnMe_2Cl_2$), methyl tin trichloride ($SnMeCl_3$), tetraallyltin, tetravinyl tin, hexaphenyl ditin (IV) ($PhsSn-SnPh_3$, in which Ph is phenyl), dibutyldiphenyltin ($SnBuzPh_2$), trimethyl (phenyl) tin ($SnMe_3Ph$), trimethyl(phenylethynyl) tin, tricyclohexyl tin hydride, tributyl tin hydride ($SnBu_3H$), dibutyltin diacetate ($SnBu_2(CH_3COO)_2$), tin (II) acetylacetonate ($Sn(acac)_2$), tributyltin ethoxide ($SnBu_3(OEt)$), dibutyltin dimethoxide ($SnBu_2(OMe)_2$), tributyltin methoxide ($SnBu_3 (OMe)$), tin(IV)tert-butoxide ($Sn(t-BuO)_4$), n-butyltin tributoxide ($Sn(n-Bu)(t-BuO)_3$), tetrakis(dimethylamino)tin ($Sn (NMe_2)_4$), tetrakis(ethylmethylamino) tin($Sn(NMeEt)_4$), tetrakis(diethylamino)tin (IV) ($Sn(NEt_2)_4$). (dimethylamino)trimethyl tin (IV) ($Sn(Me)_3(NMe_2)$, $Sn(i-Pr)(NMe_2)_3$, $Sn(n-Bu)(NMe_2)_3$, $Sn(s-Bu)(NMe_2)$, $Sn(i-Bu)(NMe_2)$; $Sn(t-Bu)(NMe_2)_3$, $Sn(t-Bu)_2(NMe_2)_2$, $Sn(t-Bu)(NEt_2)$; Sn(tbba), Sn(II) (1,3-bis(1,1-dimethylethyl)-4,5-dimethyl-(4R,5R)-1, 3,2-diazastannolidin-2-ylidene), or bis[bis(trimethylsilyl) amino]tin ($Sn[N(SiMe_3)_2]_2$).

Exemplary deposition techniques (e.g., for a film) include any described herein, such as ALD (e.g., thermal ALD and plasma-enhanced ALD), spin-coat deposition. PVD including PVD co-sputtering. CVD (e.g., PE-CVD or LP-CVD), sputter deposition, e-beam deposition including e-beam co-evaporation, etc., or a combination thereof, such as ALD with a CVD component, such as a discontinuous. ALD-like process in which precursors and counter-reactants are separated in either time or space.

Further description of precursors and methods for their deposition as EUV photoresist films applicable to this disclosure may be found in International Application No. PCT/US19/31618, published as International Publication No. WO 2019/217749, filed May 9, 2019, and titled METHODS FOR MAKING EUV PATTERNABLE HARD MASKS. The thin films may include optional materials in addition to a precursor and a counter-reactant to modify the chemical or physical properties of the film, such as to modify the sensitivity of the film to EUV or enhancing etch resistance. Such optional materials may be introduced, such as by doping during vapor phase formation prior to deposition on the substrate, during deposition on the substrate, and/or after deposition of the film. In some embodiments, a gentle remote $H_2$ plasma may be introduced so as to replace some Sn-L bonds with Sn—H, for example, which can increase reactivity of the resist under EUV. In other embodiments, $CO_2$ may be introduced to replace some Sn—O bonds with Sn—CO; bonds, which can be more resistant to wet development.

Various atoms present in the precursor and/or counter-reactant can be provided within a capping layer, which in turn is disposed on any useful layer or structure. The capping layer can be any useful thickness (e.g., any thickness described herein, including from about 0.1 nm to about 5 nm).

Furthermore, two or more different precursors can be employed within each layer (e.g., a film or a capping layer). For instance, two or more of any metal-containing precursors herein can be employed to form an alloy. Yet other exemplary EUV-sensitive materials, as well as processing methods and apparatuses, are described in U.S. Pat. No. 9,996,004: International Patent Publication No. WO 2020/

102085; and International Patent Publication No. WO 2019/217749, each of which is incorporated herein by reference in its entirety.

In some embodiments, the photoresist film may be deposited on an underlayer. In some embodiments, the underlayer may be deposited over a hard mask such as an ashable hard mark (AHM). The underlayer is configured to increase adhesion between the subsequently-formed EUV resist and the substrate. The underlayer is also configured to reduce EUV dose for effective EUV exposure of the EUV resist. The underlayer may include a vapor-deposited film of hydronated carbon doped with a non-carbon heteroatom such as oxygen (O), silicon (Si), nitrogen (N), tungsten (W), boron (B), iodine (I), chlorine (Cl), or a combination thereof. For example, an underlayer comprising a hydronated carbon film doped with iodine may improve generation of secondary electrons in the EUV resist upon exposure to EUV radiation. The underlayer may have a thickness equal to or less than about 25 nm, such as a thickness between about 2 nm and about 20 nm. In some implementations, the underlayer may be deposited using a vapor deposition technique such as PECVD or ALD.

At block 104 of the process 100, the backside surface or bevel of the substrate can be optionally cleaned, and/or an edge bead of the photoresist that was deposited in the prior step can be removed. Such cleaning or removing steps can be useful for removing particles that may be present after depositing a photoresist layer. The removing step can include processing the wafer with a wet metal oxide (MeOx) edge bead removal (EBR) step.

At block 106 of the process 100, a post-application bake (PAB) or a post-application treatment can be optionally performed. Such treatment can improve etch resistance of unexposed material to aqueous or non-aqueous solution. In one instance, such treatment can enhance the chemical composition difference (or contrast) between unexposed and exposed regions, thus the PAB operation is conducted. In another instance, such treatment can reduce the chemical composition difference (or contrast) between unexposed and exposed regions, thus the PAB operation is not conducted. In yet another instance, use of PAB removes residual moisture from the layer to form a hardened resist film. The PAB can involve some combination of thermal treatment, chemical exposure, and/or moisture to increase the EUV sensitivity of the film, thereby reducing the EUV dose to develop a pattern in the film. In particular embodiments, the PAB step is conducted at a temperature greater than about 100° C., or at a temperature of from about 100° C., to about 200° C., or from about 100° C., to about 250° C. In other embodiments, the PAB step is conducted at a temperature from about 190° C., to about 350° C., in the absence of an O-containing gas. In another instance, post-application treatment includes exposing the film to an inert gas or $CO_2$, which can optionally include cooling or heating. Use of an inert gas can provide metal-oxygen-metal species, and use of $CO_2$ can provide metal carbonate species within the film.

At block 108 of the process 100, the film is exposed to EUV radiation to develop a pattern. Generally, the EUV exposure causes a change in the chemical composition of the film, creating a contrast in etch selectivity that can be used to remove a portion of the film. Such a contrast can provide a positive tone resist. However, it will be understood that the EUV exposure can alternatively cause a contrast such that unexposed regions (or less exposed regions) are selectively removed. Such a contrast can provide a negative tone resist, as described herein. More exposed areas of the photoresist are created through photo patterning that have altered physical or chemical properties relative to less exposed areas. The difference in properties between more exposed and less exposed areas may be exploited in subsequent processing. EUV exposure can include. e.g., an exposure having a wavelength in the range of about 10 nm to about 20 nm in a vacuum ambient (e.g., about 13.5 nm in a vacuum ambient).

At block 110 of the process 100, a post-exposure bake (PEB) is performed on the exposed film, thereby further removing residual moisture, promoting chemical condensation within the film, or increasing contrast in etch selectivity of the exposed film; or post-treating the film in any useful manner. In one instance, such treatment can reduce the chemical composition difference (or contrast) between unexposed and exposed regions, thus the PEB operation is not conducted. In another instance, the exposed film can be thermally treated (e.g., at a low temperature and/or optionally in the presence of various chemical species) to promote reactivity within the EUV exposed or unexposed portions of the resist upon exposure to a stripping agent or a positive tone developer (e.g., a halide-based aqueous acid, such as HCl, HBr, HI, or combinations thereof). In another instance, the exposed film can be thermally treated (e.g., at a low temperature) to further cross-link ligands within the EUV unexposed portions of the resist, thereby providing EUV exposed portions that can be selectively removed upon exposure to a stripping agent (e.g., a positive tone developer). In yet another instance. PEB is omitted.

At block 112 of the process 100, the photoresist pattern is developed by way of positive tone development or negative tone development. In various embodiments of development, the unexposed regions are selectively removed (to provide a pattern within a negative tone resist). These steps may be wet processes using one or more developers or developing solutions, followed by an optional rinse operation (e.g., with deionized water or another solvent) or an optional dry operation (e.g., with air or under inert conditions with optional heat). In particular embodiments, the development step is a wet process. In other embodiments, the development step is a dry process. For example, the dry process includes a halide-containing chemistry.

A dry development process may include a thermal (plasma-free) dry development process, a plasma dry development process, or a combination of a thermal dry development process and a plasma dry development process. In some embodiments, the dry development gas can include a halide-containing chemistry such as a hydrogen halide. Accordingly, development chemistries may include a hydrogen halide (e.g., HBr, HCl, etc.), hydrogen and halogen gas (e.g., $H_2$ and $Cl_2$, $H_2$ and $Br_2$, etc.), boron trichloride, an organic halide, an acyl halide, a carbonyl halide, a thionyl halide, or mixtures thereof. An organic halide can include but is not limited to $C_xH_yF_z$, $C_xH_yCl_z$, $C_xH_yBr_z$, and $C_xH_yI_z$, where x, y, and z are values equal to or greater than 0. An acyl halide can include but is not limited to $CH_3COF$, $CH_3COCl$, $CH_3COBr$, and $CH_3COI$. A carbonyl halide can include but is not limited to $COF_2$, $COCl_2$, $COBr_2$, and $COI_2$. A thionyl halide can include but is not limited to $SOF_2$, $SOCl_2$, $SoBr_2$, and $SOI_2$. In some embodiments, the dry development gas may be flowed with or without inert/carrier gas such as He, Ne, Ar, Xe, and $N_2$. In some embodiments, the dry development can involve a thermal process, a plasma process, or a combination of a thermal process and a plasma process. Parameters such as chamber pressure, gas flow rates, substrate temperature, and duration of exposure may be tuned. In some embodiments, a chamber pressure may be between about 5 mTorr and about 760) Torr.

In some embodiments, a substrate temperature may be between about −60° C., and about 300° C. In some embodiments where plasma is applied, the RF levels may be tuned at RF power levels equal to or less than about 1000 W. Selection of the development method along with optimization of the development parameters may influence development selectivity, roughness, descumming, and other characteristics of development.

After block 112, an after-development inspection may be performed. If needed, rework is performed by returning to repeat operation 102.

At block 114 of the process 100, the photoresist undergoes treatment prior to pattern transfer. The treatment may be a thermal treatment, plasma treatment, chemical treatment, selective deposition treatment, or a combination of the aforementioned treatments. Thermal treatment may expose the photoresist to an elevated temperature between about 200° C., and about 300° C., to reduce defectivity and LWR. Plasma treatment may expose the photoresist to plasma such as a direct (in-situ) plasma or remote plasma in order to densify the photoresist and reduce LWR. In some embodiments, the plasma treatment may include passivation. Passivation may include a flash treatment that involves exposure to an oxygen-containing plasma, nitrogen-containing plasma, or hydrogen-containing plasma. In some embodiments, the plasma treatment may include hardening. Hardening may include exposure to plasma of an inert gas and/or exposure to UV light. Chemical treatment may expose the photoresist to reactive chemical species such as halide-based species (e.g., tungsten hexafluoride) or carbon-containing precursor (e.g., carbon monoxide, metal organic precursors) to improve etch resistance, reduce outgassing, and increase line CD. Selective deposition treatment may expose the photoresist to chemical precursors for selectively depositing a protective coating on the photoresist to reduce DtS, improve etch resistance, reduce outgassing, and increase line CD. Any one or more of the foregoing treatments are applied to the photoresist after development to improve the performance of the photoresist during pattern transfer.

At block 116 of the process 100, one or more substrate layers are etched using the photoresist mask for pattern transfer. Such substrate layers are underlying the photoresist mask and may be removable by lithographic etching. Pattern transfer etching may etch material to a desired depth to form a plurality of patterned features. In some embodiments, the one or more substrate layers may include amorphous carbon (a-C), amorphous silicon (a-Si), tin oxide (e.g., $SnO_x$), silicon oxide (e.g., $SiO_2$), silicon oxynitride (e.g., $SiO_xN_y$), silicon oxycarbide (e.g., $SiO_xC_y$), silicon nitride (e.g., $Si_3N_4$), titanium oxide (e.g., $TiO_2$), titanium nitride (e.g., TiN), tungsten (e.g., W), doped carbon (e.g., W-doped C), tungsten oxide (e.g., $WO_x$), hafnium oxide (e.g., $HfO_2$), zirconium oxide (e.g., $ZrO_2$), and aluminum oxide (e.g., $Al_2O_3$). Any defects or variations in CD in the photoresist mask are replicated in the material being patterned during pattern transfer etching. Additionally, poor etch resistance adversely impacts transfer of patterns to underlying substrate layers over the course of etching. Post-development treatment of the photoresist mask mitigates the foregoing issues to ensure successful pattern transfer during pattern transfer etching.

After pattern transfer, an after etch inspection may be performed. If needed, rework is performed by returning to repeat operation 102.

Figure 2A:
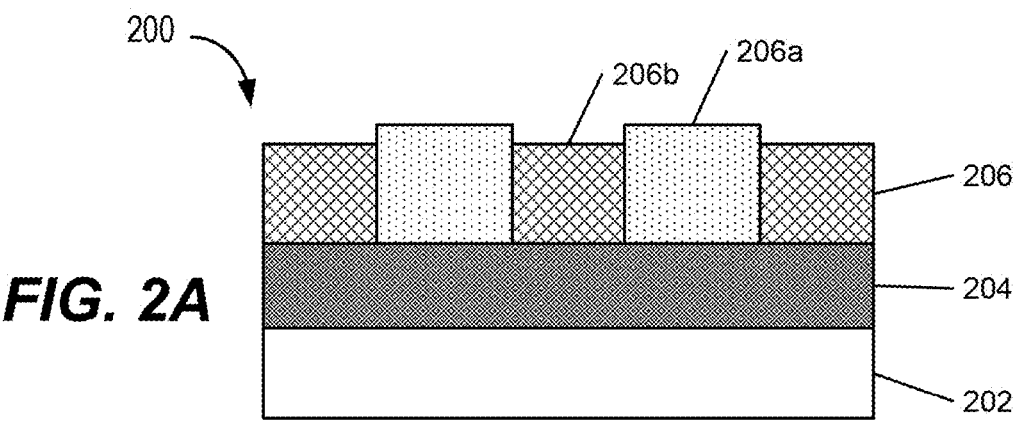
FIGS. 2A-2C are cross-sectional schematic illustrations of various processing stages including development and treatment of a photoresist.
Figure 2B:
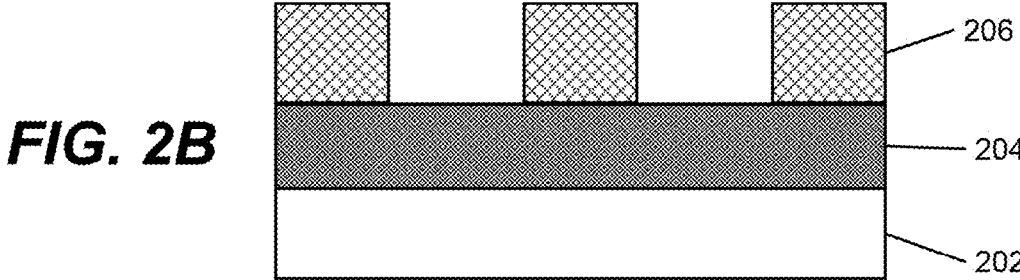
Figure 2C:
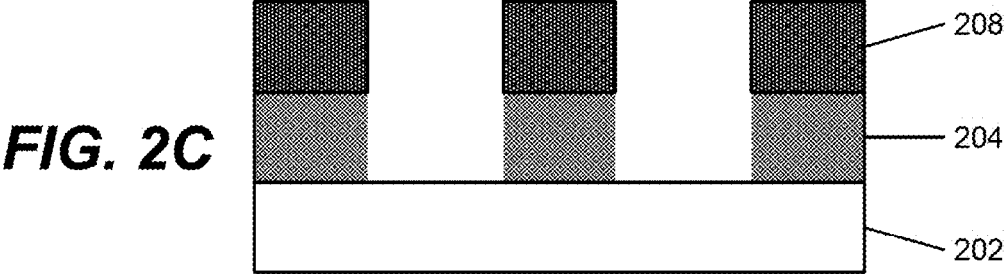

FIGS. 2A-2C show cross-sectional schematic illustrations providing an overview of the various processing stages including development and treatment of photoresist. As shown in FIG. 2A, a wafer 200 includes a substrate 202 and a substrate layer 204 to be etched. The patterning structure can include any useful substrate. For instance, an incoming wafer can be prepared with a substrate surface of a desired material, with the uppermost material being the layer into which the resist pattern is transferred. While the material selection may vary depending on integration, it is generally desired to select a material which can be etched with high selectivity to (i.e., much faster than) the EUV resist or imaging layer.

In some embodiments, the substrate is a hardmask, which is used in lithographic etching of an underlying semiconductor material. The hardmask may comprise any of a variety of materials, including amorphous carbon (a-C), tin oxide (e.g., $SnO_x$), silicon oxide (e.g., $SiO_x$, including $SiO_2$), silicon oxynitride (e.g., $SiO_xN_y$), silicon oxycarbide (e.g., $SiO_xC_y$), silicon nitride (e.g., $Si_3N_4$), titanium oxide (e.g., $TiO_2$), titanium nitride (e.g., TiN), tungsten (e.g., W), doped carbon (e.g., W-doped C), tungsten oxide (e.g., $WO_x$), hafnium oxide (e.g., $HfO_2$), zirconium oxide (e.g., $ZrO_2$), and aluminum oxide (e.g., $Al_2O_3$). Suitable substrate materials can include various carbon-based films (e.g., ashable hardmask (AHM), silicon-based films (e.g., $SiO_x$, $SiC_x$, $SiO_xC_y$, $SiO_xN_y$, $SiO_xC_yN_z$), a-Si:H, poly-Si, or SiN), or any other (generally sacrificial) film applied to facilitate the patterning process). For example, the substrate may preferably comprise $SnO_x$, such as $SnO_2$. In various embodiments, the layer may be from 1 nm to 100 nm thick, or from 2 nm to 10 nm thick.

In some embodiments, the substrate layer 204 includes an ashable hard mask such as amorphous carbon, spin-on carbon, or other material. e.g., silicon, silicon oxide, silicon nitride, silicon carbide, etc. In some embodiments, the substrate layer 204 may be a layer stack disposed on the substrate 202. The wafer 200 further includes a photopatterned metal-containing EUV resist film 206. For example, the photopatterned metal-containing EUV resist film 206 may be an organometal-containing layer disposed on the substrate layer 204 to be etched. The photopatterned metal-containing EUV resist film 206 may have a thickness between about 5 nm and about 50 nm or between about 10 nm and about 30 nm. The photopatterned metal-containing EUV resist film 206 may be provided in a process chamber after photopatterning in an EUV scanner and/or after a PEB treatment. The photopatterned metal-containing EUV resist film 306 includes non-EUV exposed regions 206a and EUV exposed regions 206b.

As shown in FIG. 2B, the non-EUV exposed regions 206a of the photopatterned metal-containing EUV resist film 206 is removed in a development process. The development may use a wet development chemistry or dry development chemistry. Where dry development chemistry is applied, the dry development may proceed with or without striking a plasma. In some implementations, the dry development chemistry may include a halide-containing chemistry. A photoresist mask of the photopatterned metal-containing EUV resist film 206 is formed after development by removal of the non-EUV exposed regions 206a. Though FIGS. 2A-2C depict negative tone development, it will be understood that positive tone development may alternatively be applied in the present disclosure.

As shown in FIG. 2C, the substrate layer 204 is etched using the photoresist mask 208 to form recessed features in the wafer 200 defined by the photoresist mask 208. The wafer 200 undergoes pattern transfer etching so that an etchant selectively removes the substrate layer 204 relative to the chemically modified photoresist mask 208. Pattern transfer etching may be performed with dry etching or wet etching. For example, dry etching may utilize a fluorine-based plasma etch process or oxygen-based plasma etch process. Pattern transfer etching may etch through the substrate layer 204 according to a pattern defined by the photoresist mask 208. In some embodiments, the photoresist mask 208 preserves or at least substantially preserves the increased line CD after pattern transfer etching.

Returning to FIG. 1, various steps of the process 100 are conventionally conducted in separate chambers, involving wafer transfer from one process chamber to the next process chamber for subsequent operations. For instance, steps of the process 100 such as represented by block 112 for development and block 114 for post-development treatment are conventionally conducted in separate chambers. Dry development may be performed in a dry development chamber (e.g., thermal dry development chamber). A post-development treatment of post-development bake may be performed in a bake chamber. Optionally, a subsequent post-development treatment of line hardening may be performed in a UV chamber. This can lead to longer queue times between dry development and post-dry development treatment(s). In some instances, this may potentially cause contamination to a wafer backside due to outgassing. To improve upon efficiency and throughput of the process, and to limit potential sources of contamination, the number of steps and/or chambers for the various operations can be reduced by the methods disclosed herein.

In particular, the efficiency of the conventional process 100 as shown in FIG. 1 can be improved by performing the step represented by block 112 along with post-development treatment in the same process chamber in a manner that eliminates the need for a separate chamber. Specifically, the efficiency of the process 100 as shown in FIG. 1 can be improved by performing development along with passivation or passivation and hardening in the same process chamber in a manner that eliminates the need for a separate post-development bake in a separate chamber.

The present disclosure relates to all-in-one dry development of photoresist. Dry development processes may be performed in the same process chamber. Dry development processes and post-dry development processes may be performed in the same process chamber. A metal or metal oxide-containing photoresist may be wet or dry deposited. The metal or metal oxide-containing photoresist may have high absorption of EUV radiation so that the photoresist may be patterned by EUV exposure to form exposed and unexposed regions. After dry development selectively removes exposed or unexposed regions of the photopatterned metal or metal oxide-containing photoresist, the post-developed photoresist may be treated. Such treatment may include one or more of the following operations: (i) thermal annealing. (ii) plasma exposure. (iii) reactive gas exposure, and (iv) selective deposition of protective layer. Such treatment may achieve one or more of the following advantages: reduced defectivity, reduced LWR, reduced DtS, reduced outgassing (e.g., tin outgassing), increased etch resistance, and increased line CD, thereby improving performance of the metal or metal oxide-containing photoresist during etch.

Reference is made herein in detail to specific embodiments of the disclosure. Examples of the specific embodiments are illustrated in the accompanying drawings. While the disclosure will be described in conjunction with these specific embodiments, it will be understood that it is not intended to limit the disclosure to such specific embodiments. On the contrary, it is intended to cover alternatives, modifications, and equivalents as may be included within the spirit and scope of the disclosure. In the following description, numerous specific details are set forth in order to provide a thorough understanding of the present disclosure. The present disclosure may be practiced without some or all of these specific details. In other instances, well known process operations have not been described in detail so as to not unnecessarily obscure the present disclosure.

As discussed above, the present disclosure provides methods for films on semiconductor substrates, which may be patterned using EUV or other next generation lithographic techniques. Methods include those where polymerized organometallic materials are produced in a vapor and deposited on a substrate. In some embodiments, dry deposition can employ any useful precursor (e.g., metal halides, capping agents, or organometallic agents described herein). In other embodiments, a spin-on formulation may be used. Deposition processes can include applying a EUV-sensitive material as a resist film or an EUV-sensitive film.

Such EUV-sensitive films comprise materials which, upon exposure to EUV, undergo changes, such as the loss of bulky pendant ligands bonded to metal atoms. If the unexposed region includes a dense M-O-M rich material, then EUV induced cleavage can provide intermediates that are more readily removed by positive tone developers.

Through EUV patterning, areas of the film are created that have altered physical or chemical properties relative to unexposed regions. These properties may be exploited in subsequent processing, such as to dissolve either unexposed or exposed regions or to selectively deposit materials on either the exposed or unexposed regions. In some embodiments, the unexposed film has a hydrophobic surface, and the exposed film has a hydrophilic surface (it being recognized that the hydrophilic properties of exposed and unexposed regions are relative to one another) under the conditions at which such subsequent processing is performed. For example, the removal of material may be performed by leveraging differences in chemical composition, density, and cross-linking of the film. Removal may be by wet processing or dry processing, as further described herein.

The thickness of the EUV-patternable film formed on the surface of the substrate may vary according to the surface characteristics, materials used, and processing conditions. In various embodiments, the film thickness may range from about 0.5 nm to about 100 nm. Preferably, the film has a sufficient thickness to absorb most of the EUV light under the conditions of EUV patterning. For example, the overall absorption of the resist film may be 30% or less (e.g., 10% or less, or 5% or less), so that the resist material at the bottom of the resist film is sufficiently exposed. In some embodiments, the film thickness is from 10 nm to 20 nm. Without limiting the mechanism, function, or utility of the present disclosure, it is believed that the processes of the present disclosure can be applied to a wide variety of substrates. Moreover, as discussed above, the deposited films may closely conform to surface features, providing advantages in forming masks over substrates, such as substrates having underlying features, without "filling in" or otherwise planarizing such features.

The film may be composed of a metal oxide layer deposited in any useful manner. Such a metal oxide layer can be deposited or applied by using any EUV-sensitive material described herein, such as a precursor (e.g., metal-containing precursor, a metal halide, a capping agent, or an organometallic agent) in combination with a counter-reactant. In exemplary processes, a polymerized organometallic material is formed in vapor phase or in-situ on the surface of the substrate in order to provide the metal oxide layer. The metal oxide layer may be employed as a film, an adhesion layer, or a capping layer.

In general, methods can include mixing a vapor stream of a precursor (e.g., a metal-containing precursor, such as an organometallic agent) with an optional vapor stream of a counter-reactant so as to form a polymerized organometallic material, and depositing the organometallic material onto the surface of the semiconductor substrate. In some embodiments, mixing the precursor and optional counter-reactant can form a polymerized organometallic material. As will be understood by one of ordinary skill in the art, the mixing and depositing aspects of the process may be concurrent, in a substantially continuous process.

In an exemplary continuous CVD process, two or more gas streams, in separate inlet paths, of sources of precursor and optional counter-reactant are introduced to the deposition chamber of a CVD apparatus, where they mix and react in the gas phase, to form agglomerated polymeric materials (e.g., via metal-oxygen-metal bond formation) or a film on the substrate. Gas streams may be introduced, for example, using separate injection inlets or a dual-plenum showerhead. The apparatus is configured so that the streams of precursor and optional counter-reactant are mixed in the chamber, allowing the precursor and optional counter-reactant to react to form a polymerized organometallic material or a film (e.g., a metal oxide coating or agglomerated polymeric materials, such as via metal-oxygen-metal bond formation).

For depositing metal oxide, the CVD process is generally conducted at reduced pressures, such as from 0.1 Torr to 10 Torr. In some embodiments, the process is conducted at pressures from 1 Torr to 2 Torr. The temperature of the substrate is preferably below the temperature of the reactant streams. For example, the substrate temperature may be from 0° C., to 250° C., or from ambient temperature (e.g., 23° C.) to 150° C.

For depositing agglomerated polymeric materials, the CVD process is generally conducted at reduced pressures, such as from 10 mTorr to 10 Torr. In some embodiments, the process is conducted at from 0.5 to 2 Torr. The temperature of the substrate is preferably at or below the temperature of the reactant streams. For example, the substrate temperature may be from 0° C., to 250° C., or from ambient temperature (e.g., 23° C.) to 150° C. In various processes, deposition of the polymerized organometallic material on the substrate occurs at rates inversely proportional to surface temperature. Without limiting the mechanism, function or utility of present disclosure, it is believed that the product from such vapor-phase reaction becomes heavier in molecular weight as metal atoms are crosslinked by counter-reactants and is then condensed or otherwise deposited onto the substrate. In various embodiments, the steric hindrance of the bulky alkyl groups further prevents the formation of densely packed network and produces low density films having increased porosity.

A potential advantage of using dry deposition methods is ease of tuning the composition of the film as it grows. In a CVD process, this may be accomplished by changing the relative flows of a first precursor and a second precursor during deposition. Deposition may occur between 30° C., and 200° C., at pressures between 0.01 Torr to 100 Torr, but more generally between about 0.1 Torr and 10 Torr.

A film (e.g., a metal oxide coating or agglomerated polymeric materials, such as via metal-oxygen-metal bond formation) may also be deposited by an ALD process. For example, the precursor(s) and optional counter-reactant are introduced at separate times, representing an ALD cycle.

The precursors react on the surface, forming up to a monolayer of material at a time for each cycle. This may allow for excellent control over the uniformity of film thickness across the surface. The ALD process is generally conducted at reduced pressures, such as from 0.1 Torr to 10 Torr. In some embodiments, the process is conducted from 1 Torr to 2 Torr. The substrate temperature may be from 0° C., to 250° C., or from ambient temperature (e.g., 23° C.) to 150° C. The process may be a thermal process or, preferably, a plasma-assisted deposition.

Any of the deposition methods herein can be modified to allow for use of two or more different precursors. In one embodiment, the precursors can include the same metal but different ligands. In another embodiment, the precursors can include different metal groups. In one non-limiting instance, alternating flows of various volatile precursors can provide a mixed metal-containing layer, such as use of a metal alkoxide precursor having a first metal (e.g., Sn) with a silyl-based precursor having a different second metal (e.g., Te).

Processes herein can be used to achieve a surface modification. In some iterations, a vapor of the precursor may be passed over the wafer. The wafer may be heated to provide thermal energy for the reaction to proceed. In some iterations, the heating can be between about 50° C., to about 250° C. In some cases, pulses of the precursor may be used, separated by pump and/or purging steps. For instance, a first precursor may be pulsed between pulses of a second precursor pulses resulting in ALD or ALD-like growth. In other cases, both precursors may be flowed at the same time. Examples of elements useful for surface modification include I, F, Sn, Bi, Sb, Te, and oxides or alloys of these compounds.

The processes herein can be used to deposit a thin metal oxide or metal by ALD or CVD. Examples include tin oxide ($SnO_x$), bismuth oxide ($BiO_x$), and Te. Following deposition, the film may be capped with an alkyl substituted precursor of the form MaRbLe, as described elsewhere herein. A counter-reactant may be used to better remove the ligands, and multiple cycles may be repeated to ensure complete saturation of the substrate surface. The surface can then be ready for the EUV-sensitive film to be deposited. One possible method is to produce a thin film of $SnO_x$. Possible chemistries include growth of $SnO_2$ by cycling tetrakis (dimethylamino)tin and a counter-reactant such as water or $O_2$ plasma. After the growth, a capping agent could be used. For example, isopropyltris(dimethylamino) tin vapor may be flown over the surface.

Deposition processes can be employed on any useful surface. As referred to herein, the "surface" is a surface onto which a film of the present technology is to be deposited or that is to be exposed to EUV during processing. Such a surface can be present on a substrate (e.g., upon which a film is to be deposited) or on a film (e.g., upon which a capping layer can be deposited).

Such underlying topographical features may include regions in which material has been removed (e.g., by etching) or regions in which materials have been added (e.g., by deposition) during processing prior to conducting a method of this technology. Such prior processing may include methods of this technology or other processing methods in an iterative process by which two or more layers of features are formed on the substrate. Without limiting the mechanism, function, or utility of the present disclosure, it is believed that, in some embodiments, methods of the present disclosure offer advantages, such as conformance of the films of the present disclosure to underlying features without "filling in" or otherwise planarizing such features and the ability to deposit films on a wide variety of material surfaces.

Exposure of Metal-Containing Resist Material

The photoresist film may be exposed to radiation. The photoresist film is exposed to radiation according to a desired pattern to form exposed and unexposed regions of the photoresist film. It will be understood that "exposed regions" may be understood relatively speaking as "more exposed regions" and "unexposed regions" may be understood relatively speaking as "less exposed regions." Exposure causes a change in the chemical composition and cross-linking in the photoresist film, creating a contrast in etch selectivity that can be exploited for subsequent development.

EUV exposure of the film can provide EUV exposed regions having activated reactive centers including a metal atom (M), which are produced by EUV-mediated cleavage events. Such reactive centers can include dangling metal bonds. M-H groups, cleaved M-ligand groups, dimerized M-M bonds, or M-O-M bridges.

EUV exposure can have a wavelength in the range of about 10 nm to about 20 nm in a vacuum ambient, such as a wavelength of from 10 nm to 15 nm, e.g., 13.5 nm. In particular, patterning can provide EUV exposed regions and EUV unexposed regions to form a pattern. In some embodiments, such patterning includes a radiation dose of about 1-50 mJ/cm$^2$, 1-40 mJ/cm$^2$, 1-30 mJ/cm$^2$, 1-20 mJ/cm$^2$, or 1-10 mJ/cm$^2$.

The present disclosure can include patterning using EUV, as well as DUV or e-beam. In such patterning, the radiation is focused on one or more regions of the imaging layer. The exposure can be performed such that imaging layer film comprises one or more regions that are not exposed to the radiation. The resulting imaging layer may comprise a plurality of exposed and unexposed regions, creating a pattern consistent with the creation of transistor or other features of a semiconductor device, formed by addition or removal of material from the substrate in subsequent processing of the substrate. EUV. DUV and e-beam radiation methods and equipment among useful herein include methods and equipment known in the art.

In some EUV lithography techniques, an organic hard mask (e.g., an ashable hard mask of PECVD amorphous hydrogenated carbon) is patterned using a photoresist process. During photoresist exposure. EUV radiation is absorbed in the resist and in the substrate below, producing highly energetic photoelectrons (e.g., about 100 eV) and in turn a cascade of low-energy secondary electrons (e.g., about 10 eV) that diffuse laterally by several nanometers. These electrons increase the extent of chemical reactions in the resist which increases its EUV dose sensitivity. However, a secondary electron pattern that is random in nature is superimposed on the optical image. This unwanted secondary electron exposure results in loss of resolution, observable line edge roughness (LER) and linewidth variation in the patterned resist. These defects are replicated in the material to be patterned during subsequent pattern transfer etching.

In various embodiments described herein, a deposition (e.g., condensation) process (e.g., ALD or MOCVD carried out in a PECVD tool) can be used to form a thin film of a metal-containing film, such a photosensitive metal salt or metal-containing organic compound (organometallic compound), with a strong absorption in the EUV (e.g., at wavelengths on the order of 10 nm to 20 nm), for example at the wavelength of the EUVL light source (e.g., 13.5 nm=91.8 eV). This film photo-decomposes upon EUV exposure and forms a metal mask that is the pattern transfer layer during subsequent etching (e.g., in a conductor etch tool).

Following deposition, the EUV-patternable thin film is patterned by exposure to a beam of EUV light, in some instances under relatively high vacuum. For EUV exposure, the metal-containing film can then be deposited in a chamber integrated with a lithography platform (e.g., a wafer stepper) and transferred under vacuum so as not to react before exposure. Integration with the lithography tool is facilitated by the fact that EUVL also requires a greatly reduced pressure given the strong optical absorption of the incident photons by ambient gases such as H$_2$O, O$_2$, etc. In other embodiments, the photosensitive metal film deposition and EUV exposure may be conducted in the same chamber.

Photolithography processes can involve one or more bake steps, to facilitate the chemical reactions required to produce chemical contrast between exposed and unexposed regions of the photoresist. For high volume manufacturing (HVM), such bake steps can be performed on tracks where the wafers are baked on a hot-plate at a pre-set temperature under ambient air or in some cases N$_2$ flow. More careful control of the bake ambient as well as introduction of additional reactive gas component in the ambient during these bake steps can help further reduce the dose requirement and/or improve pattern fidelity.

According to various aspects of this disclosure, one or more post-treatments to metal and/or metal oxide-based photoresists after deposition (e.g., post-application bake (PAB) or another post-application treatment) and/or exposure (e.g., post-exposure bake (PEB), which can be omitted; or another post-exposure treatment) and/or development (e.g., post-development bake (PDB) or another post-development treatment) are capable of increasing material property differences between exposed and unexposed photoresist and therefore decreasing dose-to-size (DtS), improving PR profile, and improving line edge and width roughness (LER/LWR) after subsequent dry development. Such processing can involve a thermal process with the control of temperature, gas ambient, and moisture, resulting in improved dry development performance in processing to follow. In some instances, a remote plasma might be used. Yet in certain instances. PAB and/or PEB and/or PDB are not performed.

In the case of post-application processing (e.g., PAB), a thermal process with control of temperature (e.g., with heating or cooling), gas atmosphere (e.g., air. H$_2$O, CO$_2$, CO, O$_2$, O$_3$, CH$_4$, CH$_3$OH, N$_2$, H$_2$, NH$_3$, N$_2$O, NO, Ar, He, or their mixtures) or under vacuum, and moisture can be used after deposition and before exposure to change the composition of unexposed metal and/or metal oxide photoresist. The change can increase the EUV sensitivity of the material and thus lower dose to size and edge roughness can be achieved after exposure and dry development.

In the case of post-exposure processing (e.g., PEB), a thermal process with the control of temperature, gas atmosphere (e.g., air, H$_2$O, CO$_2$, CO, O$_2$, O$_3$, CH$_4$, CH$_3$OH, N$_2$, H$_2$, NH$_3$, N$_2$O, NO, Ar, He, or their mixtures) or under vacuum, and moisture can be used to change the composition of both unexposed and exposed photoresist. The change can increase the composition/material properties difference between the unexposed and exposed photoresist and the etch rate difference of dry development etch gas between the unexposed and exposed photoresist. A higher etch selectivity can thereby be achieved. Due to the improved selectivity, a squarer PR profile can be obtained with improved surface roughness, and/or less photoresist residual/scum. In particular embodiments. PEB can be performed in air and in the optional presence of moisture and $CO_2$. In other embodiments, PEB can be omitted.

In the case of post-development processing (e.g., post-development bake or PDB), a thermal process with the control of temperature, gas atmosphere (e.g., air, $H_2O$, $CO_2$, CO, $O_2$, $O_3$, $CH_4$, $CH_3OH$, $N_2$, $H_2$, $NH_3$, $N_2O$, NO, Ar, He, or their mixtures) or under vacuum (e.g., with UV), and moisture can be used to change the composition of the unexposed photoresist. In particular embodiments, the condition also includes use of plasma (e.g., including $O_2$, $O_3$, $H_2O_2$, Ar, He, or their mixtures). The change can increase the hardness of material, which can be beneficial if the film will be used as a resist mask when etching the underlying substrate.

In these cases, in alternative implementations, the thermal process could be replaced by a remote plasma process to increase reactive species to lower the energy barrier for the reaction and increase productivity. Remote plasma can generate more reactive radicals and therefore lower the reaction temperature/time for the treatment, leading to increased productivity.

Accordingly, one or multiple processes may be applied to modify the photoresist itself to increase wet or dry development selectivity. This thermal or radical modification can increase the contrast between unexposed and exposed material and thus increase the selectivity of the subsequent development step. The resulting difference between the material properties of unexposed and exposed material can be tuned by adjusting process conditions including temperature, gas flow, moisture, pressure, and/or RF power.

For wet-developed or dry-developed resist films, the treatment temperature in a PAB or PEB can be varied to tune and optimize the treatment process, for example from about 90° C., to 250° C., for PAB and about 170° C., to 250° C., or more for PEB.

In particular embodiments, the PAB and/or PEB treatments may be conducted with gas ambient flow in the range of 100 sccm to 10000 sccm, moisture content in the amount of a few percent up to 100% (e.g., 20%-50%), at a pressure between atmospheric and vacuum, and for a duration of about 30 s to 15 min, for example about 1 to 2 min. In particular embodiments. PEB is omitted.

Depending on the selectivity requirements/constraints of the semiconductor processing operation, a thermal treatment such as described herein can be used to lower the EUV dose needed. Or, if higher selectivity is required and higher dose can be tolerated, much higher selectivity, up to 100 times exposed vs, unexposed, can be obtained.

Yet other steps can include in-situ metrology, in which physical and structural characteristics (e.g., critical dimension, film thickness, etc.) can be assessed during the photolithography process. Modules to implement in-situ metrology include. e.g., scatterometry, ellipsometry, downstream mass spectroscopy, and/or plasma enhanced downstream optical emission spectroscopy modules.

A substrate may be provided in a process chamber, where the substrate is a semiconductor substrate comprising a substrate layer and the post-developed photoresist mask over the substrate layer. The substrate layer may be underlying the post-developed photoresist mask and may include any suitable material to facilitate the patterning process. The substrate layer may be etched with high selectivity to the post-developed photoresist mask. In some implementations, the substrate layer may include spin-on carbon (SoC), spin-on glass (SOG), amorphous carbon (a-C), tin oxide (e.g., $SnO_x$), silicon (e.g., a-Si), silicon oxide (e.g., $SiO_x$), silicon oxynitride (e.g., $SiO_xN_y$), silicon oxycarbide (e.g., $SiO_xC_y$), silicon nitride ($Si_3N_4$), silicon carbide ($SiC_x$), titanium oxide (e.g., $TiO_2$), titanium nitride (e.g., TiN), tungsten (e.g., W), doped carbon (e.g., W-doped C), tungsten oxide (e.g., $WO_x$), hafnium oxide ($HfO_2$), zirconium oxide (e.g., $ZrO_2$), or aluminum oxide ($Al_2O_3$).

The metal-containing photoresist may be dry or wet deposited on the substrate layer. The metal-containing photoresist may be provided as a positive tone or negative tone resist having EUV-exposed and EUV-unexposed regions after EUV exposure. After deposition, the metal-containing photoresist may be photopatterned in an EUV lithography chamber (scanner). After exposure and an optional PEB treatment, the metal-containing photoresist may undergo development to selectively remove portions (e.g., EUV-unexposed portions) of the metal-containing photoresist to form a patterned photoresist mask over the substrate layer. In some implementations, the metal-containing photoresist is a metal-containing EUV photoresist, where the metal-containing EUV photoresist is an organo-metal oxide or organo-metal containing film. For instance, the metal-containing EUV photoresist may include Sn, O, and C atoms.

The process chamber may provide an enclosed space for treating the substrate after development. Chamber walls in the process chamber may be fabricated from stainless steel, aluminum, plastic, or other suitable material. In some embodiments, the chamber walls are coated with corrosion-resistant films, such as polymers or inorganic coatings. The process chamber may include a substrate support (e.g., pedestal or electrostatic chuck) on which the substrate is supported. In some embodiments, the process chamber for post-development treatment may be a deposition chamber, a bevel edge and/or backside clean chamber, a PAB treatment chamber, a PEB treatment chamber, a development chamber, or an etch chamber. That way, the process chamber for post-development treatment may be the same chamber used in a previous operation for photoresist processing or the same chamber used in a subsequent operation for photoresist processing, thereby minimizing substrate transfers to reduce exposure to air breaks in between operations. The process chamber may include one or more heating elements for exposing the substrate to elevated temperatures. In some embodiments, the one or more heating elements may include one or more infrared (IR) lamps or one or more light-emitting-diodes (LEDs) located in a substrate support for controlling a temperature of the substrate. The process chamber may include one or more gas lines for delivering gas into the process chamber. For example, the one or more gas lines may include a showerhead for supplying reactive gases towards the substrate in the process chamber. In some implementations, the process chamber may be a plasma-generating chamber or may be coupled to a plasma-generating chamber separate from the process chamber. The plasma-generating chamber may be an inductively-coupled plasma (ICP) reactor, a transformer-coupled plasma (TCP) reactor, or a capacitively-coupled plasma (CCP) reactor. In some cases, the process chamber further includes one or more gas outlets for exhausting gases, which may or may not be coupled to a vacuum pump to maintain a desired pressure within the process chamber.

The post-developed metal-containing photoresist mask is treated using one or more of the following operations: (i) thermally annealing the post-developed metal-containing photoresist mask. (ii) exposing the post-developed metal-containing photoresist mask to plasma. (iii) exposing the post-developed metal-containing photoresist mask to one or more reactive gases, and (iv) selectively depositing a protective layer on the post-developed metal-containing photoresist mask. Post-development treatment of the substrate may utilize one of the foregoing thermal anneal, plasma, chemical, or selective deposition treatment operations, or a combination of the foregoing treatments. The post-development treatment improves the performance of the metal-containing photoresist mask during pattern transfer etching. The foregoing thermal anneal, plasma, chemical, and selective deposition treatment techniques are discussed in detail below.

The substrate layer is etched to form recessed features using the post-developed metal-containing photoresist mask. This process may be referred to as pattern transfer or pattern transfer etching. The etch may selectively remove portions of the substrate layer without removing the post-developed metal-containing photoresist mask. A wet or dry etchant may be employed to etch through the portions of the substrate layer exposed by post-developed metal-containing photoresist mask. The metal-containing photoresist mask may define a pattern by which features are to be etched. Features are etched through the substrate layer according to the pattern defined by the metal-containing photoresist mask. After post-development treatment, the metal-containing photoresist mask may have an increased line CD and/or improved etch resistance during pattern transfer etching. The features to be etched can maintain or substantially maintain the line CD provided by the metal-containing photoresist mask. In some cases, the metal-containing photoresist mask may have reduced defectivity and/or roughness. As a result, defects and roughness do not get transferred to the features that are formed after pattern transfer etching.

Thermal Treatment

In some implementations, the substrate may be thermally treated by heating the substrate to an elevated temperature. This may also be referred to as a post-development bake (PDB). Thermal treatment of the substrate may serve to reduce defects and reduce roughness from the metal-containing photoresist mask prior to pattern transfer etching. In particular, thermal treatment of the substrate may improve chemical contrast in the metal-containing photoresist mask by removing scum. Thermal treatment of the substrate may harden residue/scum and also reduce outgassing.

After wet or dry development, residue or scum may remain on the substrate. The residue or scum may remain in areas of the photoresist mask that were removed by development. The residue or scum may include residual etch byproducts adsorbed on surfaces of the substrate. For example, the vapors of halogens used in certain development chemistries may react with moisture or oxygen to form residual etch byproducts that are difficult to remove. Wet processing techniques often employ moisture and/or oxygen, which more easily leads to scum and residue formation. In some cases, the residue may include high metal concentrations or particles or clusters of metal oxide (e.g., $SnO_x$) that can contribute to a loss of chemical contrast during pattern transfer and contaminate downstream processing tools.

After wet or dry development, roughness may form on sidewalls of etched features in a developed pattern of the photoresist mask. Some of this may be attributed to stochastics or non-optimal Gaussian distribution of light resulting in partially or fully exposed material in areas where photoresist should remain unexposed or vice versa. Moreover, scumming on sidewalls of etched features of the photoresist mask may exacerbate roughness.

During thermal treatment, the substrate may be heated to an elevated temperature between about 50° C., and about 500° C., between about 100° C., and about 400° C., between about 100° C., and about 300° C., or between about 100° C., and about 250° C. The substrate may be heated to the elevated temperature using one or more temperature-controllable elements in the process chamber. The pressure may be maintained between about 0.1 Torr and about 760 Torr, for example between about 0.1 Torr and about 1 Torr in some cases. The substrate may be exposed to the elevated temperature for a duration between about 1 minute and about 10 minutes, for example between about 2 minutes and about 5 minutes in some cases. In some implementations, thermal treatment is performed with one or more inert gases. For instance, thermal treatment may be performed with a flow of nitrogen ($N_2$), helium (He), neon (Ne), argon (Ar), or xenon (Xe). In some implementations, thermal treatment is performed in atmosphere.

Higher temperatures in post-development thermal treatment may lead to increased descumming, reduced defectivity, and reduced roughness. However, higher temperatures may simultaneously lead to reduced line CD. It has been observed that higher temperatures during thermal anneal result in photoresist lateral shrinkage and photoresist height shrinkage. The reduced line CD results in a higher dose-to-size. Post-development thermal treatment may suffer from a tradeoff between reduced defectivity and roughness with a higher dose-to-size. This limits the thermal treatment to a desired temperature range and desired treatment duration to optimize the benefits of reduced defectivity and roughness while minimizing increases in dose-to-size.

Plasma Treatment

In some implementations, the substrate may be exposed to plasma for post-development treatment. Plasma treatment may serve to densify the metal-containing photoresist mask and lower roughness prior to pattern transfer etching. In some cases, plasma treatment may further improve chemical contrast in the metal-containing photoresist mask by removing scum. Plasma treatment may employ plasma of inert gas species or plasma of reactive gas species. Plasma of reactive gas species may chemically react with the metal-containing photoresist mask or selectively deposit a protective film on the metal-containing photoresist mask. The plasma treatment may perform effects of passivation and/or hardening.

Exposure to plasma may be facilitated by generating plasma in a remote plasma generator or generating plasma in the process chamber where the substrate is being treated. One or more gases may be flowed to a plasma-generating region, which may be a remote plasma generator or the process chamber, and plasma is ignited. A plasma-generating chamber may be an inductively-coupled plasma (ICP), transformed-coupled plasma (TCP), or capacitively-coupled plasma (CCP) reactor. Plasma energy is provided to activate one or more gases into ions, radicals, neutral species, and other plasma-activated species. Ions, radicals, neutral species, and other plasma-activated species may interact with the metal-containing photoresist mask to improve the performance of the metal-containing photoresist mask during pattern transfer etching.

The one or more gases may include oxygen-containing species such as oxygen ($O_2$), carbon dioxide ($CO_2$), carbon monoxide (CO), ozone ($O_3$), and sulfur dioxide ($SO_2$). Additionally or alternatively, the one or more gases may include halogen-containing species such as boron trichloride ($BCl_3$), silicon tetrachloride ($SiCl_4$), tin tetrachloride ($SnCl_4$), tungsten hexafluoride ($WF_6$), and difluoromethane ($CH_2F_2$). Additionally or alternatively, the one or more gases may include inert gas species such as nitrogen ($N_2$), helium (He), neon (Ne), argon (Ar), and xenon (Xe). Other gases may include hydrogen ($H_2$), ammonia ($NH_3$), water ($H_2O$), hydrogen peroxide ($H_2O_2$), nitric oxide (NO), nitrous oxide ($N_2O$), nitrogen dioxide ($NO_2$), hydrogen halides (HCl, HBr, HF, HI), and various hydrocarbons ($C_xH_y$) such as methane ($CH_4$). In some cases, the plasma may be an oxygen-based plasma, nitrogen-based plasma, hydrogen-based plasma, inert gas plasma, and/or carbon-based plasma. In some implementations, the plasma is a remote plasma. In some other implementations, the plasma is an in-situ plasma.

Process conditions for plasma treatment may be tuned to achieve a desired result. Such process conditions include but are not limited to plasma power, plasma frequency, plasma exposure time, bias voltage, duty cycle, temperature (e.g., pedestal temperature), pressure (e.g., chamber pressure), and flow rate of the one or more gases. The plasma in operation may be generated at a plasma power less than about 6 KW, such as between about 50 W and about 4000 W, between about 50 W and about 1000 W, or between about 100 W and about 500 W. In some instances, the plasma may be provided at a low plasma power and high ion energy. A directionality of the plasma may be controlled by the bias voltage. In some implementations, the bias voltage may be applied that is between about 1 V and about 500 V, between about 10 V and about 400 V, or between about 30 V and about 300 V. Plasma treatment may be applied for a duration between about 0.5 seconds and about 120 seconds, between about 1 second and about 60 seconds, or between about 2 seconds and about 40 seconds. Plasma treatment may modulate duty cycles of the plasma in operation to achieve the desired result, where the RF power supply may deliver plasma at any suitable duty cycle, such as between about 1% and about 99%, or between about 10% and about 90%. In some embodiments, chamber pressure may be between about 0.1 Torr and about 760 Torr, or between about 0.1 Torr and about 1 Torr in some cases. In some embodiments, a substrate temperature may be between about 0° C., and about 400° C., between about 50° C., and about 300° C., or between about 100° C., and about 250° C.

In some embodiments, useful plasma processing systems may include a radio-frequency power amplifier which can be operated continuously or pulsed.

As discussed below, plasma treatment may be accompanied by reactive gas species. Plasma of reactive gas species may induce chemical reactions in the metal-containing photoresist mask to improve mask properties such as etch resistance. Plasma of reactive gas species may selectively deposit a protective film on the metal-containing photoresist mask to increase line CD and reduce dose-to-size.

The plasma treatment may be a cyclic plasma treatment in certain embodiments. Such processes involve a first step of soaking in a halogen-containing gas such as HBr, in which HBr is absorbed on the exposed patterned surface followed by a purge of excess HBr. After purging the process chamber, the second step of a cyclic plasma treatment process is to ignite a helium plasma with a certain bias in order to activate the HBr absorbed onto the exposed patterned surface in order to descum. The two steps are then repeated as many times as necessary to remove all scum.

In certain embodiments, the plasma treatment may be a continuous plasma dry development. In this process, an inert gas including but not limited to helium, argon, or a combination thereof is co-flowed into the process chamber with from about 1 to about 10 percent of halogen-containing gas such as HBr; followed by igniting a plasma with bias at a voltage of from about 40) Volts to about 500 Volts to descum. The halogen-containing gas flow rate may be from about 200 to about 800 sccm. The plasma can be modulated by 1) ramping up TCP power from high to low; 2) maintaining a constant TCP power with a pulsing bias; or 3) by pulsing bias and TCP simultaneously to clean the photoresist surface of scum. The entire process may take from about 7 to about 30 seconds in some embodiments. The pressure of the continuous dry development plasma process may be from about 5 mTorr to about 50 mTorr.

Chemical Treatment

In some implementations, the metal-containing photoresist mask may be exposed to one or more reactive gas species. Reactive gas species may chemically react with the metal-containing photoresist mask. In fact, certain reactive gas species may be reactive with the metal-containing photoresist mask and unreactive with the substrate layer of the substrate. In some implementations, the reactive gas species may convert an entirety or a substantial entirety of the metal-containing photoresist mask from a first material to a second material. The change in chemistry of the metal-containing photoresist mask may alter one or more properties of the metal-containing photoresist mask. In some implementations, the reactive gas species may convert only an outer portion of the metal-containing photoresist mask from a first material to a second material, which may be used as a protective film as described further below.

The reactive gas species may react with the metal-containing photoresist mask to increase line CD and reduce dose-to-size. The reactive gas species may react with the metal-containing photoresist mask to reduce roughness (e.g., LWR/LER) or at least maintain the same roughness. The reactive gas species may densify the metal-containing photoresist mask. In some cases, the reactive gas species may react with the metal-containing photoresist mask to reduce defectivity (e.g., scumming). Additionally, the reactive gas species may reduce outgassing such as tin outgassing from the metal-containing photoresist mask. In some cases, the reactive gas species may react with the metal-containing photoresist mask to increase an etch resistance of the photoresist mask during subsequent etch operations. By way of an example, the reactive gas species may increase line CD and at least substantially maintain the increased line CD of the photoresist mask after pattern transfer etching.

The reactive gas species may be more reactive with the metal-containing photoresist relative to the underlying substrate layer(s). In particular implementations, chemical treatment using reactive gas species takes advantage of the chemistry of an EUV photoresist mask. The EUV photoresist mask may be composed of an organometallic oxide film such as an organotin oxide film having Sn, O, and C atoms. The organotin oxide film may be comprised of networks of Sn—Sn bonds, Sn—H bonds, Sn—C bonds, Sn—OH bonds, Sn—O bonds, Sn—O—Sn bonds, and Sn—O—C bonds. The reactive gas species may react with one or more elements of the organotin oxide film by oxidation, reduction, insertion, abstraction, or other chemical reaction mechanism to induce a chemical change in the EUV photoresist mask. In some instances, the reactive gas species may include carbon monoxide (CO), where tin species may have a catalytic reaction with the carbon monoxide. Without being limited by any theory, compounds of $SnOC_x$ react with CO to form a new compound of $SnOC_x(CO)_y$. The chemical reaction induces a change in the EUV photoresist mask by expanding the line CD. In some implementations, the etch resistance of the new compound in the EUV photoresist mask is improved.

Reactive gas species other than CO may be employed to induce a chemical reaction in the EUV photoresist mask. Examples of useful reactive gas species may include but are not limited to air, water vapor ($H_2O$), hydrogen peroxide ($H_2O_2$), carbon dioxide ($CO_2$), oxygen ($O_2$), ozone ($O_3$), methane ($CH_4$), methanol ($CH_3OH$), ethanol ($CH_3CH_2OH$), nitrogen ($N_2$), hydrogen ($H_2$), ammonia ($NH_3$), nitrous oxide ($N_2O$), nitric oxide (NO), nitrogen dioxide ($NO_2$), acetyl acetone ($C_5H_8O_2$), formic acid ($CH_2O_2$), acetic acid ($CH_3COOH$), hydrogen cyanide (HCN), boron trichloride ($BCl_3$), silicon tetrachloride ($SiCl_4$), chlorine ($Cl_2$), bromine ($Br_2$), hydrogen chloride (HCl), hydrogen bromide (HBr), hydrogen iodide (HI), hydrogen fluoride (HF), fluoromethane ($CH_3F$), difluoromethane ($CH_2F_2$), and combinations thereof. In some cases, the reactive gas species may include an oxygen-containing gas, a carbon-containing gas, a hydrogen-containing gas, a nitrogen-containing gas, a halogen-containing gas, or combinations thereof. Other reactive gas species may include metal precursors such as tungsten hexafluoride ($WF_6$), tin tetrachloride ($SnCl_4$), molybdenum hexafluoride ($MoF_6$), molybdenum dichloride dioxide ($MoO_2Cl_2$), and molybdenum chloride ($MoCl_5$). Other reactive gas species may include metal organic precursors such as tin tetrakis(dimethylamide) ($Sn(N(CH_3)_2)_4$), hafnium tetrakis(dimethylamide) ($Hf(N(CH_3)_2)_4$), dimethyl aluminum (($CH_3)_2Al$), trimethyl aluminum (($CH_3)_3Al$), titanium isopropoxide ($Ti(OCH(CH_3)_2)_4$), tungsten carbonyl($W(CO_x)$), molybdenum carbonyl($Mo(CO)_x$), ruthenium carbonyl($Ru(CO)_x$), iron carbonyl($Fe(CO)_x$), and combinations thereof. Thus, in some cases, the reactive gas species may include a metal halide or organometallic precursor such as a metal carbonyl precursor. Conventional polymer-based photoresist materials may not be reactive with metal halides or certain organometallic precursors, but metal-containing or metal oxide-containing photoresist materials of the present disclosure may be more prone to react with metal halides and organometallic precursors. Without being limited by any theory, where there are M-OH bonds in an organometallic photoresist. M-O-M' bridges may form where M' is from the metal precursor (e.g., metal halide or organometallic precursor).

The reactive gas species may be co-flowed with other gases. In some implementations, the reactive gas species may be co-flowed with an inert gas species such as helium, neon, argon, or xenon. In some implementations, combinations of reactive gas species may be co-flowed with each other. By way of illustration, a halogen-containing gas such as boron trichloride may be co-flowed with a carbon-containing gas such as methane. In another example, a metal precursor such as tungsten hexafluoride may be co-flowed with a carbon-containing gas such as difluoromethane. The reactive gas species, alone or in combination with other reactive gas species, may convert the photoresist mask to another material or selectively deposit a protective film on the photoresist mask.

In some implementations, the reactive gas species may be supplied to the process chamber from a gas source fluidly coupled to the process chamber. Gas sources such as gas storage tanks may be fluidly coupled to the process chamber via gas supply lines. Gas reactants may be pre-mixed prior to entering the process chamber or mixed upon entering the process chamber. In some implementations, the reactive gas species may be generated in-situ in the process chamber. Gas reactants may react with one another to form reaction products that react with the metal-containing photoresist mask to induce chemical change. Or a gas reactant may react with one or more chamber components (e.g., metal-based chamber lines) to form a reaction product that reacts with the metal-containing photoresist mask to induce chemical change. The gas reactant may be a carbon-containing precursor that reacts with a metallic chamber component to form an organometallic precursor. This reaction may be driven thermally to generate the organometallic precursor. For example, carbon monoxide supplied into the process chamber may react with iron-containing chamber lines to form iron carbonyl ($Fe(CO)_x$) that readily reacts with an EUV photoresist mask, thereby increasing the line CD of the EUV photoresist mask. Without being limited by any theory, the iron carbonyl causes deposition of iron oxide on the EUV photoresist mask. In another example, carbon monoxide or carbon dioxide supplied into the process chamber may react with tungsten-containing chamber lines (e.g., hotwire) to form tungsten carbonyl ($W(CO)_x$) that readily reacts with an EUV photoresist mask.

Chemical treatment of the metal-containing photoresist mask involving one or more reactive gas species may be employed with one or both of thermal treatment and plasma treatment. Whereas thermal treatment or plasma treatment alone may exhibit tradeoffs, such tradeoffs may be offset by further applying a chemical treatment to the metal-containing photoresist mask. Specifically, chemical treatment may be combined with thermal treatment so that one or more reactive gas species are flowed to the metal-containing photoresist mask at elevated temperatures. Though elevated temperatures may decrease line CD, the one or more reactive gas species may increase line CD in the metal-containing photoresist mask. In fact, the increased line CD resulting from the one or more reactive gas species may exceed the decreased line CD resulting from the elevated temperatures. This reduces dose-to-size while reducing defectivity and roughness in the metal-containing photoresist mask. In some embodiments, chemical treatment may be combined with plasma treatment so that radicals and/or ions of the reactive gas species are flowed to the metal-containing photoresist mask. The radicals and/or ions may increase reactivity of the reactive gas species with the metal-containing photoresist mask. The metal-containing photoresist mask may be exposed to one or more reactive gas species in plasma, which can change the chemical composition of the metal-containing photoresist mask and increase line CD and density. This can be done without necessarily compromising defectivity or roughness of the metal-containing photoresist mask. Plasma may be applied at a power to avoid damage to the substrate.

Inducing a surface reaction or bulk reaction in the metal-containing photoresist mask may occur by applying energy to the reaction. Some amount of energy from thermal exposure and/or plasma exposure may be sufficient to induce the surface reaction or bulk reaction. Accordingly, process conditions such as temperature and plasma power may be tuned to achieve the desired outcome. In some implementations, a substrate temperature may be between about (° C.) and about 400° C., between about 50° C., and about 300° C., or between about 100° C., and about 250° C., during chemical treatment with one or more reactive gas species. In some implementations, plasma power may be less than about 6 KW, between about 50 W and about 4000 W, between about 50 W and about 1000 W, or between about 100 W and about 500 W during chemical treatment with the one or more reactive gas species.

Other process conditions such as plasma frequency, exposure time, bias voltage, pressure, and flow rates may be tuned to facilitate chemical treatment using the one or more reactive gas species. In some implementations, the bias voltage may be applied that is less than about 800 V, between about 0 V and about 500 V, between about 10 V and about 400 V, or between about 30 V and about 300 V. In some implementations, exposure to the one or more reactive gas species may be applied for a duration between about 1 second and about 10 minutes, between about 5 seconds and about 8 minutes, or between about 30 seconds and about 4 minutes. In some implementations, chamber pressure may be between about 0.1 Torr and about 760 Torr, or between about 1 mTorr and about 100 mTorr in some cases. A first reactive gas species may be flowed into the process chamber at a flow rate between about 1 sccm and about 1000 sccm, between about 2 sccm and about 500 sccm, or between about 5 sccm and about 300 sccm. An optional second reactive gas species may be co-flowed into the process chamber at a flow rate between about 5 sccm and about 1000 sccm, between about 10 sccm and about 500 sccm, or between about 20 sccm and about 300 sccm. An optional inert gas species may be co-flowed into the process chamber at a flow rate between about 20 sccm and about 2000 sccm, between about 30) sccm and about 1000 sccm, or between about 50 sccm and about 500 sccm. By way of an example, carbon monoxide may be flowed into the process chamber at a flow rate of about 500 sccm at a substrate temperature of about 240° C., for a duration between about 20 seconds and about 5 minutes. The carbon monoxide may react with an EUV photoresist mask to change the chemical composition of the EUV photoresist mask. In an alternative example, tungsten hexafluoride may replace carbon monoxide to react with the EUV photoresist mask to change the chemical composition of the photoresist mask. The EUV photoresist mask may exhibit increased etch resistance during subsequent pattern transfer etching.

Figure 3:
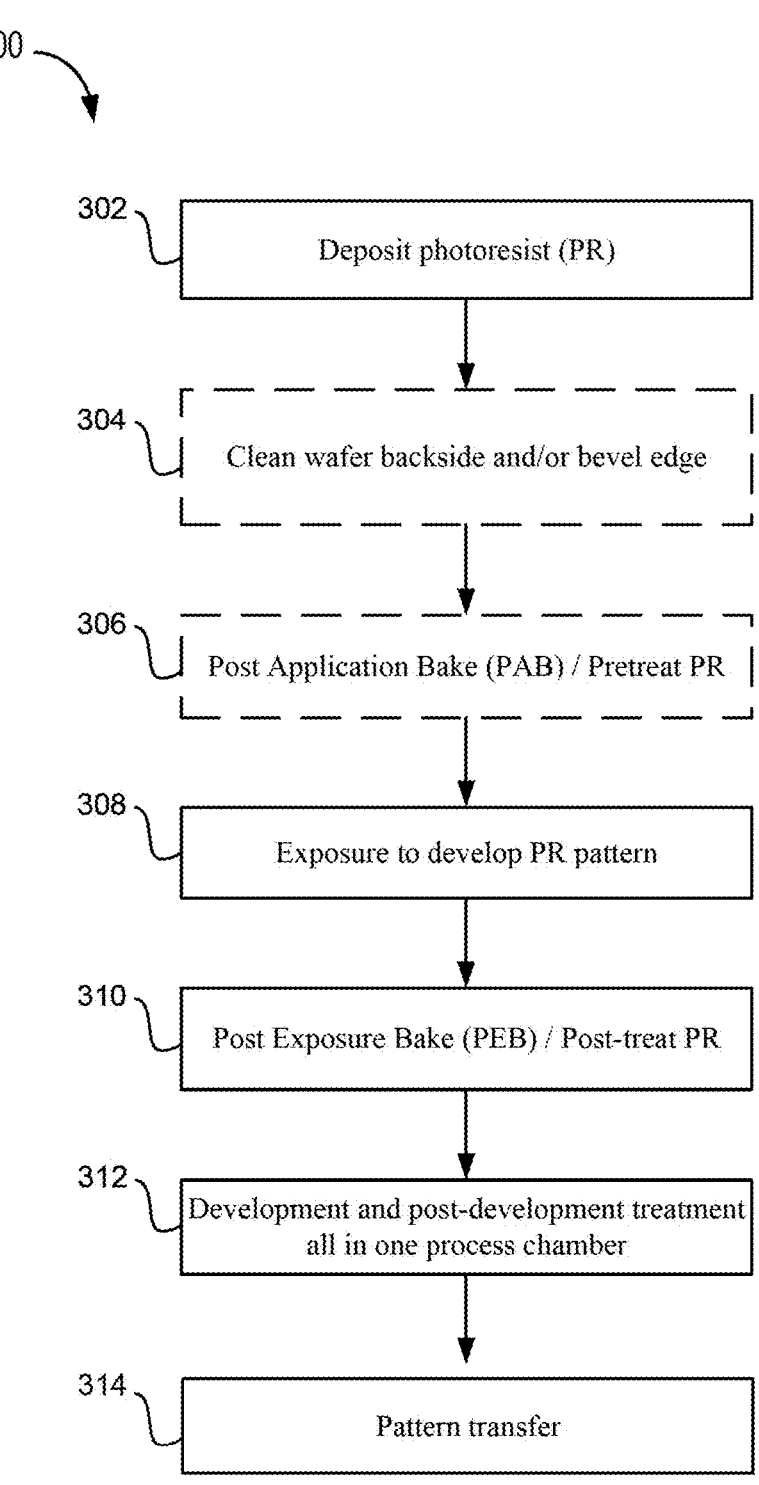
FIG. 3 presents a flow diagram of an example method of the overall process including development of a photoresist in a single process chamber accordance with certain disclosed embodiments.

Certain embodiments of the disclosed methods are illustrated by FIG. 3. The operations of the process 300 may be performed in different orders and/or with different, fewer, or additional operations. One or more operations of the process 300 may be performed using an apparatus described in any one of FIGS. 6-9. In some embodiments, the operations of the process 300 may be implemented, at least in part, according to software stored in one or more non-transitory computer readable media.

In FIG. 3, blocks 302-310 and 314 represent the same operations as blocks 102-110 and 116 of FIG. 1. The operation at block 312 represents an integrated dry development operation, where the integrated dry development operation can include thermal and plasma dry development, or where the integrated dry development operation can include dry development and post-development treatment, all of which is performed in a single process chamber. Operation 312 can be performed in place of the operations 112 and 114 of FIG. 1. In so doing, productivity is improved and defects, overlay and CD can be controlled more effectively. Consolidating dry development and post-development operations all in one process chamber promotes reduction of metal outgassing such as tin outgassing without the need to add an additional step of post-dry development bake which conventionally takes place in a different process chamber.

The combination of dry development and passivation, or the combination of thermal dry development and plasma dry development, in a single chamber is counter-intuitive due to the diametrically opposed process conditions each operation requires, particularly in terms of pressure. They are conventionally performed in different chambers with different process tools, to practically manage pressure requirements. Thermal processes require high pressure to obtain a high etch rate. The high partial pressure leads to better selectivity. Conversely, for plasma processes, low pressures are required to achieve anisotropic etch. If performed in a single process chamber, a pressure drop of several orders of magnitude must be rapidly accomplished, in from about 1 to about 10 seconds. Use of a throttle valve, a specialized pump, multiple pumps or control of the flow of process gases can effect the pressure drop rapidly: on the order of ten seconds or less. In some embodiments, the pressure drop takes place in 8 seconds, 7 seconds, 6 seconds, 5 seconds, 4 seconds, 3 seconds or 2 seconds. The apparatus enables maintenance of one or more process parameters uniformly: where the one or more process parameters includes pumping, gas delivery or pumping and gas delivery.

Moreover, the all in one process enables wafer surface passivation, residue cleaning and pattern edge roughness smoothening in situ and in a single chamber.

When the metal-containing photoresist is a metal oxide such as tin oxide, metal outgassing such as tin outgassing can be controlled without the need for a post-dry development bake.

"Tin oxide" is referred to herein as including any and all stoichiometric possibilities for SnxOy, including integer values of x and y and non-integer values of x and y. For example, "tin oxide" includes compounds having the formula SnOn, where $1 \leq n \leq 2$, where n can be an integer or non-integer values. "Tin oxide" can include sub-stoichiometric compounds such as $SnO_{1.8}$, "Tin oxide" also includes tin dioxide ($SnO_2$ or stannic oxide) and tin monoxide (SnO or stannous oxide). "Tin oxide" also includes both natural and synthetic variations and also includes any and all crystalline and molecular structures. "Tin oxide" also includes amorphous tin oxide.

Figure 4A:
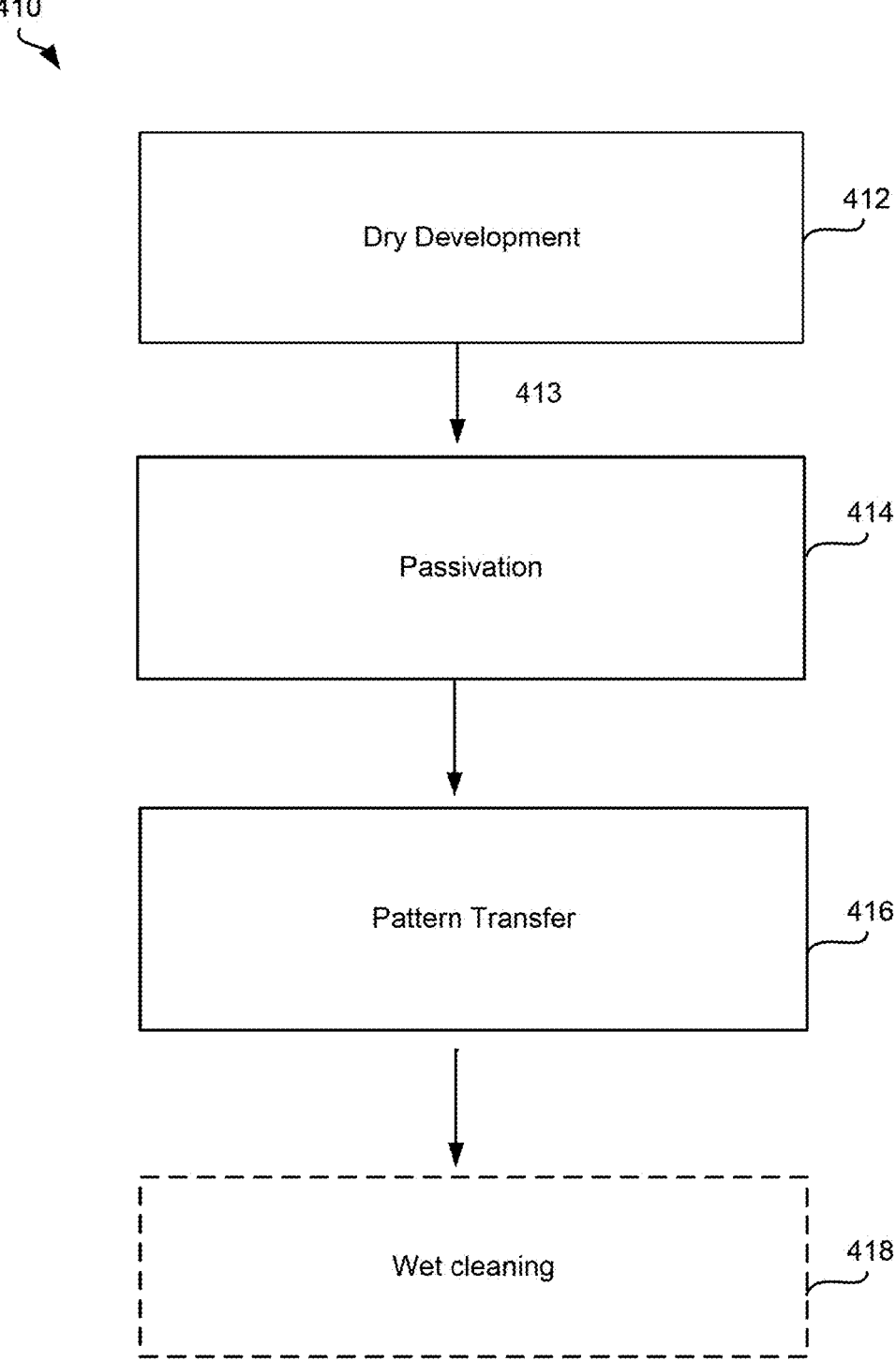
FIG. 4A presents a flow diagram for an example method for performing the operations of dry development and passivating in the same process chamber in accordance with certain disclosed embodiments.
Figure 4B:
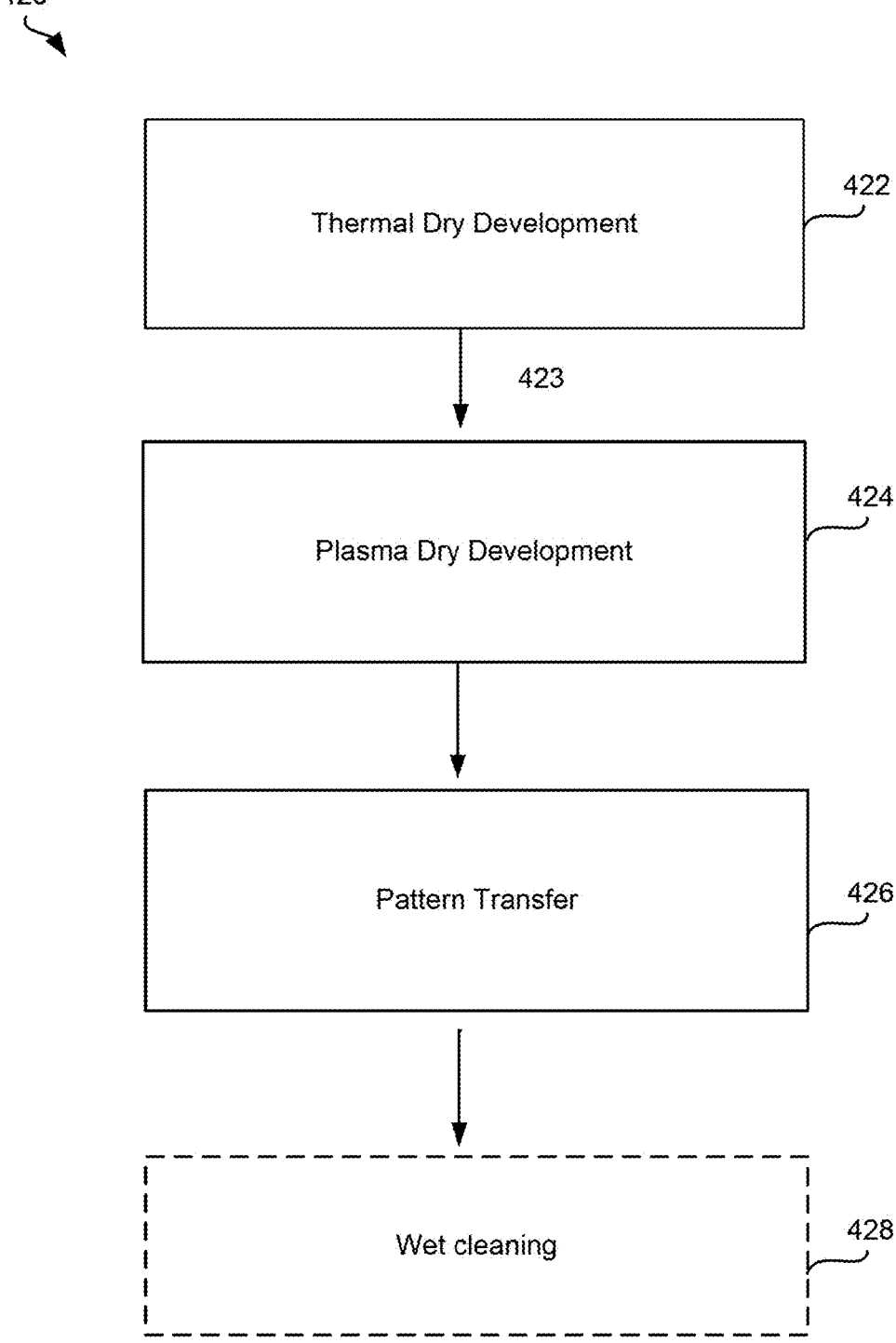
FIG. 4B presents a flow diagram for an example method for performing the operations of thermal dry development and plasma dry development in the same process chamber in accordance with certain disclosed embodiments.
Figure 4C:
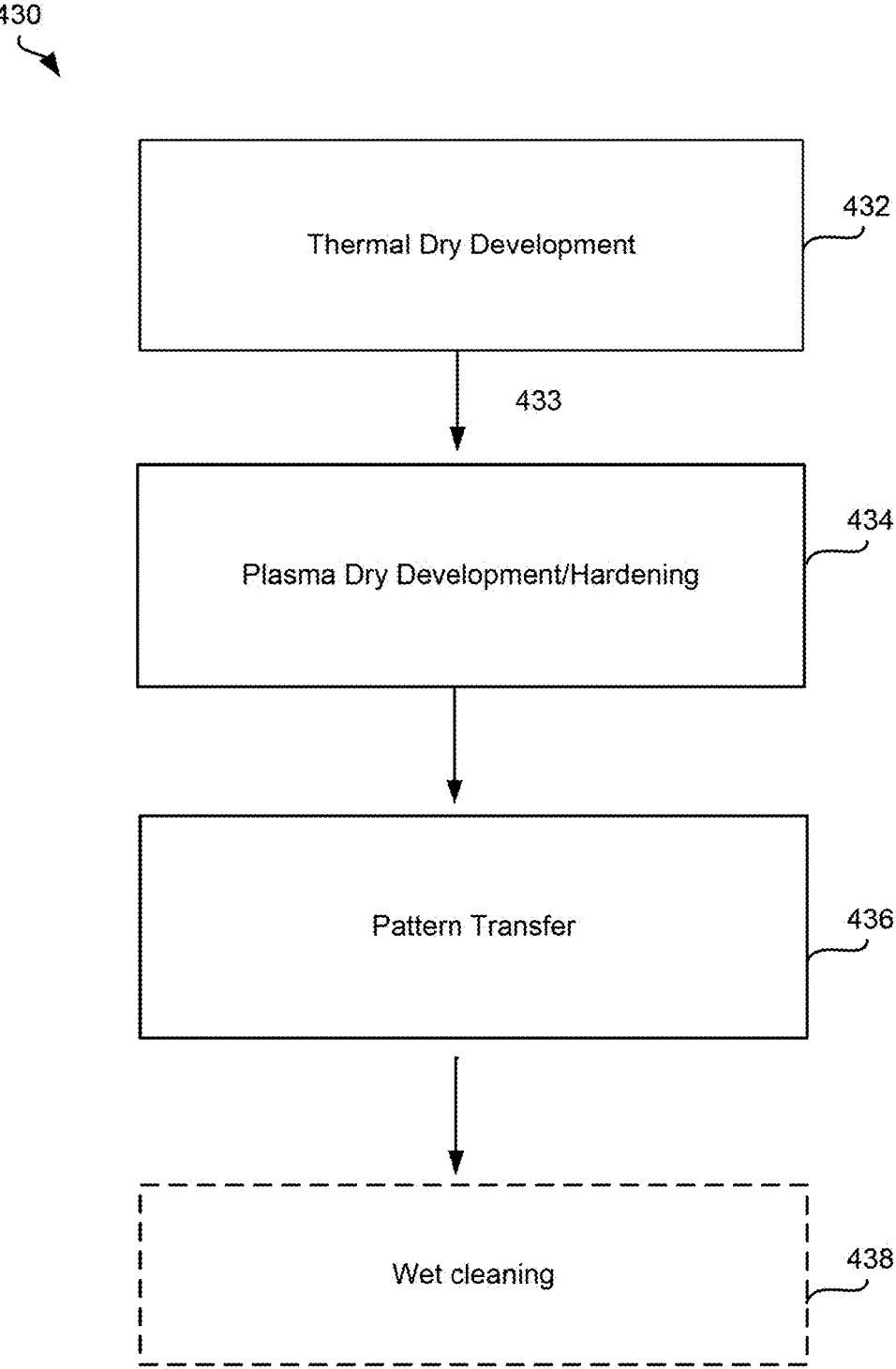
FIG. 4C presents a flow diagram for an example method for performing the operations of dry development and hardening in the same process chamber in accordance with certain disclosed embodiments.
Figure 4D:
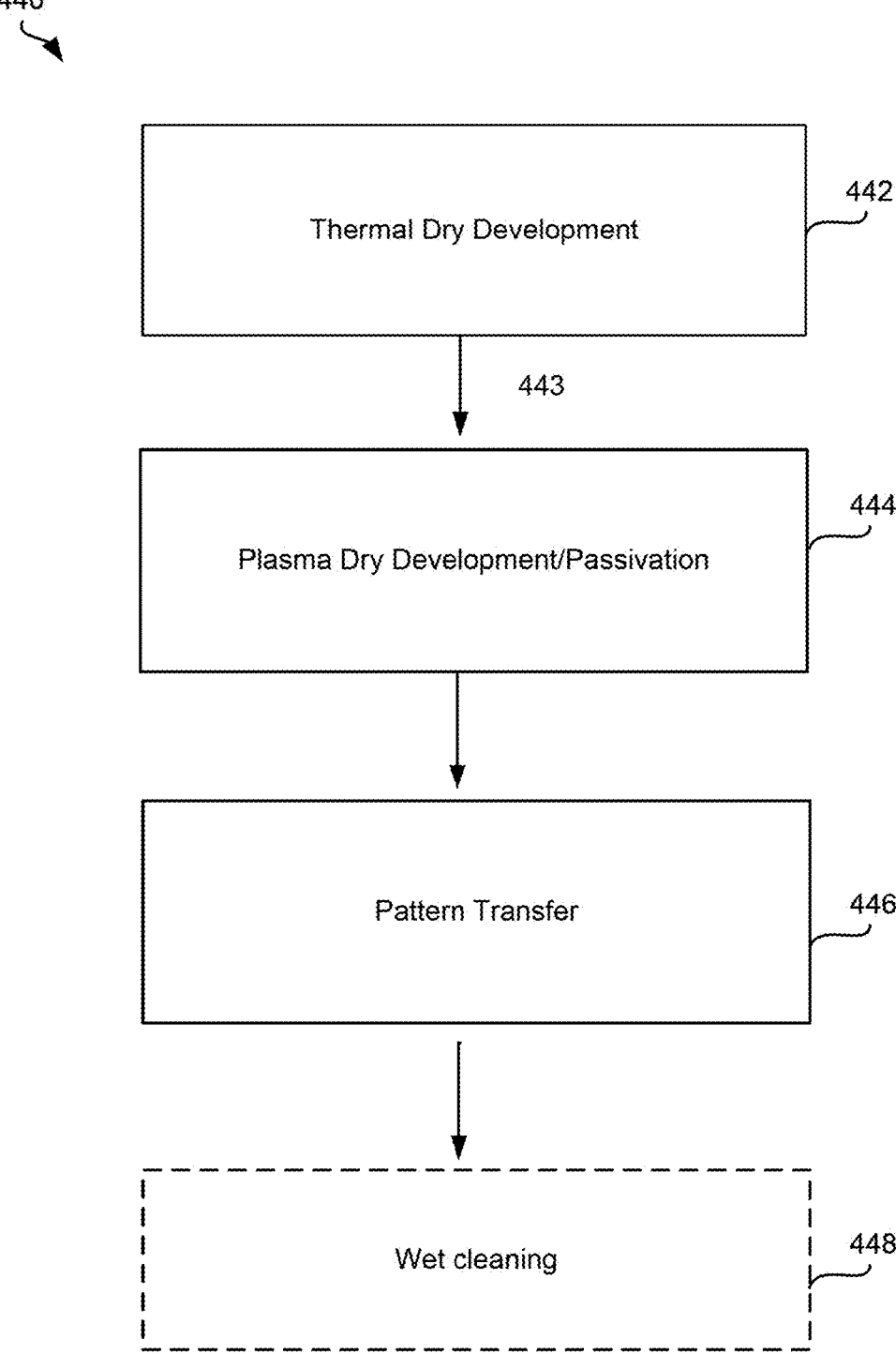
FIG. 4D presents a flow diagram for an example method for performing the operations of thermal dry development, plasma dry development and passivating in the same process chamber in accordance with certain disclosed embodiments.
Figure 4E:
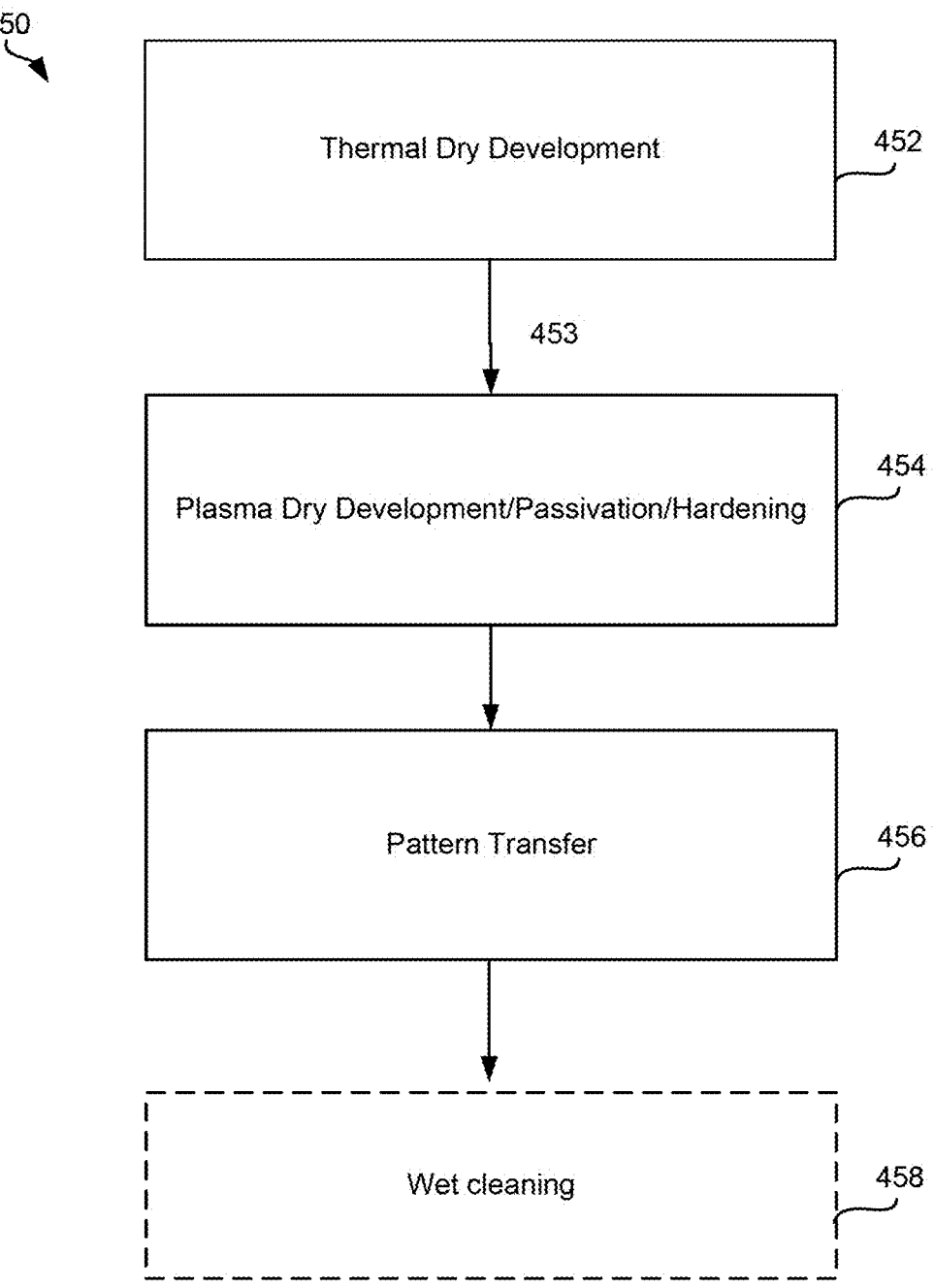
FIG. 4E presents a flow diagram of an example method for performing the operations of dry development, passivation and hardening in the same process chamber in accordance with certain disclosed embodiments.

Exemplary methods for performing the integrated operation of block 312 are described in greater detail in FIGS. 4A, 4B, 4C, 4D, and 4E. Embodiments described in FIGS. 4A, 4B, 4C, 4D, and 4E are meant to be illustrative only and not intended to be limiting to the scope of block 312 of the process 300. FIG. 4A can describe an aspect of block 312 where dry development and passivation are performed in the same process chamber. FIG. 4B can describe an aspect of block 312 where thermal dry development and plasma dry development are performed in the same process chamber. FIG. 4C can describe an aspect of block 312 where dry development and hardening are performed in the same process chamber. FIG. 4D can describe an aspect of block 312 where thermal dry development, plasma dry development and passivation are performed in the same process chamber. FIG. 4E can describe an aspect of block 312 where thermal dry development, plasma dry development, passivation and hardening are performed in the same process chamber.

FIG. 4A presents a flow diagram for an example process 410 for performing the operations of dry development and passivating in the same process chamber in accordance with certain disclosed embodiments. For some photoresists, under some process conditions, only a thermal dry development process is required. That is, plasma dry development may not be necessary.

The operation at block 412 may be a dry development process. As described herein, dry development processes can be used to process a photoresist film. Non-limiting processes can include use of halides, such as hydrogen halide (e.g., HBr, HCl, etc.), hydrogen and halogen gas (e.g., $H_2$ and $Cl_2$, $H_2$ and $Br_2$, etc.), boron trichloride, an organic halide, an acyl halide, a carbonyl halide, a thionyl halide, or mixtures thereof. While this disclosure is not limited to any particular theory or mechanism of operation, the approach is understood to leverage the chemical reactivity of the EUV photoresist films with the clean chemistry (e.g., HCl, HI, HBr, and/or $BCl_3$) to form volatile products using vapors or plasma. Such volatile products can be removed in any manner (e.g., by treating with an aqueous acid, as described herein). The EUV photoresist films can be removed with etch rates of up to 1 nm/s. The quick removal of EUV photoresist films by these chemistries is applicable to chamber cleaning, backside clean, bevel edge clean, and PR developing. Although the films can be removed using vapors at various temperatures (e.g., HCl or HBr at a temperature greater than −20° C., or $BCl_3$ at a temperature greater than 50° C., for example), a plasma can also be used to further accelerate or enhance the reactivity.

The dry development process can involve a thermal process, a plasma process, or a combination of a thermal process and a plasma process. The thermal process may expose the photoresist film to a process gas that can include one or more halides in a plasma-free process. The plasma process may expose the photoresist film to plasma of an inert gas, a halogen-containing gas, or a combination of an inert gas and a halogen-containing gas. The thermal dry development and the plasma dry development may be performed in the same process chamber at block 412. In negative tone development, the dry development process selective removes less exposed regions of the photoresist film relative to the more exposed regions of the photoresist film.

In some implementations, the dry development is only thermal dry development. Between blocks 412 and 414, a flow path 413 may represent a change in process conditions to transition from dry development at block 412 to passivation at block 414. For instance, the flow path 413 can represent a change in pressure occurring within the process chamber such as a rapid pressure drop. A pressure drop may be accomplished within the process chamber enabling both high and low pressure processes to occur in the same chamber. The pressure change may be managed by a throttle valve, a specialized pump, multiple pumps, control of the flow of process gases or a combination of these techniques. If more than one pump is utilized, one of the pumps may be a roughing pump and one of the pumps may be a turbo pump. An optional purge with inert gas may be performed before, after or during the pressure drop operation.

Following dry development at block 412, the operation at block 414 represents a passivation step such as a flash plasma treatment. The dry development at block 412 and the passivation at block 414 may be performed in the same process chamber. In some embodiments, the dry development at block 412 may be performed at a first pressure and the passivation at block 414 may be performed at a second pressure. For example, the second pressure may be the same or lower than the first pressure. In some implementations, the first pressure is at a range between about 5 mTorr and about 760 Torr, and the second pressure is at a range between about 5 mTorr and about 200 mTorr. In some implementations, transitioning the pressure in the process chamber from the first pressure to the second pressure may occur in 10 seconds or less.

Passivation is useful when a photoresist has a surface bromine or chlorine substituents which can destabilize the photoresist. As used herein. "passivation" refers to a surface treatment which entails stabilization of a photoresist by creating a thin layer of a stable film over the photoresist, or by decreasing volatile moieties on the photoresist. In some embodiments, the thin layer of the stable film is an oxide when passivation is performed with an oxygen-containing plasma, while in other embodiments, volatile moieties may be removed when passivation is performed with a hydrogen-containing plasma or nitrogen-containing plasma. Surface smoothing can also be achieved during the operation at block 414. Plasma processes can include transformer coupled plasma (TCP), inductively coupled plasma (ICP) or capacitively coupled plasma (CCP), employing equipment and techniques among those known in the art. For example, a process may be conducted at a pressure of >0.5 mTorr (e.g., such as from 1 mTorr to 100 mTorr), at a power level of <1000 W (e.g., <500 W). Temperatures may be from 30° C., to 300° C. (e.g., from 30° C., to 120° C.). Flow rates may occur at 100 to 5000 standard cubic centimeters per minute (sccm), e.g., from about 500 sccm, for from 1 to 3000 seconds (e.g., 10 seconds to 600 seconds).

In some embodiments, the passivation is a treatment with an oxygen-containing plasma, nitrogen-containing plasma, or hydrogen-containing plasma. In some embodiments, the passivation includes plasma treatment with $O_2$, $O_3$, CO, $CO_2$, $H_2$, $C_xH_y$, $H_2O$, $H_2O_2$, $SO_2$, NO, $NO_2$, $N_2O$, $NH_3$, or mixtures thereof, where x is an integer of 1 to 6 and y is an integer of 2 to 14. The gases may be introduced to the process chamber at a flow rate of from about 100 to about 10000 sccm. The passivation may be performed at a pressure of from about 5 mTorr to about 500) mTorr. The passivation may be performed at a plasma power of from about 50 W to about 300) W. The passivation may be performed at a step time of from about 3 seconds to about 30 seconds. In some implementations, the passivation is a flash treatment, where the flash treatment occurs relatively fast from about 0.5 seconds to about 4 seconds, or from about 0.5 seconds to about 10 seconds.

In some embodiments, the passivation includes an $O_2$ flash treatment at block 412 delivering a flash gas of 1000 sccm to 2000 sccm of oxygen ($O_2$) to the process chamber. In certain embodiments, a radio-frequency power of 100 W to 3,000 W is delivered at 13.56 MHz to transform the flash gas into a plasma. A pressure of 20 mTorr to 100 mTorr is provided. This process may be referred to as an "$O_2$ flash" operation, since the time during which the power is delivered is relatively fast, from about 0.5 seconds to about 10 seconds, or from about 0.5 seconds to about 10 seconds. An optional purge with an inert gas may be performed after dry development and before passivation.

Operation 416 is a pattern transfer process similar to that described for operation 116 in FIG. 1 above.

Operation 418 is an optional cleaning process that may be performed to remove metal oxide as well as other contaminants. The cleaning process occurs after opening the process chamber. For the backside and bevel edge clean process, the vapor and/or the plasma can be limited to a specific region of the wafer to ensure that only material on the backside and the bevel edge are removed, without any film degradation on the frontside of the wafer. The photoresist films being removed are generally composed of Sn, O and C, but the same clean approaches can be extended to films of other metal oxide resists and materials. In addition, this approach can also be used for film strip and photoresist rework.

For a wet cleaning, solutions include compounds such as tetramethylammonium hydroxide (TMAH), complexing amines such as ethylene diamine or diethylene triamine, semi-aqueous fluoride strippers or diluted hydrofluoric acid strippers. Metal oxides can be removed by using an acid such as citric acid, acetic acid, octanoic acid or other organic or inorganic acids can be used. Additionally, very dilute (i.e. less than 0/1%) peroxide-containing acids such as sulfuric-peroxide mixtures can also be used. Combinations of any of the above-mentioned wet cleaners may also be utilized.

FIG. 4B illustrates a process 420 for integrated thermal dry development and plasma dry development in a single process chamber in accordance with certain disclosed embodiments. The operation at block 422 is a thermal dry development. Non-limiting processes can include use of halides, such as hydrogen halide (e.g., HBr, HCl, etc.), hydrogen and halogen gas (e.g., $H_2$ and $Cl_2$, $H_2$ and $Br_2$, etc.), boron trichloride, an organic halide, an acyl halide, a carbonyl halide, a thionyl halide, or mixtures thereof. While this disclosure is not limited to any particular theory or mechanism of operation, the approach is understood to leverage the chemical reactivity of the EUV photoresist films with the clean chemistry (e.g., HCl, HI, HBr, and/or $BCl_3$) to form volatile products. Such volatile products can be removed in any manner (e.g., by treating with an aqueous acid, as described herein). The EUV photoresist films can be removed with etch rates of up to 1 nm/s. The quick removal of EUV photoresist films by these chemistries is applicable to chamber cleaning, backside clean, bevel edge clean, and PR developing. The films can be removed using vapors at various temperatures (e.g., HCl or HBr at a temperature greater than –20° C., or $BCl_3$ at a temperature greater than 50° C., for example).

In thermal dry development processes, the substrate is exposed to dry development chemistry (e.g., a Lewis acid) in a vacuum chamber (e.g., oven). Suitable chambers can include a vacuum line, a dry development chemistry gas (e.g., HBr, HCl) line, and heaters for temperature control. In some embodiments, the chamber interior can be coated with corrosion resistant films, such as organic polymers or inorganic coatings. One such coating is polytetrafluoroethylene ((PTFE). e.g., Teflon™).

The thermal process may expose the photoresist film to a process gas that can include one or more halides in a plasma-free process. In thermal dry development processes, the thermal dry development may be conducted at a pressure between about 5 mTorr and about 760 Torr, such as about 300 mTorr. The temperature may be between about –60° C., and about 120° C., or between about –20° C., and about 60° C., such as about –10° C. Flow rates of the process gas(es) in the thermal dry development process may be between about 10 sccm and about 10000 sccm, between about 100 sccm and about 3000 sccm, such as about 500 sccm HBr or HCl. The thermal dry development process may expose the substrate to process gas(es) for a time of about 10 seconds to about 1 minute, dependent on the photoresist film and their composition and properties. In some embodiments, the pressure is 400-500 mTorr for a duration of 10 to 20 seconds.

Between blocks 422 and 424, a flow path 423 may represent a change in process conditions to transition from thermal dry development at block 422 to plasma dry development at block 424. For instance, the flow path 423 can represent a change in pressure occurring within the process chamber such as a rapid pressure drop. A pressure drop may be accomplished within the process chamber enabling both high and low pressure processes to occur in the same chamber. The pressure change may be managed by a throttle valve, a specialized pump, multiple pumps, control of the flow of process gases or a combination of these techniques. If more than one pump is utilized, one of the pumps may be a roughing pump and one of the pumps may be a turbo pump. An optional purge with inert gas may be performed before, after or during the pressure drop operation.

Following thermal dry development at block 422, the operation at block 424 represents a plasma dry development.

The thermal dry development at block 422 and the plasma dry development at block 424 may be performed in the same process chamber. In some embodiments, the thermal dry development at block 422 may be performed at a first pressure and the plasma dry development at block 424 may be performed at a second pressure. For example, the second pressure may be the same or lower than the first pressure. In some implementations, the first pressure is at a range between about 5 mTorr and about 760 Torr, and the second pressure is at a range between about 5 mTorr and about 200 mTorr. In some implementations, transitioning the pressure in the process chamber from the first pressure to the second pressure may occur in 10 seconds or less.

Following thermal dry development at block 422, the operation at block 424 represents a plasma dry development step, where both operations are performed in the same process chamber. Plasma dry development may perform a descumming and/or smoothing operation. Plasma processes include transformer coupled plasma (TCP), inductively coupled plasma (ICP) or capacitively coupled plasma (CCP), employing equipment and techniques among those known in the art. Plasma dry development may be performed at a pressure greater than about 0.5 mTorr, such as between about 1 mTorr and about 200 mTorr, or between about 5 mTorr and about 100) mTorr. Plasma dry development may apply a plasma power less than about 1000 W, such as between about 1 W and about 1000 W, or between about 1 W and about 500 W. Plasma dry development may occur at temperatures between about –60° C., and about 120° C., such as between about –20° C., and about 60° C. Flow rates may occur at 100 to 1000 standard cubic centimeters per minute (sccm). e.g., from about 500 sccm, for from 1 to 3000 seconds (e.g., 10 seconds to 600 seconds).

In some embodiments, plasma dry development utilizes an inert carrier gas such as argon (Ar) or helium (He). In some embodiments, plasma dry development utilizes at least one halogen-containing gas. For example, the halogen-containing gas can include HBr, HCl, HF, HI, $Br_2$, $Cl_2$, $F_2$, $I_2$, $BCl_3$, or combinations thereof. The halogen-containing gas may be delivered in an inert carrier gas. In some cases, the halogen-containing gas(es) may be deployed to remove scum during plasma dry development. In some embodiments, plasma dry development utilizes at least one carbon-containing gas. For example, the carbon-containing gas can include methane ($CH_4$). In some embodiments, plasma dry development utilizes at least one hydrogen-containing gas. For example, the hydrogen-containing gas can include hydrogen gas ($H_2$). In some embodiments, plasma dry development utilizes at least one nitrogen-containing gas. For instance, the nitrogen-containing gas can include nitrogen gas ($N_2$).

Under certain dry development process conditions, specific combinations of reactants may be advantageous for plasma dry development. Combinations may include, but are not limited to, HBr and $N_2$; HBr and $H_2$; HBr and $Cl_2$; HBr and HCl; HBr and $BCl_3$; $BCl_3$ and $Cl_2$; $BCl_3$ and HBr; $BCl_3$ and $CH_4$; $CH_4$ and $Cl_2$; $CH_4$, $Cl_2$ and $N_2$; $CH_4$ and HCl; or $CH_4$ and HBr. In some implementations, the aforementioned combinations for plasma dry development at block 424 may follow thermal dry development at block 422 that utilizes a hydrogen halide such as HBr.

Where the halide reactant flows are of hydrogen gas and halide gas, a remote plasma/UV radiation is used to generate radicals from the $H_2$ and $Cl_2$ and/or $Br_2$, and the hydrogen and halide radicals are flowed to the reaction chamber to contact the EUV photoresist on the substrate layer of the wafer. Suitable plasma power may range from 100 W to 500

W, with no bias. It should be understood that while these conditions are suitable for some processing reactors, a wider range of process conditions may be used according to the capabilities of the processing reactor. Though not shown in FIG. 4B, it will be understood that post-development processes such as passivation and/or hardening may be performed in the same process chamber as thermal dry development and plasma dry development.

Operation 426 is a pattern transfer process, similar to that described for operation 116 in FIG. 1 above.

Returning to FIG. 4B, subsequent to the pattern transfer, an optional cleaning process 428 may be performed to remove metal oxide as well as other contaminants. The cleaning process occurs after opening the chamber. For the backside and bevel edge clean process, the vapor and/or the plasma can be limited to a specific region of the wafer to ensure that only materials on the backside and the bevel edge are removed, without any film degradation on the frontside of the wafer. The EUV photoresist films being removed are generally composed of Sn, O and C, but the same clean approaches can be extended to films of other metal oxide resists and materials. In addition, this approach can also be used for film strip and photoresist rework.

For a wet cleaning, solutions include compounds such as tetramethylammonium hydroxide (TMAH), complexing amines such as ethylene diamine or diethylene triamine, semi-aqueous fluoride strippers or diluted hydrofluoric acid strippers. Metal oxides can be removed by using an acid such as citric acid, acetic acid, octanoic acid or other organic or inorganic acids can be used. Additionally, very dilute (i.e. less than 0/1%) peroxide-containing acids such as sulfuric-peroxide mixtures can also be used. Combinations of any of the above-mentioned wet cleaners may also be utilized.

FIG. 4C illustrates a process 430 for integrated dry development and hardening in a single process chamber in accordance with certain disclosed embodiments. The operation at block 432 is a thermal dry development. The operation at block 432 is similar to what is described at block 422 in FIG. 4B.

Between blocks 432 and 434, a flow path 433 may represent a change in process conditions to transition from thermal dry development at block 432 to plasma dry development and hardening at block 434. Specifically, the flow path 433 can represent a change in pressure occurring within the process chamber such as a rapid pressure drop. A pressure drop may be accomplished within the process chamber enabling both high and low pressure processes to occur in the same chamber. The pressure change may be managed by a throttle valve, a specialized pump, multiple pumps, control of the flow of process gases or a combination of these techniques. If more than one pump is utilized, one of the pumps may be a roughing pump and one of the pumps may be a turbo pump. An optional purge with inert gas may be performed before, after or during the pressure drop operation.

Following thermal dry development at block 432, the operation at block 434 represents a plasma dry development and/or hardening. In some cases, the operation at block 434 is only a hardening step. In some other cases, the operation at block 434 is both a plasma dry development and hardening step. The thermal dry development at block 432 and the plasma dry development and/or hardening at block 434 may be performed in the same process chamber. In some embodiments, the thermal dry development at block 432 may be performed at a first pressure and the plasma dry development and hardening at block 434 may be performed at a second pressure. For example, the second pressure may be the same or lower than the first pressure. In some implementations, the first pressure is at a range between about 5 mTorr and about 760 Torr, and the second pressure is at a range between about 5 mTorr and about 200 mTorr. In some implementations, transitioning the pressure in the process chamber from the first pressure to the second pressure may occur in 10 seconds or less.

Aspects of plasma dry development at block 434 is similar to what is described at block 424 of FIG. 4B. Aspects of hardening at block 434 is described below. A post-development process such as hardening may be performed in the same process chamber as thermal dry development at block 432.

For certain applications, hardening of a photoresist is desirable. "Hardening" as used herein, refers to a treatment of the photoresist surface and interior which condenses the material by processes such as cross-linking and/or breaking metal-carbon bonds of the photoresist. This can serve to densify the material of the photoresist. In some implementations, hardening may be achieved by treatment with a plasma of inert gas. In one example, hardening by treatment with plasma can involve plasma ignition to generate argon, nitrogen, xenon, or helium reactive species (e.g., ions and/or radicals). In some implementations, hardening may be achieved by a flash treatment such as an $O_2$ flash treatment, which can perform both passivation and hardening. The pressure may be from about 5 mTorr to about 500 mTorr and the plasma power (e.g., TCP power) may be from about 50 W to about 300 W in certain embodiments. The gas flow rate may be from about 100 sccm to about 1000 sccm, with a step time of about 5 mTorr to about 500 mTorr.

In some alternative implementations, hardening may be achieved by exposure to UV light. For instance, exposure to UV light for hardening may involve exposure from one or more UV lamps at a power of from about 10 W to about 1000 W and a pressure of from about 5 mTorr to about 760 Torr. In some implementations, hardening may be achieved by a combination of exposure to plasma of inert gas and exposure to UV light.

In some embodiments, hardening may take place during or after plasma dry development. In some embodiments, hardening may take place without plasma dry development.

Operation 436 is a pattern transfer process, similar to that described for operation 116 in FIG. 1 above.

Operation 438 is an optional cleaning process. Aspects of the cleaning process at block 438 is similar to what is described at block 428 of FIG. 4B.

FIG. 4D illustrates a process 440 for integrated thermal dry development, plasma dry development and passivation in a single process chamber in accordance with certain disclosed embodiments. The operation at block 442 is a thermal dry development. The operation at block 442 is similar to what is described at block 422 in FIG. 4B.

Between blocks 442 and 444, a flow path 443 may represent a change in process conditions to transition from thermal dry development at block 442 to plasma dry development and passivation at block 444. In particular, the flow path 443 can represent a change in pressure occurring within the process chamber such as a rapid pressure drop. A pressure drop may be accomplished within the process chamber enabling both high and low pressure processes to occur in the same chamber. The pressure change may be managed by a throttle valve, a specialized pump, multiple pumps, control of the flow of process gases or a combination of these techniques. If more than one pump is utilized, one of the pumps may be a roughing pump and one of the pumps may be a turbo pump. An optional purge with inert gas may be performed before, after or during the pressure drop operation.

Following thermal dry development at block 442, the operation at block 444 represents a plasma dry development and passivation. The thermal dry development at block 442 and the plasma dry development and passivation at block 444 may be performed in the same process chamber. In some embodiments, the thermal dry development at block 442 may be performed at a first pressure and the plasma dry development and passivation at block 444 may be performed at a second pressure. For example, the second pressure may be the same or lower than the first pressure. In some implementations, the first pressure is at a range between about 5 mTorr and about 760 Torr, and the second pressure is at a range between about 5 mTorr and about 200 mTorr. In some implementations, transitioning the pressure in the process chamber from the first pressure to the second pressure may occur in 10 seconds or less.

Aspects of plasma dry development at block 444 is similar to what is described at block 424 of FIG. 4B. Aspects of passivation at block 444 is similar to what is described at block 414 of FIG. 4A, in some implementations, the passivation is a plasma flash treatment such as an $O_2$ plasma flash treatment. A post-development process such as passivation may be performed in the same process chamber as thermal dry development at block 442. In some embodiments, passivation may take place during or after plasma dry development.

Operation 446 is a pattern transfer process, similar to that described for operation 116 in FIG. 1 above.

Operation 448 is an optional cleaning process. Aspects of the cleaning process at block 448 is similar to what is described at block 428 of FIG. 4B.

FIG. 4E illustrates an alternative process 450 for integrated dry development, passivation and hardening all in one single process chamber in accordance with certain disclosed embodiments. The operation at block 452 represents thermal dry development as described for block 422 in FIG. 4B above.

Between blocks 452 and 454, flow path 453 represents the pressure change procedure occurring within the process chamber. As described for flow path 453 above, the required pressure drop is accomplished within the process chamber enabling both high and low pressure processes to occur in the same chamber. The pressure change may be managed by a throttle valve, a specialized pump, multiple pumps, control of the flow of process gases or a combination of these techniques. If more than one pump is utilized, one of the pumps may be a roughing pump and one of the pumps may be a turbo pump.

Following thermal dry development at block 452, the operation at block 454 represents plasma dry development, passivation and hardening processes which can be performed all in one (the same) process chamber.

The plasma dry development and passivation are the same as described above with reference to FIGS. 4A, 4B, 4C, and 4D. Aspects of hardening are described above with reference to FIG. 4C.

Returning to FIG. 4E, optional purges with inert gas may be performed in conjunction with operation 453, between operations 454 and 456, as well as between plasma dry development and passivation and/or between plasma dry development and hardening.

Operation 456 is a is a pattern transfer process, similar to that described for operation 116 in FIG. 1 above.

Subsequent to operation 456, an optional cleaning process 458 may be performed, similar to the operation as described for block 428 in FIG. 4B above.

FIGS. 5A-5E are cross-sectional schematic illustrations of various processing stages including thermal dry development, plasma dry development, and passivation in accordance with certain disclosed embodiments. The processing stages may be performed in a single process chamber.

Figures 5A, 5B, 5C, 5D, 5E:
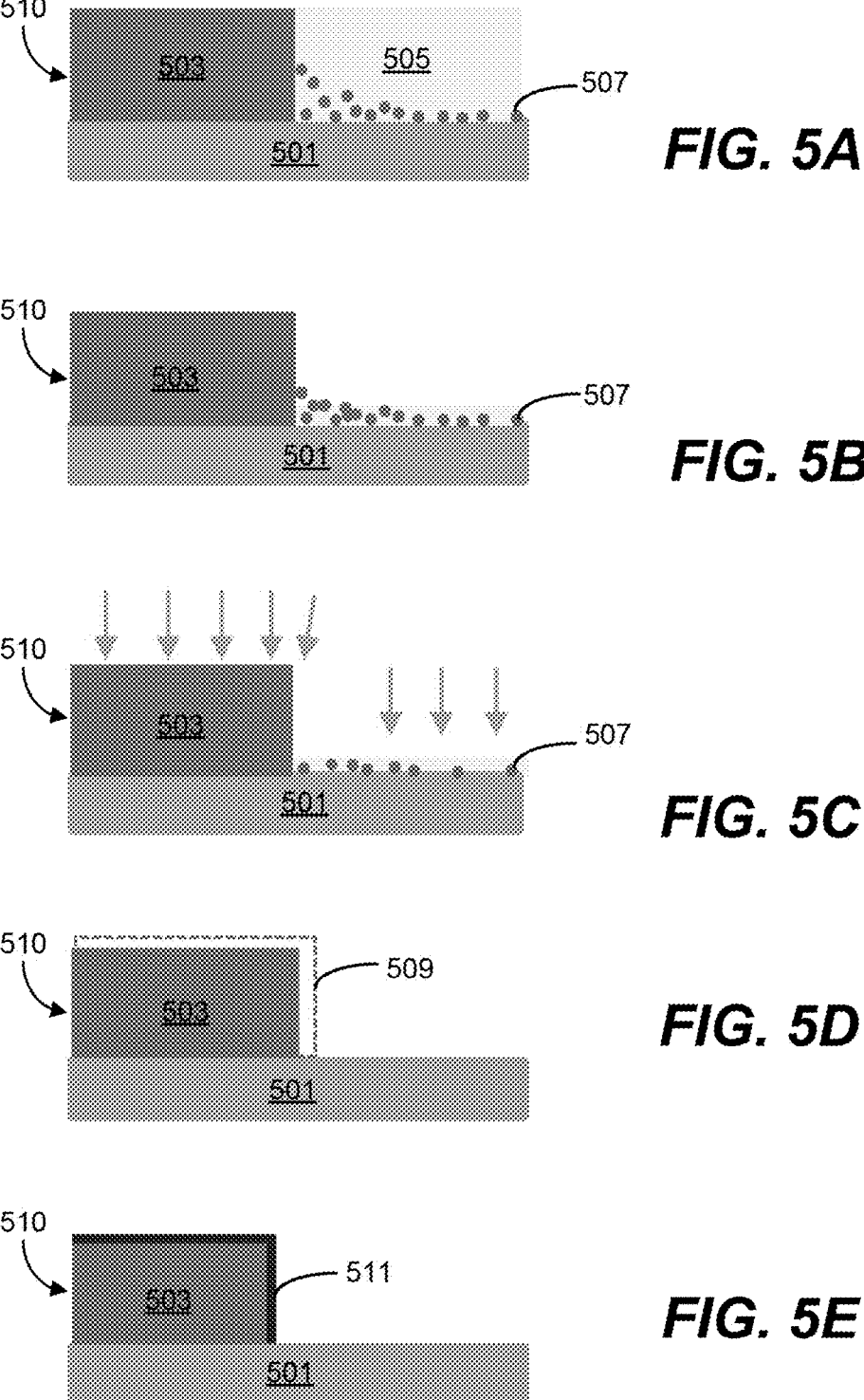
FIGS. 5A-5E are cross-sectional schematic illustrations of various processing stages including thermal dry development, plasma dry development, and passivation in accordance with certain disclosed embodiments.

In FIG. 5A, a photoresist 510 such as a metal-containing photoresist is provided on a semiconductor substrate 501. The photoresist 510 may be photopatterned so that the photoresist 510 includes exposed regions 503 (or more exposed regions) and unexposed regions 505 (or less exposed regions). As shown in FIG. 5A, particles or clusters of metal/metal oxide 507 may occupy the unexposed regions 505. In some implementations, the photopatterned photoresist 510 may be provided in a process chamber after EUV exposure in an EUV scanner.

In FIG. 5B, the photoresist 510 is developed using a thermal dry development process in the process chamber. As thermal dry development proceeds, clusters of metal/metal oxide 507 become more concentrated. The clusters of metal/metal oxide 507 are generally difficult to remove. Thermal dry development may selectively remove the unexposed regions 505 relative to the exposed regions 503. Bulk removal of the unexposed regions 505 may occur under thermal dry development. Thermal dry development may be selective for removal of organic material. After bulk removal of the unexposed regions 505, the clusters of the metal/metal oxide 507 may remain on the surface of the semiconductor substrate 501 as scum. In some implementations, thermal dry development may be performed by exposure to a halide chemistry such as a hydrogen halide. By way of an example, the hydrogen halide may include HBr. In some implementations, thermal dry development may be performed at a first pressure in the process chamber, where the first pressure may be between about 5 mTorr and about 760 Torr. In some implementations, thermal dry development may be performed at a temperature between about −20° C., and about 60° C. and a flow rate of process gas may be between about 100 sccm and about 3000 sccm.

In FIG. 5C, the photoresist 510 is developed using a plasma dry development process in the process chamber. As plasma dry development proceeds, the clusters of metal/metal oxide 507 are removed. In addition, the plasma dry development may remove or substantially remove a remainder of the unexposed regions 505. In some implementations, the plasma dry development can employ a plasma of an inert gas species such as He or Ar. In some implementations, the plasma dry development can employ a plasma of a halogen-containing species. For example, the halogen-containing gas can include HBr, HCl, HF, HI, $Br_2$, $Cl_2$, $F_2$, $I_2$, $BCl_3$, or combinations thereof. The halogen-containing gas may be delivered in an inert carrier gas. In some implementations, the plasma dry development may employ a combination of a plasma of an inert gas species and a plasma of a halogen-containing gas. In some embodiments, the plasma dry development includes a cyclic plasma dry development. In one example, the cyclic plasma dry development may alternate between exposure to an inert gas plasma and a halogen-containing gas plasma. In some embodiments, the plasma dry development includes a continuous plasma dry development. The continuous plasma dry development may be performed at variable power, at constant power and pulsing bias or at variable power and pulsing bias. In some embodiments, the plasma dry development is deployed to remove scum from the surface of the semiconductor substrate 501.

In some embodiments, specific combinations of reactants may be used in the plasma dry development. Combinations may include, but are not limited to, HBr and $N_2$; HBr and $H_2$; HBr and $Cl_2$; HBr and HCl; HBr and $BCl_3$; $BCl_3$ and $Cl_2$; $BCl_3$ and HBr; $BCl_3$ and $CH_4$; $CH_4$ and $Cl_2$; $CH_4$, $Cl_2$ and $N_2$; $CH_4$ and HCl; or $CH_4$ and HBr. In some implementations, plasma dry development may be performed at a second pressure in the process chamber, where the second pressure may be between about 5 mTorr and about 200 mTorr. In some implementations, plasma dry development may be performed at a temperature between about –20° C., and about 60° C., a flow rate of process gas may be between about 100 sccm and about 3000 sccm, a TCP power may be between about 1 W and about 500 W, and a bias voltage may be between about 1 V and about 300 V.

In FIG. 5D, the photoresist 510 is shown after plasma dry development. The clusters of metal/metal oxide 507 are removed and the unexposed regions 505 of the photoresist 510 are removed. In some embodiments, critical dimension (CD) loss 509 occurs as a result of plasma dry development. However, the directional nature of the plasma dry development and other conditions associated with the plasma dry development can remove the clusters of metal/metal oxide 507 with minimal CD loss 509. Moreover, plasma dry development may be utilized to improve line width roughness (LWR) performance.

In FIG. 5E, the photoresist 510 is shown after passivation. Passivation may be performed in the same process chamber as thermal dry development and plasma dry development. Passivation may occur under the same pressure as the plasma dry development. In some embodiments, passivation may create a passivation layer 511 on exposed surfaces of the photoresist 510. For instance, the passivation layer 511 may include an oxide and/or nitride and/or carbon. In some embodiments, the passivation is a treatment with an oxygen-containing plasma, nitrogen-containing plasma, or hydrogen-containing plasma. For instance, the passivation includes plasma treatment with $O_2$, $O_3$, CO, $CO_2$, $H_2$, $C_xH_y$, $H_2O$, $H_2O_2$, $SO_2$, NO, $NO_2$, $N_2O$, $NH_3$, or mixtures thereof, where x is an integer of 1 to 6 and y is an integer of 2 to 14. In one example, the passivation includes an $O_2$ flash treatment, where the photoresist 510 is exposed to $O_2$ plasma in a relatively fast timing, such as from about 0.5 seconds to about 4 seconds. The passivation may provide in-situ surface stabilization to prevent outgassing of the photoresist 510. The passivation may additionally or alternatively perform hardening of the photoresist 510. The passivation may additionally or alternatively provide surface smoothing of the photoresist 510.

The foregoing description is merely illustrative in nature and is in no way intended to limit the disclosure, its application or uses. The broad teaching of the disclosure can be implemented in a variety of forms. Therefore, while this disclosure includes particular examples, the true scope of the disclosure should not be so limited since other modifications will become apparent upon a study of the drawings, the specification and the following claims. It should be understood that one or more steps within a method may be executed in a different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodi-ments are not mutually exclusive, and permutations of one or more embodiments with one another remain within the scope of this disclosure.

Apparatus

An apparatus of the present disclosure is configured for dry development of photoresist, and in some cases is also configured for post-development treatment of a photoresist mask. The apparatus may be configured for other processing operations such as deposition, bevel and backside cleaning, post-application baking, EUV scanning, post-exposure baking, development, etching, and other operations. In some implementations, the apparatus is configured to perform multiple dry operations. In some implementations, the apparatus is configured to perform a combination of wet and dry operations. The apparatus may include a single wafer chamber or multiple stations in the same process chamber. With multiple stations in the same process chamber, various processing operations such as those described in the present disclosure may be performed in different stations in the same process chamber. In some embodiments, a process chamber for post-development treatment of the present disclosure may be performed in the same chamber as development, in the same chamber as pattern transfer etching, or in the same chamber as both development and pattern transfer etching.

The apparatus configured for dry development, and in some cases also configured for dry development and post-development treatment, includes a process chamber with a substrate support. The apparatus may include at least a reactive gas source in fluid communication with the process chamber. The apparatus may include one or more gas lines for delivery of one or more reactive gas species. In some embodiments, the one or more reactive gas species may include an organic gas species, an organometallic gas species, a metal-containing gas species, or combinations thereof. In some embodiments, the one or more reactive gas species may include an oxygen-containing gas, a carbon-containing gas, a hydrogen-containing gas, a nitrogen-containing gas, a halogen-containing gas, or combinations thereof. The one or more reactive gas species may be delivered to the process chamber via the one or more gas lines to develop a photoresist and/or treat a post-developed photoresist mask. The apparatus may include one or more heating elements for temperature control. Such heating elements may be provided in the process chamber and/or in the substrate support. Alternatively, such heating elements may be provided outside the process chamber. In some implementations, the apparatus may include a plasma source for generating plasma during development and/or treatment of the post-developed photoresist mask. In some implementations, the one or more reactive species may selectively deposit a protective film on the post-developed photoresist mask. The apparatus may further include one or more sensors for sensing particle count, wafer count, thickness count, or other parameters for triggering an endpoint of the post-development treatment.

Figure 6:
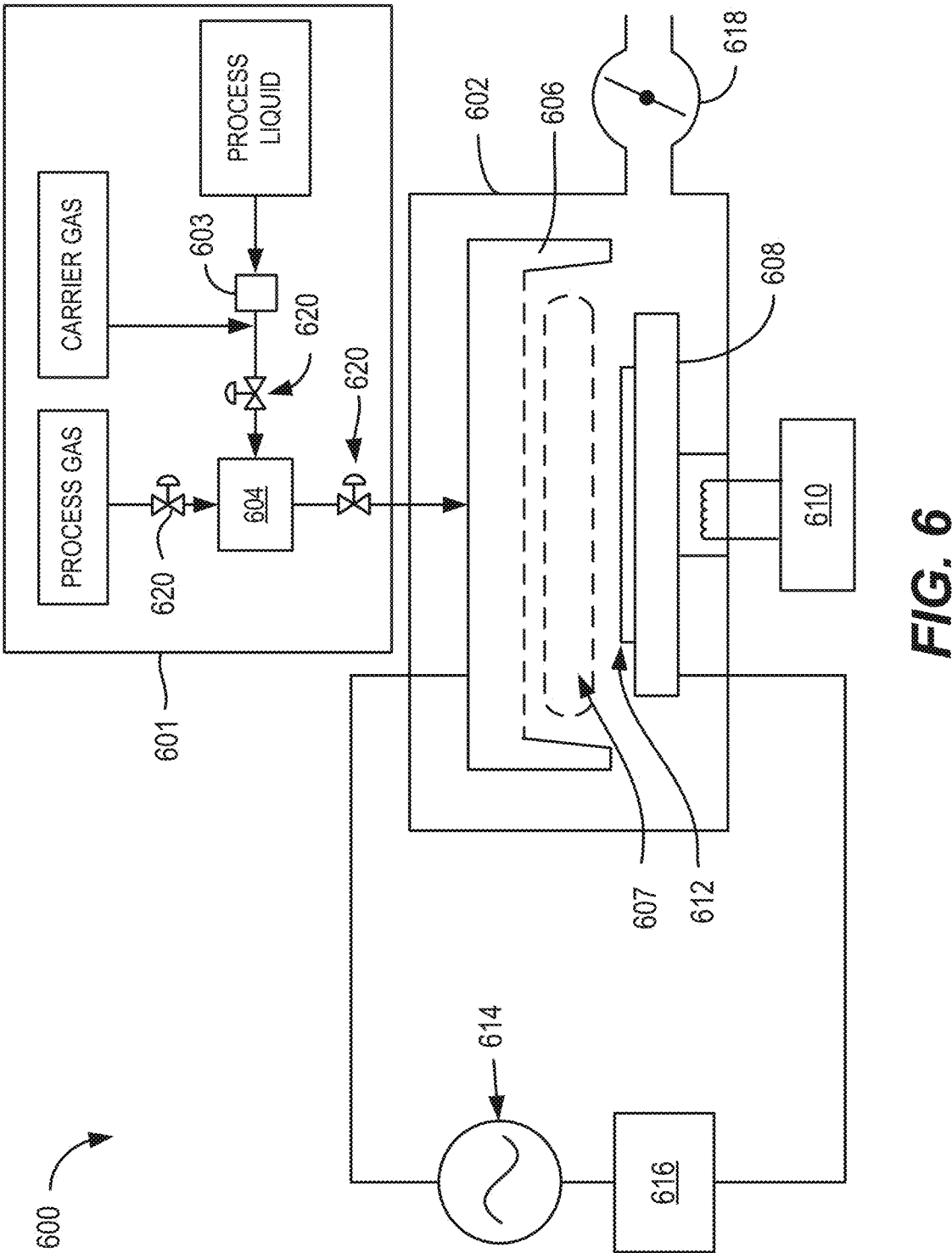
FIG. 6 depicts a schematic illustration of an example process station for maintaining an environment that is suitable for performing photoresist development and other photoresist treatment operations in accordance with certain disclosed embodiments.

FIG. 6 depicts a schematic illustration of an example process station for maintaining an environment that is suitable for performing photoresist development and photoresist treatment operations according to some embodiments. For simplicity, the process station 600 is depicted as a standalone process station having a process chamber body 602 for maintaining a low-pressure environment. However, it will be appreciated that a plurality of process stations 600 may be included in a common process tool environment. Further, it will be appreciated that, in some embodiments, one or more hardware parameters of process station 600, including those discussed in detail below, may be adjusted programmatically by one or more computer controllers.

Figure 7:
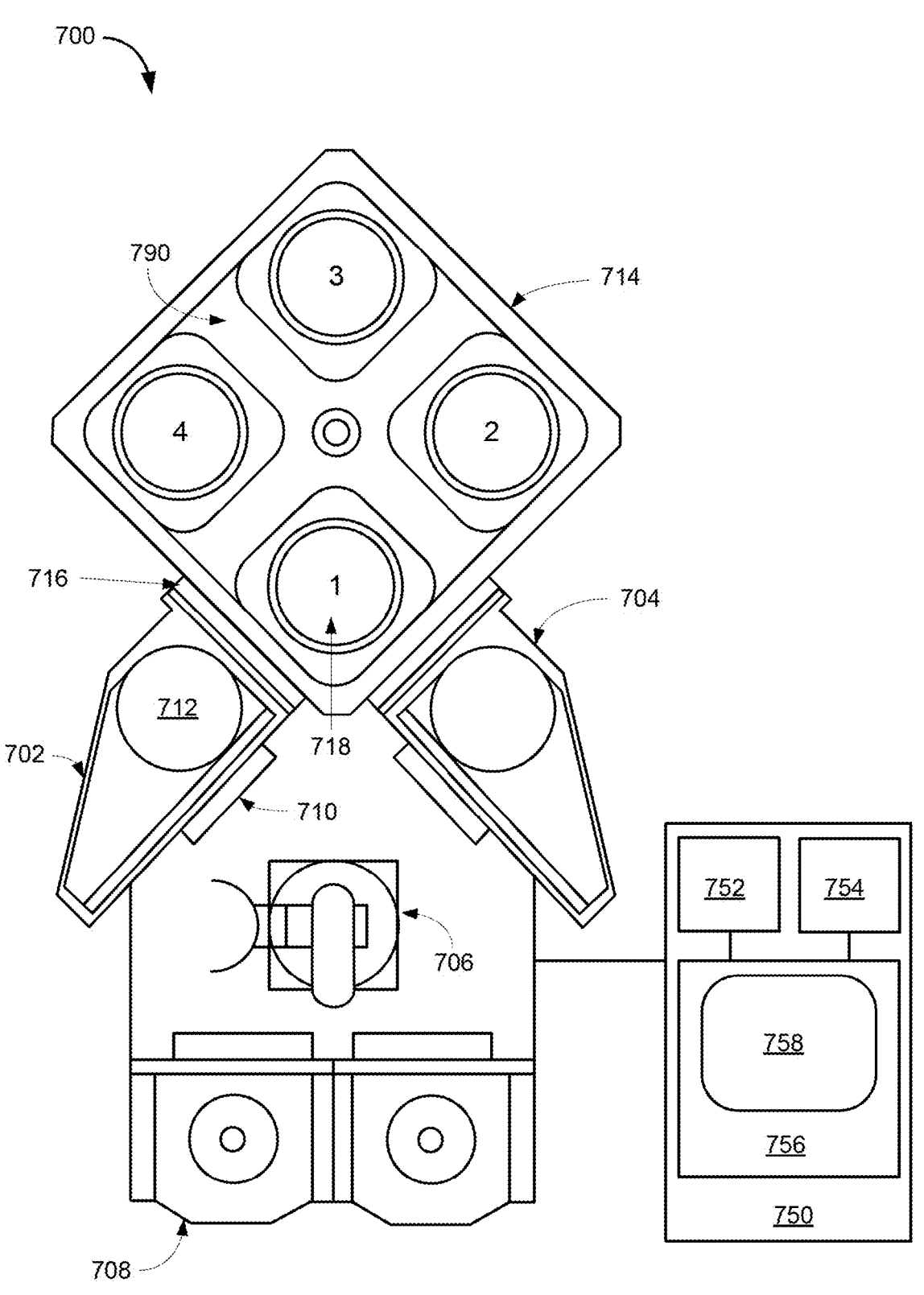
FIG. 7 depicts a schematic illustration of an example multi-station processing tool suitable for implementation of photoresist development and other photoresist treatment operations described herein in accordance with certain disclosed embodiments.

A plurality of process stations 600 may be included in a common low-pressure process tool environment. For example. FIG. 7 depicts an implementation of a multi-station processing tool 700. In some implementations, one or more hardware parameters of the process tool 700 including those discussed in detail below may be adjusted programmatically by one or more computer controllers 750).

Figure 9:
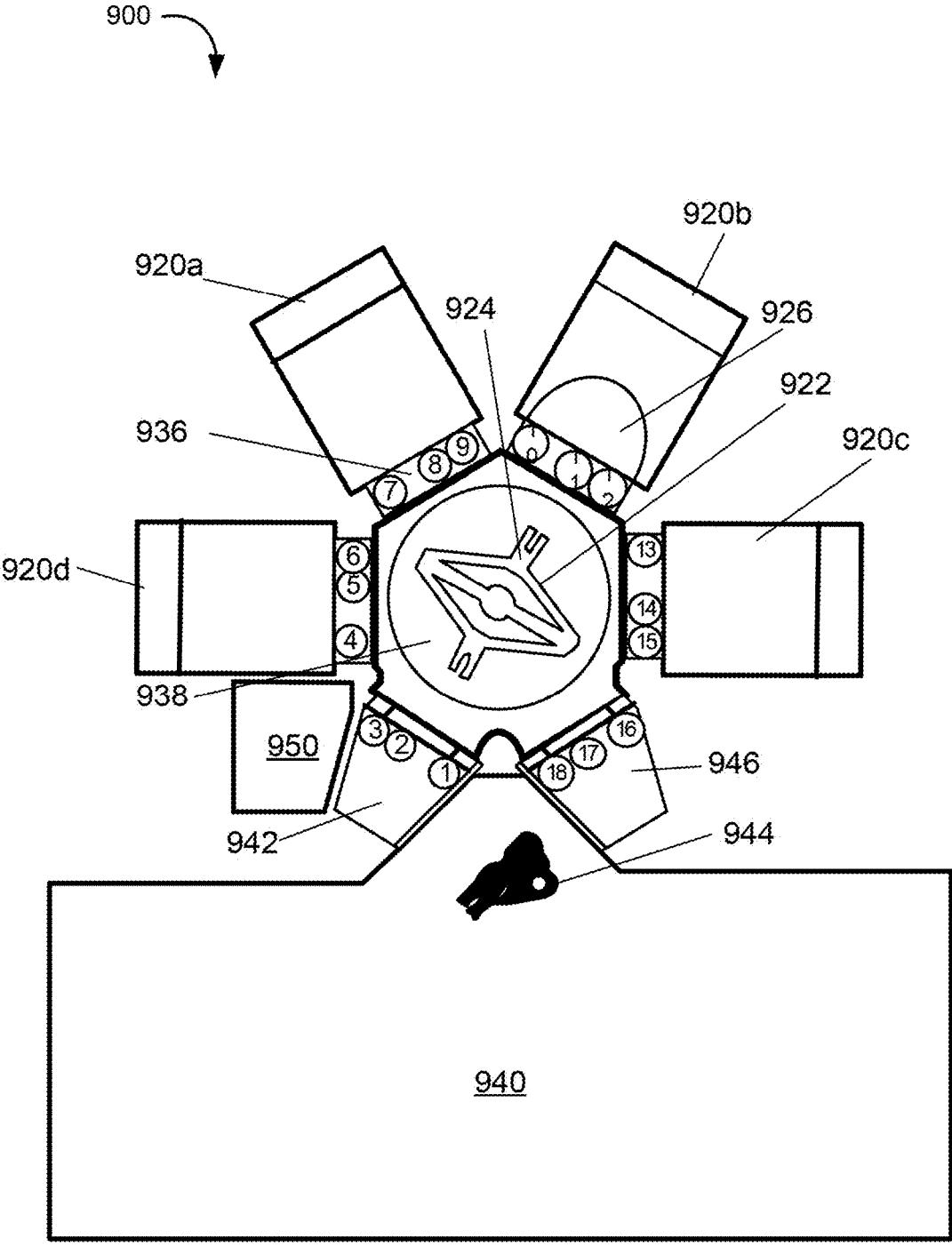
FIG. 9 depicts a semiconductor process cluster tool architecture with vacuum-integrated deposition and patterning modules that interface with a vacuum transfer module, suitable for implementations of processes described herein in accordance with certain disclosed embodiments.

A process station may be configured as a module in a cluster tool. FIG. 9 depicts a semiconductor process cluster tool architecture with vacuum-integrated deposition and patterning modules suitable for implementation of the implementations described herein. Such a cluster process tool architecture can include resist deposition, resist exposure (EUV scanner), resist development, resist rework, and etch modules, as described above and further below with reference to FIGS. 6 and 7.

Returning to FIG. 6, process station 600 fluidly communicates with reactant delivery system 601 for delivering process gases to a showerhead 606. Reactant delivery system 601 optionally includes a mixing vessel 604 for blending and/or conditioning process gases, for delivery to showerhead 606. One or more mixing vessel inlet valves 620 may control introduction of process gases to mixing vessel 604. Where plasma exposure is used, plasma may also be delivered to the showerhead 606 or may be generated in the process station 600. As noted above, in at least some implementations, non-plasma thermal exposure is favored.

FIG. 6 includes an optional vaporization point 603 for vaporizing liquid reactant to be supplied to the mixing vessel 604. In some implementations, a liquid flow controller (LFC) upstream of vaporization point 603 may be provided for controlling a mass flow of liquid for vaporization and delivery to process station 600. For example, the LFC may include a thermal mass flow meter (MFM) located downstream of the LFC. A plunger valve of the LFC may then be adjusted responsive to feedback control signals provided by a proportional-integral-derivative (PID) controller in electrical communication with the MFM.

Showerhead 606 distributes process gases toward substrate 612. In the implementation shown in FIG. 6, the substrate 612 is located beneath showerhead 606 and is shown resting on a pedestal 608. Showerhead 606 may have any suitable shape and may have any suitable number and arrangement of ports for distributing process gases to substrate 612.

In some implementations, pedestal 608 may be raised or lowered to expose substrate 612 to a volume 607 between the substrate 612 and the showerhead 606. It will be appreciated that, in some implementations, pedestal height may be adjusted programmatically by a suitable computer controller. In some implementations, the showerhead 606 may have multiple plenum volumes with multiple temperature controls.

In some implementations, pedestal 608 may be temperature controlled via heater 610. In some implementations, the pedestal 608 may be heated to a temperature of greater than −20° C., and up to 300° C., for example 50° C., to 280° C., such as about 100° C., to 240° C., during development or post-development treatment, as described in disclosed implementations. In some implementations, the heater 610 of the pedestal 608 may include a plurality of independently controllable temperature control zones.

Further, in some implementations, pressure control for process station 600 may be provided by a butterfly valve 618. As shown in the implementation of FIG. 6, butterfly valve 618 throttles a vacuum provided by a downstream vacuum pump (not shown). However, in some implementations, pressure control of process station 600 may also be adjusted by varying a flow rate of one or more gases introduced to the process station 600.

In some implementations, a position of showerhead 606 may be adjusted relative to pedestal 608 to vary a volume between the substrate 612 and the showerhead 606. Further, it will be appreciated that a vertical position of pedestal 608 and/or showerhead 606 may be varied by any suitable mechanism within the scope of the present disclosure. In some implementations, pedestal 608 may include a rotational axis for rotating an orientation of substrate 612. It will be appreciated that, in some implementations, one or more of these example adjustments may be performed programmatically by one or more suitable computer controllers.

Where plasma may be used, for example in descumming, development, treatment, deposition, or smoothing operations, showerhead 606 and pedestal 608 electrically communicate with a radio frequency (RF) power supply 614 and matching network 616 for powering a plasma. In some implementations, the plasma energy may be controlled by controlling one or more of a process station pressure, a gas concentration, an RF source power, an RF source frequency, and a plasma power pulse timing. For example, RF power supply 614 and matching network 616 may be operated at any suitable power to form a plasma having a desired composition of radical species. Examples of suitable powers are up to about 1000 W.

In some implementations, instructions for a computer controller (not shown) may be provided via input/output control (IOC) sequencing instructions. In one example, the instructions for setting conditions for a process phase may be included in a corresponding recipe phase of a process recipe. In some cases, process recipe phases may be sequentially arranged, so that all instructions for a process phase are executed concurrently with that process phase. In some implementations, instructions for setting one or more reactor parameters may be included in a recipe phase. For example, a recipe phase may include instructions for setting a flow rate of an etch gas, such as a hydrogen halide, and time delay instructions for the recipe phase. In some implementations, the controller may include any of the features described below with respect to controller 750 of FIG. 7.

The process chamber may also include a UV exposure module (not shown).

In some embodiments, the process chamber may also include a photoresist thickness sensor module (not shown). The photoresist thickness sensor module may be a spectral reflectometer including a lamp source, an optical cable and a spectrometer system operating within a spectral range of about 200 to about 900 nm. The reflectometer measures in situ wafer reflectance vs, time, and thus can be useful to monitor the thickness of a photoresist during dry development.

As described above, one or more process stations may be included in a multi-station processing tool. FIG. 7 shows a schematic view of an implementation of a multi-station processing tool 700 with an inbound load lock 702 and an outbound load lock 704, either or both of which may include a remote plasma source. A robot 706 at atmospheric pressure is configured to move wafers from a cassette loaded through a pod 708 into inbound load lock 702 via an atmospheric port 710. A wafer is placed by the robot 706 on a pedestal 712 in the inbound load lock 702, the atmospheric port 710 is closed, and the load lock is pumped down. Where the inbound load lock 702 includes a remote plasma source, the wafer may be exposed to a remote plasma treatment to treat the substrate surface in the load lock prior to being introduced into a processing chamber 714. Further, the wafer also may be heated in the inbound load lock 702 as well, for example, to remove moisture and adsorbed gases. Next, a chamber transport port 716 to processing chamber 714 is opened, and another robot (not shown) places the wafer into the reactor on a pedestal of a first station shown in the reactor for processing. While the implementation depicted in FIG. 7 includes load locks, it will be appreciated that, in some implementations, direct entry of a wafer into a process station may be provided.

The depicted processing chamber 714 includes four process stations, numbered from 1 to 4 in the implementation shown in FIG. 7. Each station has a heated pedestal (shown at 718 for station 1), and gas line inlets. It will be appreciated that in some implementations, each process station may have different or multiple purposes. For example, in some implementations, a process station may be switchable between development and etch process modes. Additionally or alternatively, in some implementations, processing chamber 714 may include one or more matched pairs of development and etch process stations. While the depicted processing chamber 714 includes four stations, it will be understood that a processing chamber according to the present disclosure may have any suitable number of stations. For example, in some implementations, a processing chamber may have five or more stations, while in other implementations a processing chamber may have three or fewer stations.

FIG. 7 depicts an implementation of a wafer handling system 790 for transferring wafers within processing chamber 714. In some implementations, wafer handling system 790 may transfer wafers between various process stations and/or between a process station and a load lock. It will be appreciated that any suitable wafer handling system may be employed. Non-limiting examples include wafer carousels and wafer handling robots. FIG. 7 also depicts an implementation of a controller 750 (e.g., system controller) employed to control process conditions and hardware states of process tool 700. Controller 750 may include one or more memory devices 756, one or more mass storage devices 754, and one or more processors 752. Processor 752 may include a CPU or computer, analog, and/or digital input/output connections, stepper motor controller boards, etc.

In some implementations, controller 750 controls all of the activities of process tool 700. Controller 750 executes system control software 758 stored in mass storage device 754, loaded into memory device 756, and executed on processor 752. Alternatively, the control logic may be hard coded in the controller 750. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 758 may include instructions for controlling the timing, mixture of gases, gas flow rates, chamber and/or station pressure, chamber and/or station temperature, wafer temperature, target power levels, RF power levels, substrate pedestal, chuck and/or susceptor position, and other parameters of a particular process performed by process tool 700. System control software 758 may be configured in any suitable way. For example, various process tool component subroutines or control objects may be written to control operation of the process tool components used to carry out various process tool processes, s. System control software 758 may be coded in any suitable computer readable programming language.

In some implementations, system control software 758 may include input/output control (IOC) sequencing instructions for controlling the various parameters described above. Other computer software and/or programs stored on mass storage device 754 and/or memory device 756 associated with controller 750 may be employed in some implementations. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 718 and to control the spacing between the substrate and other parts of process tool 700.

A process gas control program may include code for controlling process gas composition and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, etc.

A heater control program may include code for controlling the current to a heating unit that is used to heat the substrate. Alternatively, the heater control program may control delivery of a heat transfer gas (such as helium) to the substrate.

A plasma control program may include code for setting RF power levels applied to the process electrodes in one or more process stations in accordance with the implementations herein.

A pressure control program may include code for maintaining the pressure in the reaction chamber in accordance with the implementations herein.

In some implementations, there may be a user interface associated with controller 750. The user interface may include a display screen, graphical software displays of the apparatus and/or process conditions, and user input devices such as pointing devices, keyboards, touch screens, microphones, etc.

In some implementations, parameters adjusted by controller 750 may relate to process conditions. Non-limiting examples include process gas composition and flow rates, temperature, pressure, plasma conditions (such as RF bias power levels), etc. These parameters may be provided to the user in the form of a recipe, which may be entered utilizing the user interface.

Signals for monitoring the process may be provided by analog and/or digital input connections of controller 750 from various process tool sensors. The signals for controlling the process may be output on the analog and digital output connections of process tool 700. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

Controller 750 may provide program instructions for implementing the above-described deposition processes. The program instructions may control a variety of process parameters, such as DC power level. RF bias power level, pressure, temperature, etc. The instructions may control the parameters to operate development, clean, and/or etch processes according to various implementations described herein.

The controller 750 will typically include one or more memory devices and one or more processors configured to execute the instructions so that the apparatus will perform a method in accordance with disclosed implementations. Machine-readable media containing instructions for controlling process operations in accordance with disclosed implementations may be coupled to the controller 750.

In some implementations, the controller 750 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller 750, depending on the processing conditions and/or the type of system, may be programmed to control any of the processes disclosed herein, including the delivery of processing gases, temperature settings (e.g., heating and/or cooling), pressure settings, vacuum settings, power settings, radio frequency (RF) generator settings. RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller 750 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller 750 in the form of various individual settings (or program files), defining operational parameters for carrying out a particular process on or for a semiconductor wafer or to a system. The operational parameters may, in some implementations, be part of a recipe defined by process engineers to accomplish one or more processing steps during the fabrication of one or more layers, materials, metals, oxides, silicon, silicon dioxide, surfaces, circuits, and/or dies of a wafer.

The controller 750, in some implementations, may be a part of or coupled to a computer that is integrated with, coupled to the system, otherwise networked to the system, or a combination thereof. For example, the controller 750 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet.

The remote computer may include a user interface that enables entry or programming of parameters and/or settings, which are then communicated to the system from the remote computer. In some examples, the controller 750 receives instructions in the form of data, which specify parameters for each of the processing steps to be performed during one or more operations. It should be understood that the parameters may be specific to the type of process to be performed and the type of tool that the controller 750 is configured to interface with or control. Thus as described above, the controller 750 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an atomic layer etch (ALE) chamber or module, an ion implantation chamber or module, a track chamber or module, an EUV lithography chamber (scanner) or module, a development chamber or module, and any other semiconductor processing systems that may be associated or used in the fabrication and/or manufacturing of semiconductor wafers.

As noted above, depending on the process step or steps to be performed by the tool, the controller 750 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

ICP reactors which, in certain implementations, may be suitable for etch operations suitable for implementation of some implementations, are now described. Although ICP reactors are described herein, in some implementations, it should be understood that capacitively coupled plasma reactors may also be used.

Figure 8:
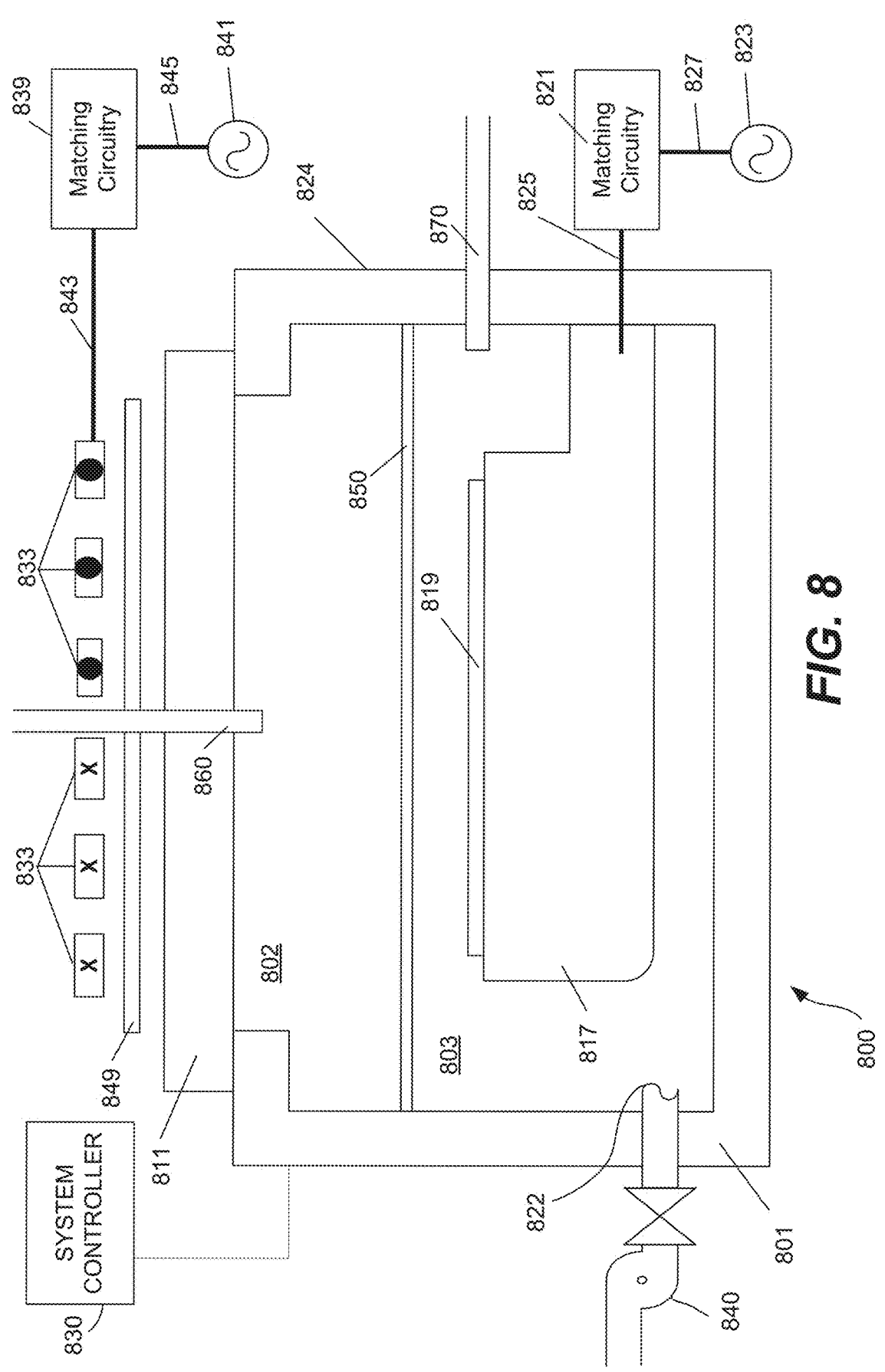
FIG. 8 shows a cross-sectional schematic view of an example inductively-coupled plasma apparatus for implementing certain embodiments and operations described herein in accordance with certain disclosed embodiments.

FIG. 8 schematically shows a cross-sectional view of an inductively coupled plasma apparatus 800 appropriate for implementing certain implementations or aspects of implementations such as dry development, post-development treatment (e.g., passivation and hardening), and/or etch. In other implementations, other tools or tool types having the functionality to conduct the dry development, post-development treatment, and/or etch processes described herein may be used for implementation.

The inductively coupled plasma apparatus 800 includes an overall process chamber 824 structurally defined by chamber walls 801 and a window 811. The chamber walls 801 may be fabricated from stainless steel, aluminum, or plastic. The window 811 may be fabricated from quartz or other dielectric material. An optional internal plasma grid 850 divides the overall process chamber into an upper sub-chamber 802 and a lower sub chamber 803. In most implementations, plasma grid 850 may be removed, thereby utilizing a chamber space made of sub chambers 802 and 803. A chuck 817 is positioned within the lower sub-chamber 803 near the bottom inner surface. The chuck 817 is configured to receive and hold a semiconductor wafer 819 upon which the etching and deposition processes are performed. The chuck 817 can be an electrostatic chuck for supporting the wafer 819 when present. In some implementations, an edge ring (not shown) surrounds chuck 817 and has an upper surface that is approximately planar with a top surface of the wafer 819, when present over chuck 817. The chuck 817 also includes electrostatic electrodes for chucking and dechucking the wafer 819. A filter and DC clamp power supply (not shown) may be provided for this purpose. Other control systems for lifting the wafer 819 off the chuck 817 can also be provided. The chuck 817 can be electrically charged using an RF power supply 823. The RF power supply 823 is connected to matching circuitry 821 through a connection 827. The matching circuitry 821 is connected to the chuck 817 through a connection 825. In this manner, the RF power supply 823 is connected to the chuck 817. In various implementations, a bias power of the electrostatic chuck may be set at about 50 V or may be set at a different bias power depending on the process performed in accordance with disclosed implementations. For example, the bias power may be between about 20 V and about 100 V, or between about 30 V and about 150 V.

Elements for plasma generation include a coil 833 is positioned above window 811. In some implementations, a coil is not used in disclosed implementations. The coil 833 is fabricated from an electrically conductive material and includes at least one complete turn. The example of a coil 833 shown in FIG. 8 includes three turns. The cross sections of coil 833 are shown with symbols, and coils having an "X" extend rotationally into the page, while coils having a "." extend rotationally out of the page. Elements for plasma generation also include an RF power supply 841 configured to supply RF power to the coil 833. In general, the RF power supply 841 is connected to matching circuitry 839 through a connection 845. The matching circuitry 839 is connected to the coil 833 through a connection 843. In this manner, the RF power supply 841 is connected to the coil 833. An optional Faraday shield 849 is positioned between the coil 833 and the window 811. The Faraday shield 849 may be maintained in a spaced apart relationship relative to the coil 833. In some implementations, the Faraday shield 849 is disposed immediately above the window 811. In some implementations, the Faraday shield 849 is between the window 811 and the chuck 817. In some implementations, the Faraday shield 849 is not maintained in a spaced apart relationship relative to the coil 833. For example, the Faraday shield 849 may be directly below the window 811 without a gap. The coil 833, the Faraday shield 849, and the window 811 are each configured to be substantially parallel to one another. The Faraday shield 849 may prevent metal or other species from depositing on the window 811 of the process chamber 824.

Process gases may be flowed into the process chamber through one or more main gas flow inlets 860 positioned in the upper sub-chamber 802 and/or through one or more side gas flow inlets 870. Likewise, though not explicitly shown, similar gas flow inlets may be used to supply process gases to a capacitively coupled plasma processing chamber. A vacuum pump. e.g., a one or two stage mechanical dry pump and/or turbomolecular pump 840, may be used to draw process gases out of the process chamber 824 and to maintain a pressure within the process chamber 824. For example, the vacuum pump may be used to evacuate the lower sub-chamber 803 during a purge operation. A valve-controlled conduit may be used to fluidically connect the vacuum pump to the process chamber 824 so as to selectively control application of the vacuum environment provided by the vacuum pump. This may be done employing a closed loop-controlled flow restriction device, such as a throttle valve (not shown) or a pendulum valve (not shown), during operational plasma processing. Likewise, a vacuum pump and valve controlled fluidic connection to the capacitively coupled plasma processing chamber may also be employed. The wide range of pressure to be modulated within a process chamber for combined dry development and etch may be achieved with variable-speed vacuum systems, throttle valves, by adjusting the flow of process gases, or by using two pressure regulating systems.

During operation of the apparatus 800, one or more process gases may be supplied through the gas flow inlets 860 and/or 870. In certain implementations, process gas may be supplied only through the main gas flow inlet 860, or only through the side gas flow inlet 870. In some cases, the gas flow inlets shown in the figure may be replaced by more complex gas flow inlets, one or more showerheads, for example. The Faraday shield 849 and/or optional grid 850 may include internal channels and holes that allow delivery of process gases to the process chamber 824. Either or both of Faraday shield 849 and optional grid 850 may serve as a showerhead for delivery of process gases. In some implementations, a liquid vaporization and delivery system may be situated upstream of the process chamber 824, such that once a liquid reactant or precursor is vaporized, the vaporized reactant or precursor is introduced into the process chamber 824 via a gas flow inlet 860 and/or 870.

Radio frequency power is supplied from the RF power supply 841 to the coil 833 to cause an RF current to flow through the coil 833. The RF current flowing through the coil 833 generates an electromagnetic field about the coil 833. The electromagnetic field generates an inductive current within the upper sub-chamber 802. The physical and chemical interactions of various generated ions and radicals with the wafer 819 etch features of and selectively deposit layers on the wafer 819.

If the plasma grid 850 is used such that there is both an upper sub-chamber 802 and a lower sub-chamber 803, the inductive current acts on the gas present in the upper sub-chamber 802 to generate an electron-ion plasma in the upper sub-chamber 802. The optional internal plasma grid 850 limits the amount of hot electrons in the lower sub-chamber 803. In some implementations, the apparatus 800 is designed and operated such that the plasma present in the lower sub-chamber 803 is an ion-ion plasma.

Both the upper electron-ion plasma and the lower ion-ion plasma may contain positive and negative ions, though the ion-ion plasma will have a greater ratio of negative ions to positive ions. Volatile etching and/or deposition byproducts may be removed from the lower sub-chamber 803 through port 822. The chuck 817 disclosed herein may operate at elevated temperatures ranging between about 10° C., and about 250° C. The temperature will depend on the process operation and specific recipe.

Apparatus 800 may be coupled to facilities (not shown) when installed in a clean room or a fabrication facility. Facilities include plumbing that provide processing gases, vacuum, temperature control, and environmental particle control. These facilities are coupled to apparatus 800, when installed in the target fabrication facility. Additionally, apparatus 800 may be coupled to a transfer chamber that allows robotics to transfer semiconductor wafers into and out of apparatus 800 using typical automation.

In some implementations, a controller 830 (which may include one or more physical or logical controllers) controls some or all of the operations of a process chamber 824. The controller 830 may include one or more memory devices and one or more processors. In some implementations, the apparatus 800 includes a switching system for controlling flow rates and durations when disclosed implementations are performed. In some implementations, the apparatus 800 may have a switching time of up to about 500 ms, or up to about 750 ms. Switching time may depend on the flow chemistry, recipe chosen, reactor architecture, and other factors.

In some implementations, the controller 830 is part of a system, which may be part of the above-described examples. Various aspects of the controller 830 are described above.

EUVL patterning may be conducted using any suitable tool, often referred to as a scanner. The EUVL patterning tool may be a standalone device from which the substrate is moved into and out of for deposition and etching as described herein. Alternatively, as described below, the EUVL patterning tool may be a module on a larger multi-component tool.

FIG. 9 depicts a semiconductor process cluster tool architecture 900 with vacuum-integrated deposition, patterning, and treatment modules that interface with a vacuum transfer module, suitable for implementations of processes described herein. The arrangement of transfer modules to "transfer" wafers among multiple storage facilities and processing modules may be referred to as a "cluster tool architecture" system. Deposition, patterning, and treatment modules are vacuum-integrated, in accordance with the requirements of a particular process. Other modules, such as for etch, may also be included on the cluster.

A vacuum transport module (VTM) 938 interfaces with four processing modules 920a-920d, which may be individually optimized to perform various fabrication processes. By way of example, processing modules 920a-920d may be implemented to perform deposition, evaporation. ELD, dry development, clean, etch, treatment, strip, and/or other semiconductor processes. For example, module 920a may be an ALD reactor that may be operated to perform in a non-plasma, thermal atomic layer depositions as described herein. Module 920b may be a PECVD tool. It should be understood that the figure is not necessarily drawn to scale.

Airlocks 942 and 946, also known as a loadlocks or transfer modules, interface with the VTM 938 and a patterning module 940. This tool architecture allows for work pieces, such as semiconductor substrates or wafers, to be transferred under vacuum so as not to react before exposure. Integration of the deposition modules with the lithography tool is facilitated by the fact that EUVL also requires a greatly reduced pressure given the strong optical absorption of the incident photons by ambient gases such as $H_2O$, $O_2$, etc.

As noted above, this integrated architecture is just one possible implementation of a tool for implementation of the described processes. The processes may also be implemented with a more conventional stand-alone EUVL scanner and a deposition reactor, either standalone or integrated in a cluster architecture with other tools, such as etch, strip etc. as modules, for example as described with reference to FIG. 9 but without the integrated patterning module.

Airlock 942 may be an "outgoing" loadlock, referring to the transfer of a substrate out from the VTM 938 serving a deposition module 920a to the patterning module 940, and airlock 946 may be an "ingoing" loadlock, referring to the transfer of a substrate from the patterning module 940 back in to the VTM 938. The ingoing airlock 946 may also provide an interface to the exterior of the tool for access and egress of substrates. Each process module has a facet that interfaces the module to VTM 938. For example, deposition process module 920a has facet 936. Inside each facet, sensors, for example, sensors 1-18 as shown, are used to detect the passing of wafer 926 when moved between respective stations. Patterning module 940 and airlocks 942 and 946 may be similarly equipped with additional facets and sensors, not shown.

Main VTM robot 922 transfers wafer 926 between modules, including airlocks 942 and 946. In one implementation, robot 922 has one arm, and in another implementation, robot 922 has two arms, where each arm has an end effector 924 to pick wafers such as wafer 926 for transport. Front-end robot 944, in is used to transfer wafers 926 from outgoing airlock 942 into the patterning module 940), from the patterning module 940) into ingoing airlock 946. Front-end robot 944 may also transport wafers 926 between the ingoing loadlock and the exterior of the tool for access and egress of substrates. Because ingoing airlock module 946 has the ability to match the environment between atmospheric and vacuum, the wafer 926 is able to move between the two pressure environments without being damaged.

It should be noted that an EUVL tool typically operates at a higher vacuum than a deposition tool. If this is the case, it is desirable to increase the vacuum environment of the substrate during the transfer between the deposition to the EUVL tool to allow the substrate to degas prior to entry into the patterning tool. Outgoing airlock 942 may provide this function by holding the transferred wafers at a lower pressure, no higher than the pressure in the patterning module 940, for a period of time and exhausting any off-gassing, so that the optics of the patterning module 940 are not contaminated by off-gassing from the substrate. A suitable pressure for the outgoing, off-gassing airlock is no more than 1E-8 Torr.

In some implementations, a controller 950 (which may include one or more physical or logical controllers) controls some or all of the operations of the cluster tool and/or its separate modules. It should be noted that the controller can be local to the cluster architecture or can be located external to the cluster architecture in the manufacturing floor, or in a remote location and connected to the cluster architecture via a network. The controller 950 may include one or more memory devices and one or more processors. The processor may include a central processing unit (CPU) or computer, analog and/or digital input/output connections, stepper motor controller boards, and other like components. Instructions for implementing appropriate control operations are executed on the processor. These instructions may be stored on the memory devices associated with the controller or they may be provided over a network. In certain implementations, the system controller executes system control software.

The system control software may include instructions for controlling the timing of application and/or magnitude of any aspect of tool or module operation. System control software may be configured in any suitable way. For example, various process tool component subroutines or control objects may be written to control operations of the process tool components necessary to carry out various process tool processes. System control software may be coded in any suitable compute readable programming language. In some implementations, system control software includes input/output control (IOC) sequencing instructions for controlling the various parameters described above. For example, each phase of a semiconductor fabrication process may include one or more instructions for execution by the controller. The instructions for setting process conditions for condensation, deposition, evaporation, patterning and/or etching phase may be included in a corresponding recipe phase, for example.

In various implementations, an apparatus for post-development treatment is provided. The apparatus may include a processing chamber for patterning, treatment, deposition, and etch, and a controller including instructions for post-development treatment of a patterned photoresist mask. The instructions may include code for, in the processing chamber, treating a patterned metal-containing photoresist mask after development. Such treatment may include thermal treatment, plasma treatment, chemical treatment, or selective deposition of a protective layer on the patterned metal-containing photoresist mask.

It should be noted that the computer controlling the wafer movement can be local to the cluster architecture or can be located external to the cluster architecture in the manufacturing floor, or in a remote location and connected to the cluster architecture via a network. A controller as described above with respect to any of FIG. 6, 7, or 8 may be implemented with the tool in FIG. 9.

Further Implementations

The apparatus and processes described herein may be used in conjunction with lithographic patterning tools or processes, for example, for the fabrication or manufacture of semiconductor devices, displays, LEDs, photovoltaic panels, and the like. Typically, though not necessarily, such apparatus and processes will be used or conducted together in a common fabrication facility. Lithographic patterning of a film typically comprises some or all of the following steps, each step enabled with a number of possible tools: (1) application of photoresist on a work piece, i.e., a substrate, using a spin-on or spray-on tool: (2) curing of photoresist using a hot plate or furnace or UV curing tool: (3) exposing the photoresist to visible or UV or x-ray light with a tool such as a wafer stepper: (4) developing the resist so as to selectively remove resist and thereby pattern it using a tool such as a wet bench: (5) transferring the resist pattern into an underlying film or work piece by using a dry or plasma-assisted etching tool; and (6) removing the resist using a tool such as an RF or microwave plasma resist stripper.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method for performing dry development, the method comprising:

performing, in a process chamber, a thermal dry development on a semiconductor substrate comprising an EUV-sensitive photoresist film using a halogen-containing gas in a plasma-free process, wherein the EUV-sensitive photoresist film comprises EUV-exposed portions and unexposed portions, wherein the thermal dry development selectively removes unexposed portions relative to the EUV-exposed portions to form a patterned photoresist mask; and performing, in the process chamber after performing the thermal dry development, a plasma dry development on the semiconductor substrate by forming plasma with at least one reactive gas to descum, wherein the plasma dry development removes residues including byproducts of thermal dry development relative to the EUV-exposed portions, the byproducts having a different composition than the unexposed portions and the exposed portions of the EUV-sensitive photoresist film.

2. The method of claim 1, wherein the at least one reactive gas comprises one or more halogen-containing gases, one or more hydrogen-containing gases, or a combination thereof.

3. The method of claim 1, wherein the at least one reactive gas comprises one or more hydrogen-containing gases, wherein the one or more hydrogen-containing gases comprises $CH_4$.

4. The method of claim 1, wherein the at least one reactive gas comprises multiple halogen-containing gases, each of the halogen-containing gases selected from the group consisting of: HBr, HCl, $Cl_2$, and $BCl_3$.

5. The method of claim 4, wherein the at least one reactive gas comprises HBr and $Cl_2$, HBr and HCl, HBr and $BCl_3$, or $BCl_3$ and $Cl_2$.

6. The method of claim 1, wherein the at least one reactive gas comprises a combination of one halogen-containing gas selected from HBr, HCl, $Cl_2$, and $BCl_3$, and one hydrogen-containing gas selected from $H_2$ and $CH_4$.

7. The method of claim 6, wherein the at least one reactive gas comprises HBr and $H_2$, $BCl_3$ and $CH_4$, $Cl_2$ and $CH_4$, HCl and $CH_4$, or HBr and $CH_4$.

8. The method of claim 1, wherein performing plasma dry development by forming plasma with at least one reactive gas comprises forming plasma with at least one reactive gas and at least one non-reactive gas, wherein the non-reactive gas is selected from the group consisting of: $N_2$, He, Ne, Ar, Kr, and Xe.

9. The method of claim 8, wherein the at least one reactive gas comprises HBr and the at least one non-reactive gas comprises $N_2$.

10. The method of claim 8, wherein the at least one reactive gas comprises $Cl_2$ and the at least one non-reactive gas comprises $N_2$.

11. The method of claim 1, wherein the halogen-containing gas comprises a hydrogen halide.

12. The method of claim 1, wherein the halogen-containing gas comprises hydrogen bromide (HBr).

13. The method of claim 1, wherein performing the thermal dry development occurs at a first pressure in the process chamber, and wherein performing the plasma dry development occurs at a second pressure that is lower than the first pressure in the same process chamber, wherein transitioning in the process chamber from the first pressure to the second pressure occurs in ten seconds or less.

14. The method of claim 1, wherein performing the thermal dry development and performing the plasma dry development occur at a temperature between about −60° C. and about 120° C.

15. The method of claim 1, wherein performing the thermal dry development and performing the plasma dry development are repeated alternatingly in the same process chamber.

16. The method of claim 1, wherein the plasma dry development is a cyclic plasma dry development, direct plasma dry development, remote plasma dry development, or continuous plasma dry development.

17. The method of claim 16, wherein the plasma dry development is continuous plasma dry development, and the continuous plasma dry development is performed at variable power, at constant power and pulsing bias, or at variable power and pulsing bias.

18. An apparatus for performing dry development, the apparatus comprising:

a process chamber;

a controller having at least one processor and a memory, wherein the controller is configured with instructions to perform the following operations:

perform a thermal dry development in the process chamber on a semiconductor substrate comprising an EUV-sensitive photoresist film using a halogen-containing gas in a plasma free process, wherein the EUV-sensitive photoresist film comprises EUV-exposed portions and unexposed portions, wherein the thermal dry development selectively removes unexposed portions relative to the EUV-exposed portions to form a patterned photoresist mask; and perform a plasma dry development after the thermal dry development in the same process chamber on the semiconductor substrate by forming a plasma of at least one reactive gas to descum, wherein the plasma dry development removes residues including byproducts of thermal dry development relative to the EUV-exposed portions, the byproducts having a different composition than the unexposed portions and the exposed portions of the EUV-sensitive photoresist film.

19. The apparatus of claim 18, wherein the at least one reactive gas comprises one or more halogen-containing gases, one or more hydrogen-containing gases, or a combination thereof.

20. The apparatus of claim 18, wherein the at least one reactive gas comprises multiple halogen-containing gases, each of the halogen-containing gases selected from the group consisting of: HBr, HCl, $Cl_2$, and $BCl_3$.

21. The apparatus of claim 18, wherein the at least one reactive gas comprises a combination of one halogen-con-taining gas selected from HBr, HCl, $Cl_2$, and $BCl_3$, and one hydrogen-containing gas selected from H2 and CH4.

22. The apparatus of claim 18, wherein the controller configured with instructions to perform plasma dry development by forming plasma with at least one reactive gas is configured with instructions to form plasma with at least one reactive gas and at least one non-reactive gas, wherein the non-reactive gas is selected from the group consisting of: N2, He, Ne, Ar, Kr, and Xe.

23. The apparatus of claim 18, wherein the halogen-containing gas comprises a hydrogen halide.

24. The apparatus of claim 18, wherein the halogen-containing gas comprises hydrogen bromide (HBr).

25. The apparatus of claim 18, further comprising:

one or more pressure-regulating devices; and one or more pumps fluidly coupled with the one or more pressure-regulating devices, wherein the thermal dry development is performed at a first pressure and the plasma dry development is performed at a second pressure that is less than the first pressure.

26. The apparatus of claim 18, wherein the controller configured with instructions to perform thermal dry development and plasma dry development is configured with instructions to perform thermal dry development and plasma dry development at a temperature between about −60° C. and about 120° C.

27. The apparatus of claim 18, wherein the controller is further configured with instructions to repeat alternatingly the thermal dry development and the plasma dry development.

28. The apparatus of claim 18, wherein the plasma dry development is a cyclic plasma dry development, direct plasma dry development, remote plasma dry development, or continuous plasma dry development.

29. The method of claim 28, wherein the plasma dry development is continuous plasma dry development, and the continuous plasma dry development is performed at variable power, at constant power and pulsing bias, or at variable power and pulsing bias.

* * * * *